(12) United States Patent
Kataoka et al.

(10) Patent No.: US 7,880,648 B2
(45) Date of Patent: Feb. 1, 2011

(54) INFORMATION PROCESSING APPARATUS, INFORMATION PROCESSING METHOD, AND COMPUTER PRODUCT

(75) Inventors: Masahiro Kataoka, Kawasaki (JP); Hideto Higashi, Kawasaki (JP); Takashi Tsubokura, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/543,243

(22) Filed: Aug. 18, 2009

(65) Prior Publication Data

US 2010/0085222 A1 Apr. 8, 2010

(30) Foreign Application Priority Data

Oct. 6, 2008 (JP) .............................. 2008-259507

(51) Int. Cl.
*H03M 7/40* (2006.01)
(52) U.S. Cl. ........................................ 341/65; 341/107
(58) Field of Classification Search ................ 341/106, 341/107, 51, 87, 65; 375/240; 382/229
See application file for complete search history.

(56) References Cited

U.S. PATENT DOCUMENTS 6,040,790 A * 3/2000 Law .............................. 341/65
7,358,870 B2 * 4/2008 Bay .............................. 341/65
2003/0091241 A1 * 5/2003 Morihara et al. ............ 382/233

FOREIGN PATENT DOCUMENTS

JP A 10-271012 10/1998
JP A 2000-188608 4/2000

OTHER PUBLICATIONS

Shuichi Fukamachi, et al., "String Pattern Matching for Compressed Data using Variable Length Code: An Efficient Retrieval Method for Genomic Information,"1992 Symposium of Information Science, Collection of Lecture Reports, Jan. 8-9, 1992.

* cited by examiner

*Primary Examiner*—Brian Young
(74) *Attorney, Agent, or Firm*—Greer, Burns & Crain, Ltd.

(57) ABSTRACT

A computer-readable recording medium stores therein an information processing program that causes a computer to execute storing an aggregate of layers of nodes respectively having a pointer to an upper node, pointers to a leaf and/or a lower node and branches to lower nodes; obtaining a totaling result of appearance frequencies of character codes described in a file; classifying the character codes by layer, based on appearance probabilities thereof and the totaling result; calculating, based on a quantity of character codes in an ith layer and for the ith layer, a quantity of pointers pointing to leaves, and based on the quantity calculated and for the ith layer, further calculating a number of times nodes are used and a quantity of pointers pointing to lower nodes; generating, based on calculation results, a Huffman tree; and converting the Huffman tree into a node-less Huffman tree and storing the node-less Huffman tree.

12 Claims, 44 Drawing Sheets

| CHARACTER APPEARANCE FREQUENCY TOTALING TABLE ||
|---|---|
| CHARACTER | COUNTED VALUE |
| 0 | ... |
| ⋮ | ⋮ |
| 9 | ... |
| A | ... |
| ⋮ | ⋮ |
| Z | ... |
| a | ... |
| ⋮ | ⋮ |
| z | ... |
| あ | ... |
| ⋮ | ⋮ |
| ん | ... |
| ア | ... |
| ⋮ | ⋮ |
| ン | ... |
| 足 | ... |
| ⋮ | ⋮ |
| 我 | ... |

900

| DIVIDED CHARACTER CODE APPEARANCE FREQUENCY TOTALING TABLE ||
|---|---|
| DIVIDED CHARACTER CODE | APPEARANCE FREQUENCY |
| 00 | ... |
| 01 | ... |
| 02 | ... |
| ⋮ | ⋮ |
| FF | ... |

FIG.10

| ITEM | FIRST LAYER | SECOND LAYER | THIRD LAYER | FOURTH LAYER |
|---|---|---|---|---|
| NUMBER OF STRUCTURE CELLS N(i) | 1 | 16 | 256 | 4096 |
| NUMBER OF LEAVES Nl(i) | 3 | 54 | 353 | 885 |
| NUMBER OF POINTERS TO LEAVES Nlp(i) | 3 | 54 | 353 | 885 |
| NUMBER OF POINTERS TO LOWER NODES Nnp(i) | 5 | 26 | 56 | 0 |
| NUMBER OF TIMES STRUCTURE CELLS Ncu(i) USED | 1 | 5 | 26 | 56 |
| ACCUMULATED VALUE OF NUMBER OF POINTERS TO LEAVES ΣNlp(i) | 3 | 57 | 410 | 1295 |
| NUMBER OF BLANK CELLS FROM HEAD Ncst Npst | 0 | 3 | 57 | 410 |
| NUMBER OF BLANK POINTERS TO TAIL Npse(i) | 9 | 131 | 2775 | 58091 |
| NUMBER OF BLANK CELLS TO TAIL Ncse(i) | 0 | 8 | 173 | 3630 |

| ITEM | FIRST LAYER | SECOND LAYER | THIRD LAYER | FOURTH LAYER |
|---|---|---|---|---|
| NUMBER OF LEAVES TO BE ADDED OR DELETED | | | 885 | -885 |
| NUMBER OF STRUCTURE CELLS N(i) | 1 | 16 | 256 | 4096 |
| NUMBER OF LEAVES Nl(i) | 3 | 54 | 353 | 885 |
| NUMBER OF POINTERS TO LEAVES Nlp(i) | 3 | 54 | 1238 | 0 |
| NUMBER OF POINTERS TO LOWER NODES Nnp(i) | 5 | 78 | 1 | 0 |
| NUMBER OF TIMES STRUCTURE CELLS Ncu(i) USED | 1 | 9 | 78 | 1 |
| ACCUMULATED VALUE OF NUMBER OF POINTERS TO LEAVES ΣNlp(i) | 3 | 57 | 1295 | 1295 |
| NUMBER OF BLANK CELLS FROM HEAD Ncst(i) | 0 | 3 | 57 | 1295 |
| NUMBER OF BLANK POINTERS TO TAIL Npse(i) | 9 | 76 | 1945 | 44816 |
| NUMBER OF BLANK CELLS TO TAIL Ncse(i) | 0 | 4 | 121 | 2801 |

| ITEM | FIRST LAYER | SECOND LAYER | THIRD LAYER | FOURTH LAYER |
|---|---|---|---|---|
| NUMBER OF LEAVES TO BE ADDED OR DELETED | | 76 | 809 | -885 |
| NUMBER OF STRUCTURE CELLS N(i) | 1 | 16 | 256 | 4096 |
| NUMBER OF LEAVES Nl(i) | 3 | 54 | 353 | 885 |
| NUMBER OF POINTERS TO LEAVES Nlp(i) | 3 | 130 | 1162 | 0 |
| NUMBER OF POINTERS TO LOWER NODES Nnp(i) | 9 | 73 | 1 | 0 |
| NUMBER OF TIMES STRUCTURE CELLS Ncu(i) USED | 1 | 13 | 73 | 1 |
| ACCUMULATED VALUE OF NUMBER OF POINTERS TO LEAVES ΣNlp(i) | 3 | 133 | 1295 | 1295 |
| NUMBER OF BLANK CELLS FROM HEAD Ncst(i) | 0 | 3 | 133 | 1295 |
| NUMBER OF BLANK POINTERS TO TAIL Npse(i) | 4 | 5 | 805 | 44816 |
| NUMBER OF BLANK CELLS TO TAIL Ncse(i) | 0 | 0 | 50 | 2801 |

| ITEM | FIRST LAYER | SECOND LAYER | THIRD LAYER | FOURTH LAYER |
|---|---|---|---|---|
| NUMBER OF LEAVES TO BE ADDED OR DELETED | 0 | 76 | 809 | -885 |
| NUMBER OF STRUCTURE CELLS N(i) | 1 | 16 | 256 | 4096 |
| NUMBER OF LEAVES Nl(i) | 3 | 54 | 353 | 885 |
| NUMBER OF POINTERS TO LEAVES Nlp(i) | 3 | 130 | 1162 | 0 |
| NUMBER OF POINTERS TO LOWER NODES Nnp(i) | 9 | 73 | 1 | 0 |
| NUMBER OF TIMES STRUCTURE CELLS Ncu(i) USED | 1 | 13 | 73 | 1 |
| ACCUMULATED VALUE OF NUMBER OF POINTERS TO LEAVES ΣNlp(i) | 3 | 133 | 1295 | 1295 |
| NUMBER OF BLANK CELLS FROM HEAD Ncst(i) | 0 | 3 | 133 | 1295 |
| NUMBER OF BLANK POINTERS TO TAIL Npse(i) | 4 | 5 | 805 | 44816 |
| NUMBER OF BLANK CELLS TO TAIL Ncse(i) | 0 | 0 | 50 | 2801 |

| LEAF NUMBER | COMPRESSED CODE LENGTH | COMPRESSED CODE | CHARACTER CODE | CHARACTER CODE LENGTH |
|---|---|---|---|---|
| 1 | 4 | 0000 | e1 | 16 |
| 2 | 4 | 0001 | e2 | 16 |
| 3 | 4 | 0010 | e3 | 16 |
| 4 | 8 | 00110000 | e4 | 16 |
| ⋮ | ⋮ | ⋮ | ⋮ | ⋮ |
| 19 | 8 | 00111111 | e19 | 16 |
| ⋮ | ⋮ | ⋮ | ⋮ | ⋮ |
| 24 | 8 | 01000100 | e24(0x6E30) | 16 |
| ⋮ | ⋮ | ⋮ | ⋮ | ⋮ |
| 79 | 8 | 01111011 | e79(0x6F30) | 16 |
| ⋮ | ⋮ | ⋮ | ⋮ | ⋮ |
| 117 | 8 | 10010000 | e117 | 16 |
| ⋮ | ⋮ | ⋮ | ⋮ | ⋮ |
| 132 | 8 | 10011111 | e132 | 16 |
| 133 | 8 | 10100000 | e133 | 16 |
| 134 | 8 | 10100001 | e134 | 16 |
| 135 | 12 | 101000100000 | e135 | 16 |
| ⋮ | ⋮ | ⋮ | ⋮ | ⋮ |
| 150 | 12 | 101000101111 | e150 | 16 |
| ⋮ | ⋮ | ⋮ | ⋮ | ⋮ |
| 156 | 12 | 101000110101 | e156(0x4E) | 8 |
| ⋮ | ⋮ | ⋮ | ⋮ | ⋮ |
| 167 | 12 | 101001000000 | e167(0x51) | 8 |
| ⋮ | ⋮ | ⋮ | ⋮ | ⋮ |
| 691 | 12 | 110001001100 | e691(0x216B) | 16 |
| ⋮ | ⋮ | ⋮ | ⋮ | ⋮ |
| 1295 | 12 | 101111110100 | e1295 | 16 |

| RESERVED WORD STRUCTURE ||
|---|---|
| TOTAL NUMBER OF RESERVED WORDS | 15 |
| LARGEST BIT LENGTH OF RESERVED WORDS | Lrmax |
| BIT LENGTH OF RESERVED WORD r1 | Lr1 (=64) |
| RESERVED WORD r1 (<br>) ||
| POINTER TO LEAF OF RESERVED WORD r1 ||
| BIT LENGTH OF RESERVED WORD r2 | Lr2 (=64) |
| RESERVED WORD r2 (</a>) ||
| POINTER TO LEAF OF RESERVED WORD r2 ||
| ⋮ ||
| BIT LENGTH OF RESERVED WORD r15 | Lr15 |
| RESERVED WORD r15 ||
| POINTER TO LEAF OF RESERVED WORD r15 ||
| EOT(0xFFFF) ||

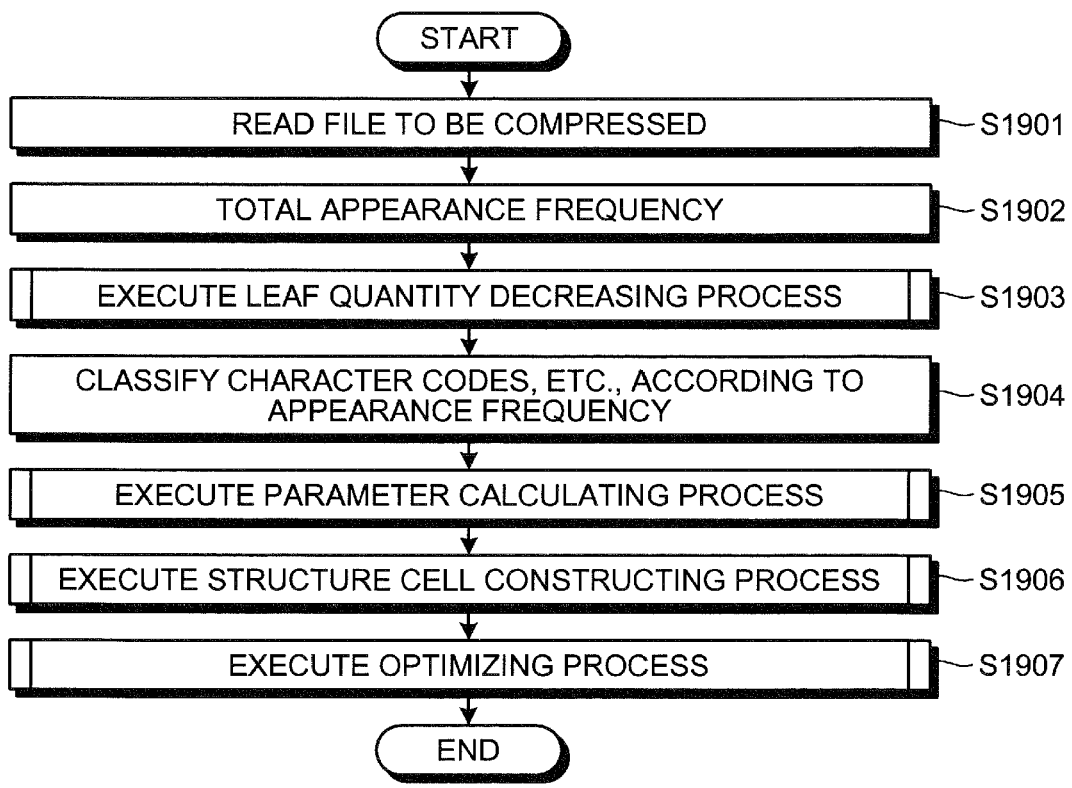
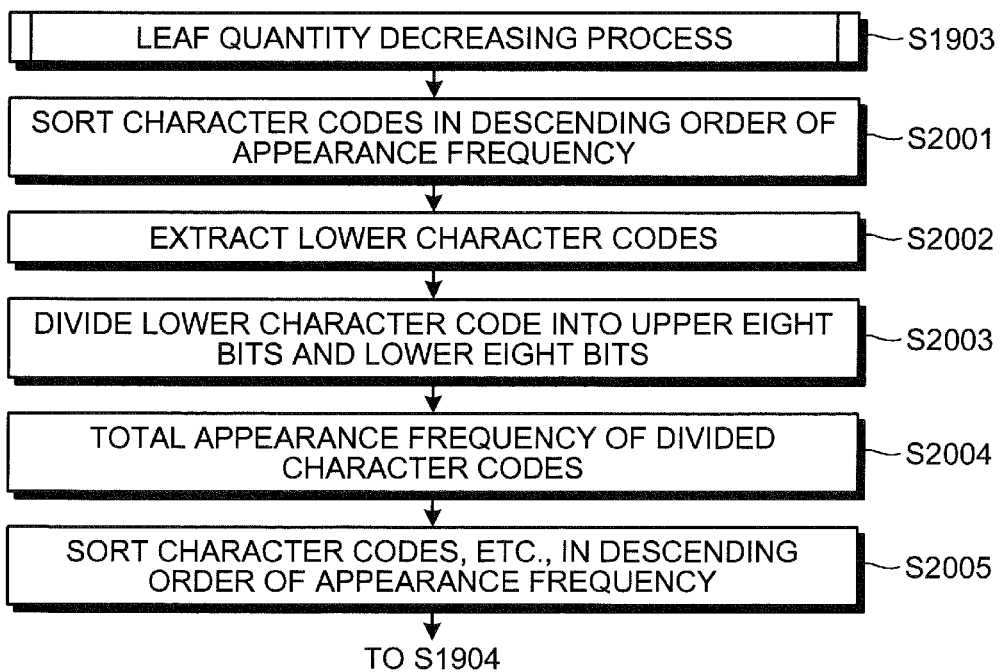

FIG.29

| LEAF NUMBER | COMPRESSED CODE | COMPRESSED CODE LENGTH | DECOM-PRESSION TYPE | CHARACTER CODES, ETC. |
|---|---|---|---|---|
| 1 | 0000 | 4 | ... | e1 |
| 2 | 0001 | 4 | ... | e2 |
| 3 | 0010 | 4 | ... | e3 |
| 4 | 00110000 | 8 | ... | e4 |
| ⋮ | ⋮ | ⋮ | ⋮ | ⋮ |
| 24 | 01000100 | 8 | 16 BITS | e24(0x6E30) |
| ⋮ | ⋮ | ⋮ | ⋮ | ⋮ |
| 79 | 01111011 | 8 | 16 BITS | e79(0x6F30) |
| ⋮ | ⋮ | ⋮ | ⋮ | ⋮ |
| 134 | 10100001 | 8 | ... | e134 |
| 135 | 101000100000 | 12 | ... | e135 |
| ⋮ | ⋮ | ⋮ | ⋮ | ⋮ |
| 156 | 101000110101 | 12 | 8 BITS | e156(0x4E) |
| ⋮ | ⋮ | ⋮ | ⋮ | ⋮ |
| 167 | 101001000000 | 12 | 8 BITS | e167(0x51) |
| ⋮ | ⋮ | ⋮ | ⋮ | ⋮ |
| 691 | 110001001100 | 12 | 16 BITS | e691(0x216B) |
| ⋮ | ⋮ | ⋮ | ⋮ | ⋮ |
| 1295 | 101111110100 | 12 | ... | e1295 |
| - | - | - | - | - |
| ⋮ | ⋮ | ⋮ | ⋮ | ⋮ |
| - | - | - | - | - |

FIG.33

| CHARACTER STRING | 次 | | の | | は | 兎 | | |
|---|---|---|---|---|---|---|---|---|
| | | | | | | UPPER | LOWER | |
| CHARACTER CODE STRING (HEXADECIMAL) | 2 | 1 | 6 | B | 6 | E | 3 | 0 | 5 | 1 | 4 | E | 6 | F | 3 | 0 |
| CHARACTER CODE STRING (BINARY) | 0010 | 0001 | 0110 | 1011 | 0110 | 1110 | 0011 | 0000 | 0101 | 0001 | 0100 | 1110 | 0110 | 1111 | 0011 | 0000 |

FIG.34

| CHARACTER STRING | 次 | の | 兎 | | は |
|---|---|---|---|---|---|
| | | | UPPER | LOWER | |
| COMPRESSED CODE STRING | 110001001100 | 01000100 | 101001000000 | 101000110101 | 01111011 |

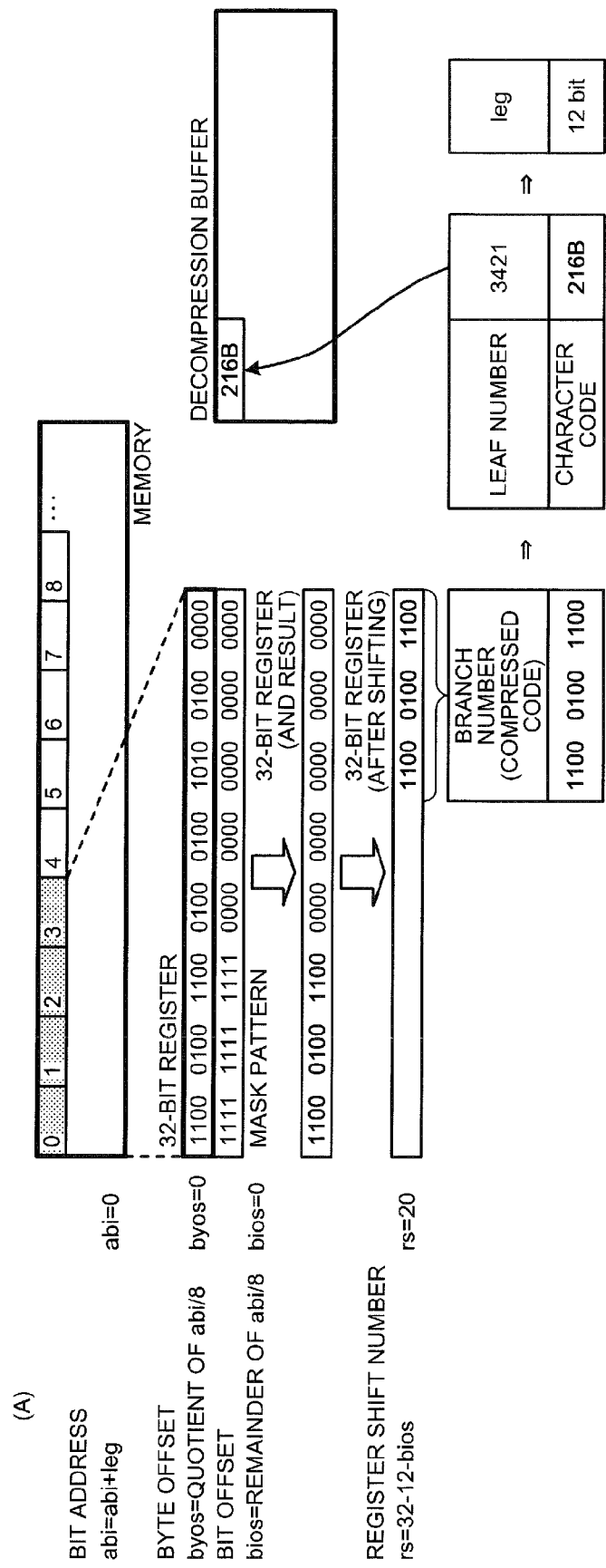

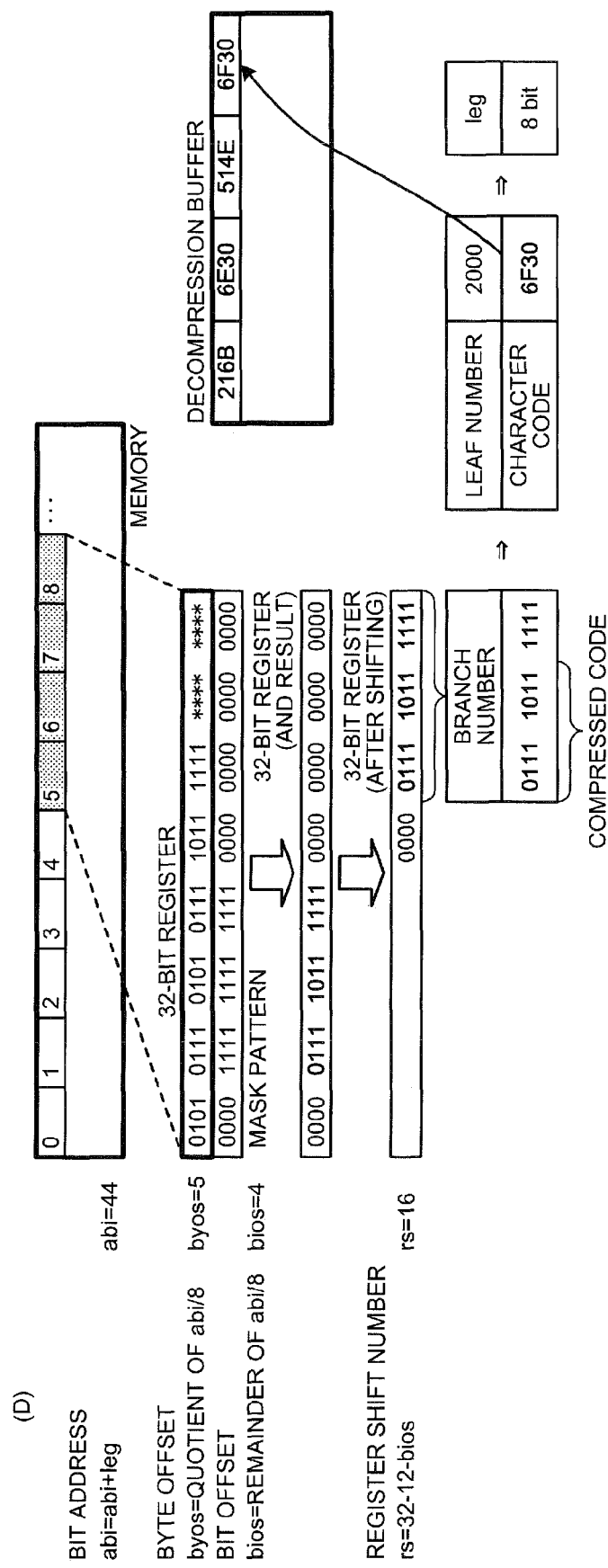

INFORMATION PROCESSING APPARATUS, INFORMATION PROCESSING METHOD, AND COMPUTER PRODUCT

CROSS REFERENCE TO RELATED APPLICATIONS

This application is based upon and claims the benefit of priority of the prior Japanese Patent Application No. 2008-259507, filed on Oct. 6, 2008, the entire contents of which are incorporated herein by reference.

FIELD

The embodiment discussed herein is related to compression and decompression using a Huffman tree.

BACKGROUND

A technique of searching for compressed data of English-language text in a compressed format using a finite automaton has been disclosed (see, for example, Fukamachi, Shuichi; Shinohara, Takeshi; and Takeda, Masayuki, "Character String Pattern Comparison for Variable-Length Code Compressed Data: High-Speed Search Technique of Genom Information", 1992, Information Science Symposium Proceedings for Presented Papers, Jan. 8, 1992, pp. 95-103). A technique of applying a tree structure to data encoding and a path control table has also been disclosed (see, for example, Japanese Laid-Open Patent Publication Nos. H10-271012 and 2000-188608).

However, application of the technique proposed by Fukamachi, et al to the Japanese language is not practically realized because the quantity of state transition tables to execute character recognition using the automaton increases. In addition, with 64 k types of character codes that are 16-bit codes compared to the 256 types of those that are eight-bit codes, a problem arises in that the time to generate the state transition tables and the size thereof synergistically increase. Therefore, any application of the technique to the Japanese language is difficult to practically implement.

According to Japanese Laid-Open Patent Publication Nos. H10-271012 and 2000-188608, when Huffman compression is executed with respect to 16-bit codes, compressed codes of characters whose appearance frequencies are low each need 20 bits or more. Therefore, a problem arises in that the quantity of tables for node-less linear searching balloons up to two to 20-fold.

SUMMARY

According to an aspect of the present invention, a computer-readable recording medium storing therein an information processing program that causes a computer to execute storing, to a storing unit, an aggregate of nodes that respectively store therein a pointer to an upper node and $2^n$ pointers to at least one among a leaf and a lower node and respectively have $2^n$ branches that respectively extend to a lower node (where, n is a natural number and $n \geq 2$), the aggregate having k layers of nodes (where, k is a natural number and $k \geq 2$) and $2^{n(i-1)}$ nodes in an ith layer (where, i is a natural number and $1 \leq i \leq k$); obtaining a totaling result of appearance frequencies of character codes described in a file; classifying the character codes by layer, based on the totaling result obtained at the obtaining and according to appearance probabilities P of the character codes (where, P is $1/2^{ni} \leq P < 1/2^{n(i-1)}$, and when i=1, P is $1/2^{ni} \leq P < 1$ and when i=n, P is $P < 1/2^{n(i-1)}$); calculating, based on a quantity of character codes in the ith layer classified at the classifying and for the ith layer, a quantity of pointers pointing to leaves, and based on the quantity of pointers in the ith layer pointing to leaves and for the ith layer, further calculating a number of times nodes in the ith layer are used and a quantity of pointers pointing to lower nodes that, as link destinations, are nodes in an (i+1)th layer; generating, based on a calculation result at the calculating, a $2^n$-branching Huffman tree; and converting into a $2^m$-branching node-less Huffman tree (where, m=n×k), the $2^n$-branching Huffman tree generated at the generating of the $2^n$-branching Huffman tree, the $2^m$-branching node-less Huffman tree being stored to the storing unit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 6 is an explanatory diagram of a character appearance frequency totaling table;

FIG. 10 is an explanatory diagram of a calculation result table by a calculating unit;

FIG. 13A is an explanatory diagram of updating of a calculation result table when optimization from the fourth layer to the third layer is executed;

FIG. 13B is an explanatory diagram of updating of the calculation result table when optimization from the third layer to the second layer is executed;

FIG. 13C is an explanatory diagram of updating of the calculation result table when optimization from the second layer to the first layer is executed;

FIG. 15 is an explanatory diagram of information stored in the structures of the leaves in the $2^n$-branching Huffman tree after optimization;

FIG. 16 is an explanatory diagram of a reserved word structure;

FIG. 19 is a flowchart of a $2^n$-branching Huffman tree generating process automatically executed by the information processing apparatus;

FIG. 20 is a flowchart of a leaf quantity decreasing process (step S1903) depicted in FIG. 19;

FIG. 29 is an explanatory diagram of information stored in the structure of a leaf;

FIG. 33 is an explanatory diagram of exemplary character code strings to be compressed;

FIG. 34 is an explanatory diagram of an exemplary compressed code string;

FIGS. 39A to 39E are explanatory diagrams of examples of a decompressing process that uses the $2^m$-branching node-less Huffman tree.

DESCRIPTION OF EMBODIMENTS

Preferred embodiments of the present invention will be explained with reference to the accompanying drawings.

A $2^n$-branching Huffman tree according to the embodiment will be described. A $2^n$-branching Huffman tree is a Huffman tree whose quantity of branches, each extending from a node to a lower node of the node, is $2^n$. "n" is a natural number, where $n \geq 2$. The quantity of hierarchical layers of nodes is "k" (where k is a natural number and $k \geq 2$). The quantity of nodes in an "i"th layer (where "i" is a natural number and $1 \leq i \leq k$) is $2^{n(i-1)}$. Each node stores therein a pointer to an upper node thereof.

Each node may store therein $2^n$ leaves or $2^n$ pointers to lower nodes thereof. The $2^n$-branching Huffman tree is used for compressing $2^n$-bit character codes. In the embodiment, "n" is determined as n=4 when 16-bit character codes are compressed and decompressed and "n" is determined as n=2 when eight-bit character codes are compressed and decompressed. Kanji characters, etc., of the Japanese language are represented by 16-bit codes and, therefore, the embodiment will be described assuming that "n" is n=4 and "k" is k=4.

Figure 1:
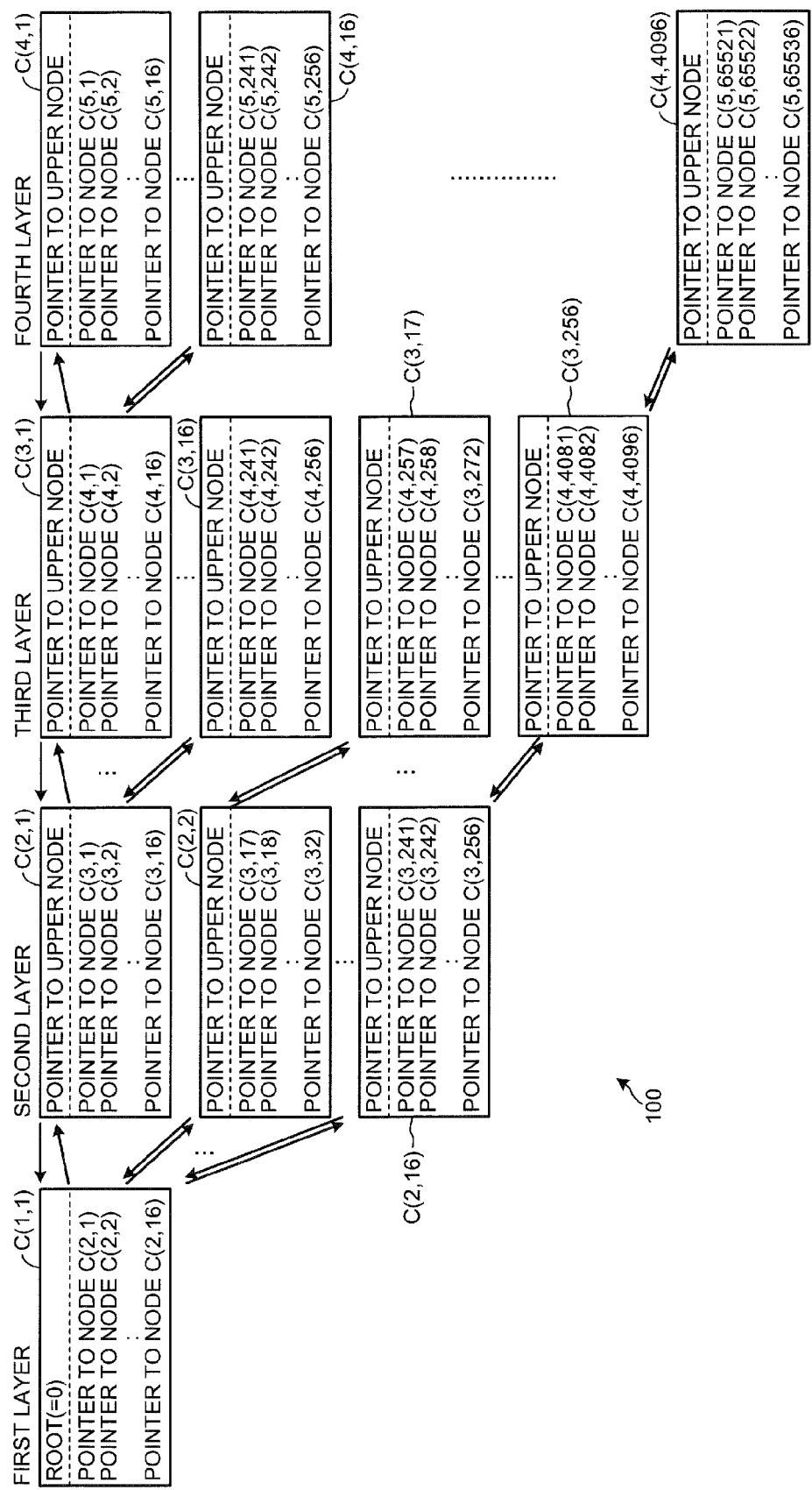
FIG. 1 is an explanatory diagram of a node aggregate that is a generation origin of a $2^n$-branching Huffman tree (16)

FIG. 1 is an explanatory diagram of a node aggregate that is the generation origin of the $2^n$-branching Huffman tree (n=4 and, therefore, $2^n$=16). In this node aggregate 100, a first layer has one node structure cell; a second layer has 16 node structure cells; a third layer has 256 node structure cells; and a fourth layer has 4096 node structure cells. Each structure cell (i, j) stores therein a pointer to an upper node, i.e., a link origin. A node structure C(1, 1) in the first layer, which is the highest layer, is a root structure and therefore, has no pointer to any upper node.

Figure 2:
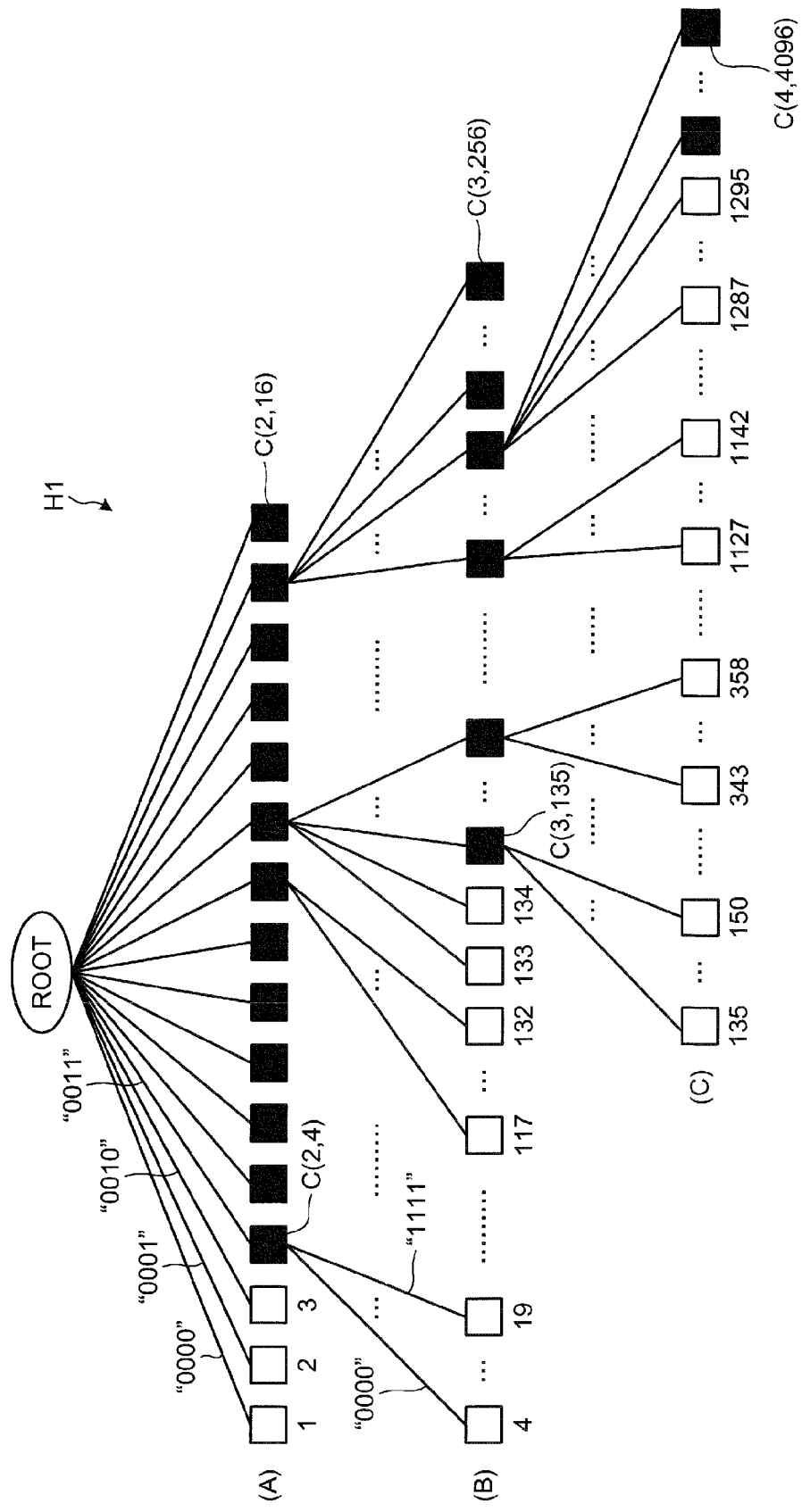
FIG. 2 is an explanatory diagram of the $2^n$-branching Huffman tree (16)

FIG. 2 is an explanatory diagram of a $2^n$-branching Huffman tree. In FIG. 2, "n" is n=4, i.e., FIG. 2 depicts a 16-branching Huffman tree. A root of a $2^n$-branching Huffman tree corresponds to the node structure cell C(1, 1) in the first layer of FIG. 1. In sections (A) to (C) of FIG. 2, nodes and leaves are depicted. In FIG. 2, "□" represents a leaf and "■" represents a node. ■ that has no branch to any lower node or leaf is an unused node. A numeral immediately under a leaf represents the number of the leaf. Hereinafter, a leaf is denoted by L# (# represents the number of the leaf).

In (A), □ represents leaves L1 to L3 linked from the root in the first layer, and ■ represents nodes in the second layer linked from the root and corresponds to node structure cell C(2, 4) to C(2, 16). In (B), □ represents leaves L4 to L134 linked from the nodes in the second layer, and ■ represents nodes in the third layer linked from the root and corresponds to node structure cells C(3, 135) to C(3, 256). In (C), □ represents leaves L135 to L1295 linked from the nodes in the third layer, and ■ represents nodes in the fourth layer linked from the root and corresponds to node structure cells C(4, 1296) to C(4, 4096). A pre-process of compression will be described.

Figure 3:
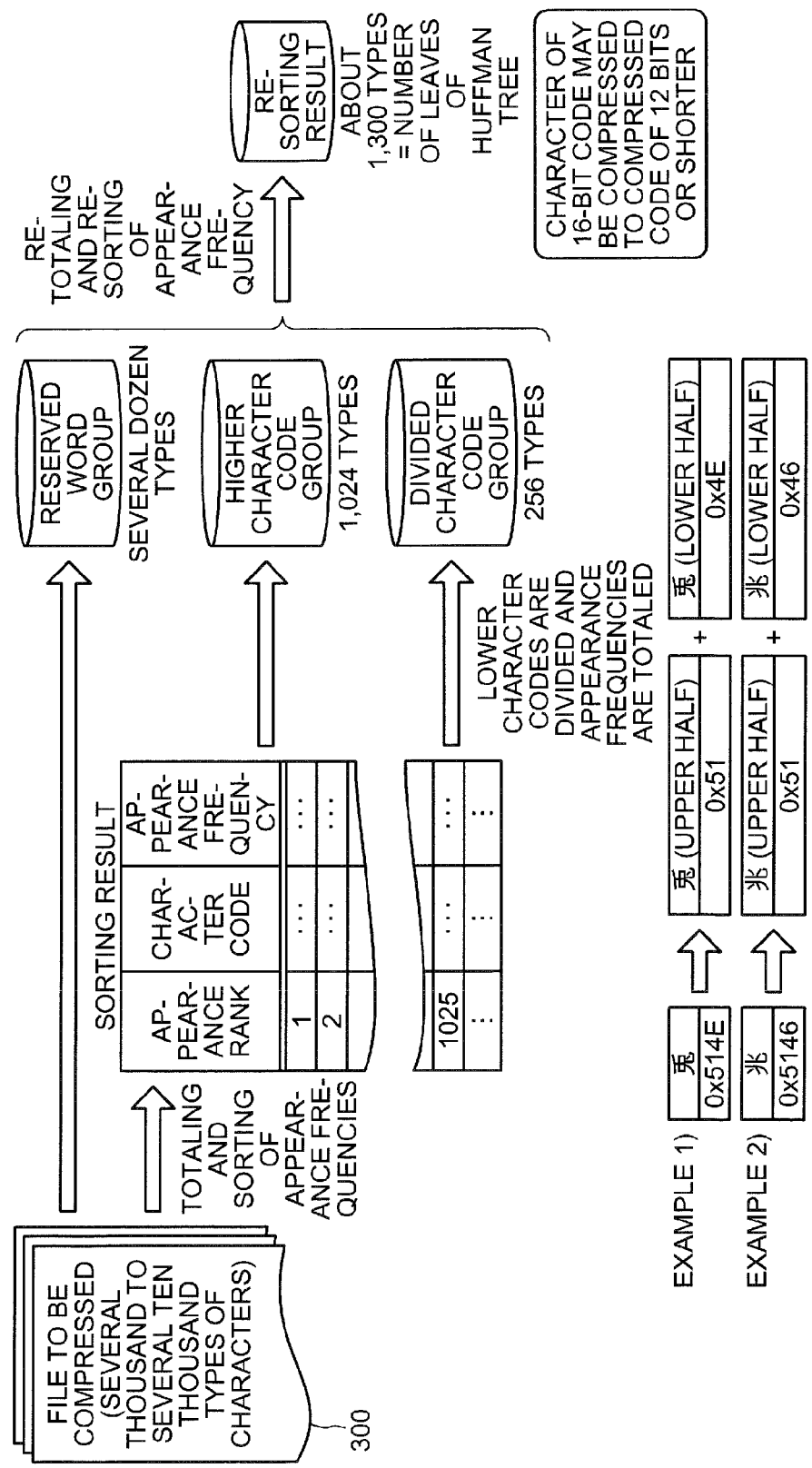
FIG. 3 is an explanatory diagram of a compression pre-process.

FIG. 3 is an explanatory diagram of a compression pre-process. A file 300 to be compressed describes therein several thousand to several ten thousand types of characters. In the program, the appearance frequencies of character codes in the file 300 to be compressed are totaled and are sorted in descending order of frequency. The character codes are divided into higher character codes (for example, those from the first to the 1024th places) and lower character codes (for example, those from the 1025 th place and lower).

The higher character codes have high appearance frequencies and, therefore, each of these codes is allocated with a compressed code as a 16-bit code. Each of the lower character codes is divided into an upper eight-bits and a lower eight-bits. Although 65, 536 (256×256) types of characters at most may be handled using 16-bit codes, 60,000 or more types of lower character codes may be suppressed to 256 types of divided character codes by dividing each of the lower character codes into eight-bit character codes.

For example, the 16-bit character code of a Kanji character "兎"is "0x514E" and, therefore, this code is divided into its upper eight-bits "0x51" and its lower eight-bits "0x4E". Similarly, the 16-bit character code of a Kanji character "兆"is "0x5146" and, therefore, this code is divided into its upper eight-bits "0x51" and its lower eight-bits "0x46". The appearance frequency of each eight-bit divided character code is totaled. In the examples of "兎"and "兆", the appearance frequency of the divided character code "0x51" is 2 and that of each of the divided character codes "0x4E" and "0x46" is 1.

Tags such as "<p>" and "<p/>" are assumed to be reserved words. Several dozens of reserved words are determined in advance. A group of higher character codes, a group of divided character codes, and a group of reserved words are mixed and the appearance frequencies thereof are again totaled and are again sorted in descending order of frequency. Thereby, about 1,300 types of character codes sorted in descending order of appearance frequency are obtained. By thus suppressing the quantity of types of character codes, each 16-bit character code may be compressed to a compressed code of 12 bits or less and each compressed code may be decompressed to the 16-bit character code.

Figure 4:
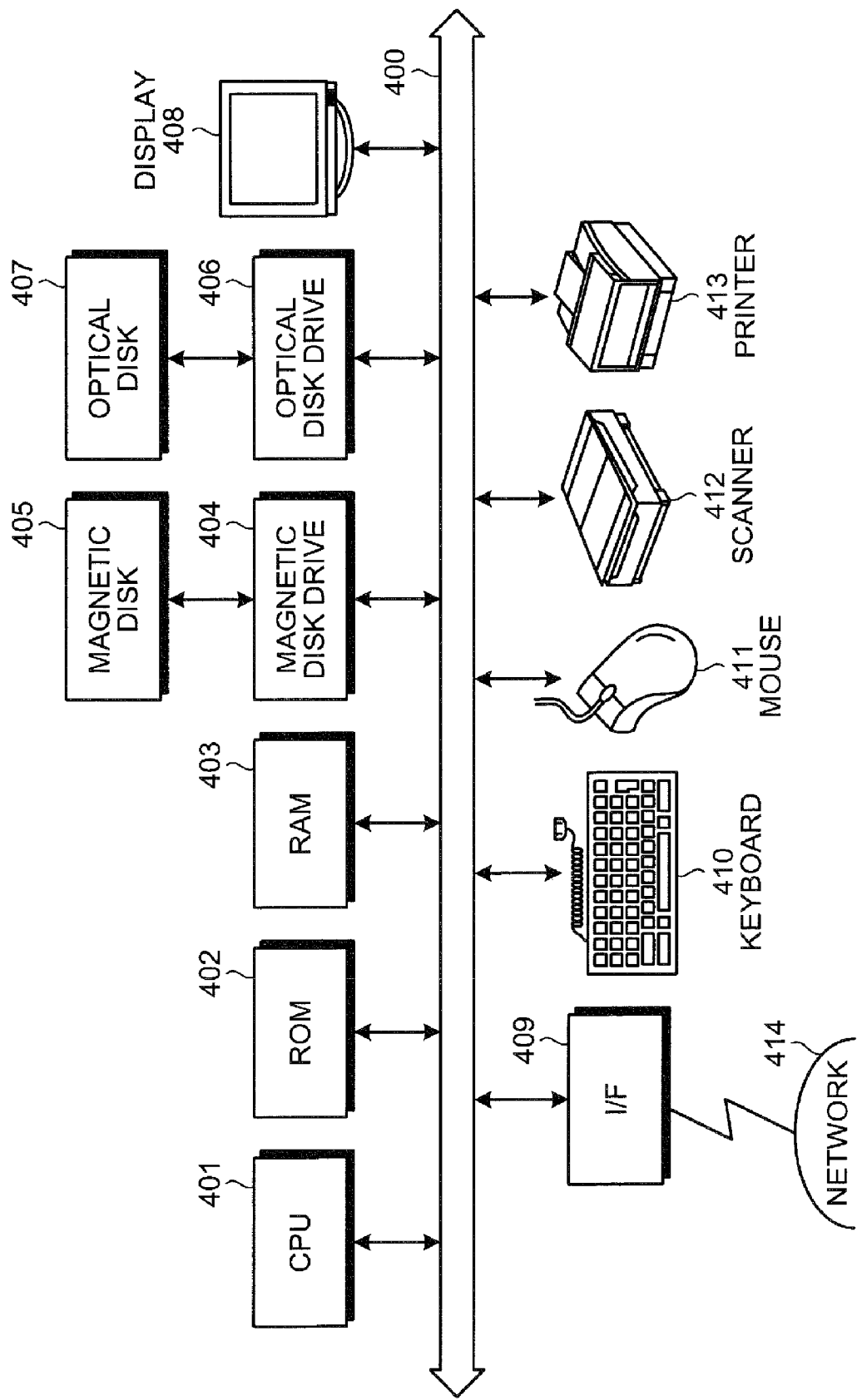
FIG. 4 is a block diagram of an information processing apparatus according to an embodiment.

FIG. 4 is a block diagram of an information processing apparatus according to the embodiment. As depicted in FIG. 4, the information processing apparatus includes a central processing unit (CPU) 401, a read-only memory (ROM) 402, a random access memory (RAM) 403, a magnetic disk drive 404, a magnetic disk 405, an optical disk drive 406, an optical disk 407, a display 408, a interface (I/F) 409, a keyboard 410, a mouse 411, a scanner 412, and a printer 413, respectively connected by a bus 400.

The CPU 401 governs overall control of the information processing apparatus. The ROM 402 stores therein programs such as a boot program. The RAM 403 is used as a work area of the CPU 401. The magnetic disk drive 404, under the control of the CPU 401, controls the reading and writing of data with respect to the magnetic disk 405. The magnetic disk 405 stores therein data written under control of the magnetic disk drive 404.

The optical disk drive 406, under the control of the CPU 401, controls the reading and writing of data with respect to the optical disk 407. The optical disk 407 stores therein data written under control of the optical disk drive 406, the data being read by a computer.

The display 408 displays, for example, data such as text, images, functional information, etc., in addition to a cursor, icons, and/or tool boxes. A cathode ray tube (CRT), a thin-film-transistor (TFT) liquid crystal display, a plasma display, etc., may be employed as the display 408.

The I/F 409 is connected to a network 414 such as a local area network (LAN), a wide area network (WAN), and the Internet through a communication line and is connected to other apparatuses through the network 414. The I/F 409 administers an internal interface with the network 414 and controls the input/output of data from/to external apparatuses. For example, a modem or a LAN adaptor may be employed as the I/F 409.

The keyboard 410 includes, for example, keys for inputting letters, numerals, and various instructions and performs the input of data. Alternatively, a touch-panel-type input pad or numeric keypad, etc. may be adopted. The mouse 411 is used to move the cursor, select a region, or move and change the size of windows. A track ball or a joy stick may be adopted provided each respectively has a function similar to a pointing device.

The scanner 412 optically reads an image and takes in the image data into the information processing apparatus. The scanner 412 may have an optical character recognition (OCR) function as well. The printer 413 prints image data and text data. The printer 413 may be, for example, a laser printer or an ink jet printer.

Figure 5:
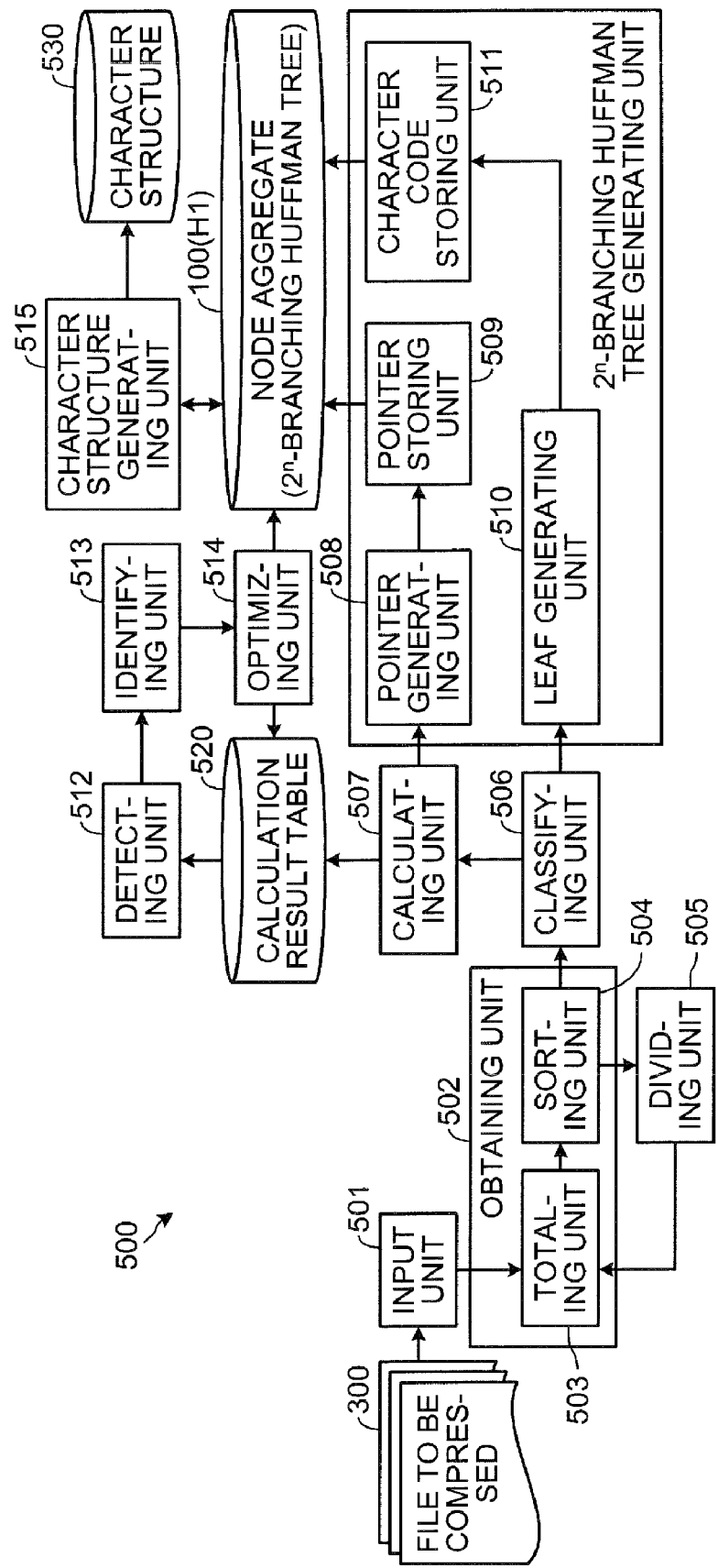
FIG. 5 is a block diagram of a first functional configuration of the information processing apparatus according to the embodiment.

FIG. 5 is a block diagram of a first functional configuration of the information processing apparatus according to the embodiment. As depicted in FIG. 5, an information processing apparatus 500 includes an input unit 501, an obtaining unit 502, a classifying unit 506, a calculating unit 507, a $2^n$-branching Huffman tree generating unit (a pointer generating unit 508, a pointer storing unit 509, a leaf generating unit 510, and a character code storing unit 511), a detecting unit 512, an identifying unit 513, an optimizing unit 514, and a character structure generating unit 515.

The input unit 501 to the character structure generating unit 515 realize respective functions by causing the CPU 401 to execute a program stored in a storing medium such as the RAM 403, the magnetic disk 405, or the optical disk 407 depicted in FIG. 4, or by the I/F 409.

The input unit 501 has a function of inputting character codes from the file 300 to be compressed. More specifically, for example, the CPU 401 scans the file 300 and thereby, sequentially reads $2^n$-bit character codes from the file 300. The character codes read are retained in a register in the CPU 401.

The obtaining unit 502 has a function of obtaining a total appearance frequency for each of the $2^n$-bit character codes described in the file 300. If at least the total appearance frequencies can be obtained, the total appearance frequencies may be read directly. Alternatively, the character codes set in the register by the input unit 501 may be totaled sequentially, in which case, more specifically, for example, the obtaining unit 502 includes a totaling unit 503 and a sorting unit 504. The totaling unit 503 totals each of the character codes set in the register. For example, the CPU 401 increments, in a character appearance frequency totaling table, a counted value for a character code that coincides with the character code set in the register.

FIG. 6 is an explanatory diagram of the character appearance frequency totaling table. The character appearance frequency totaling table 600 is stored in a storing medium such as the RAM 403, the magnetic disk 405, or the optical disk 407 depicted in FIG. 4 and is accessible by the CPU 401. The character appearance frequency totaling table 600 stores therein a counted value for each character. The column of "CHARACTER" is populated with various characters for convenience of the description. However, in practice, the column is allocated with the character codes to be compared with a character code input. That is, the CPU 401 scans character codes input to detect character codes that coincide with character items in the character column. When such character codes are detected, the CPU 401 increments the counted value by one point.

Figure 7:
FIG. 7 is an explanatory diagram of a reserved word appearance frequency totaling table.

FIG. 7 is an explanatory diagram of a reserved word appearance frequency totaling table. A reserved word appearance frequency totaling table 700 is stored in a storing medium such as the RAM 403, the magnetic disk 405, or the optical disk 407 depicted in FIG. 4 and is accessible by the CPU 401. The reserved word appearance frequency totaling table 700 stores therein a counted value for each reserved word. The column of "RESERVED WORD" is populated with various characters for convenience of the description.

However, in practice, the column is populated with character code strings to be compared with the character codes input. That is, prior to the comparison with the character appearance frequency totaling table 600 depicted in FIG. 6, the CPU 401 scans a character code input to detect coincidence with items in the column of "RESERVED WORD".

When a character code coincides, the CPU 401 scans the next character code input for an item in the column of "RESERVED WORD". In repeating the above processing, when a character code string that coincides is detected, the CPU 401 increments the counted value of the character code string of the reserved word by one point. When a character code that does not coincide appears, the CPU 401 accesses the character appearance frequency totaling table 600 and increments by one point, the counted values of the character codes of the character code strings found to coincide thus far. As described, the CPU 401, using the character appearance frequency totaling table 600, totals character codes that do not coincide.

Reference of the explanation returns to FIG. 5. The sorting unit 504 has a function of sorting the totaling results. More specifically, for example, the CPU 401 sorts, in descending order of counted value, the characters (character codes) in the character appearance frequency totaling table 600 and the reserved words in the reserved word appearance frequency totaling table 700.

Figure 8:
FIG. 8 is an explanatory diagram of a totaling result table consolidating the appearance frequencies of the character codes and the reserved words.

FIG. 8 is an explanatory diagram of a totaling result table in which the appearance frequencies of the character codes and the reserved words have been consolidated. In the totaling result table 800, the character codes or the reserved words are sorted in descending order of appearance frequency (counted value). The totaling result table 800 is stored in a storing medium such as the RAM 403, the magnetic disk 405, or the optical disk 407 depicted in FIG. 4 and is accessible by the CPU 401.

The dividing unit 505 has a function of, using the results from the sorting by the sorting unit 504 to divide the character codes into the character codes having higher appearance frequencies and the character codes having lower appearance frequencies, and further dividing the character codes having lower appearance frequencies into upper bit codes and lower bit codes. More specifically, for example, with respect to the sorted characters (codes) in the character appearance frequency totaling table 600 sorted in descending order of counted value, the character codes, for example, from the first place to the 1024th place are classified as higher character codes and the character codes in the 1025th place and lower are classified as lower character codes. The CPU 401 divides each of the lower character codes into an upper eight-bit code and a lower eight-bit code as depicted in the first and the second examples of FIG. 3.

The divided character codes such as the upper eight-bit codes and the lower eight-bit codes are at most 256 types. At most 60,000 or more types of characters are allocated to the 16-bit codes and the same quantity of leaves are necessary. However, by dividing the lower character codes whose appearance ranks are low, at most about 60,000 types of character codes in the 1025th place or lower may be expressed by at most 256 types of divided character codes. Therefore, the quantity of leaves to be allocated to the character codes may be significantly reduced (1024+256+the quantity of reserved words+the quantity of types). In this case, the totaling unit 503 again totals the appearance frequencies of the divided character codes.

Figure 9:
FIG. 9 is an explanatory diagram of a divided character code appearance frequency totaling table.

FIG. 9 is an explanatory diagram of a divided character code appearance frequency totaling table. The divided character code appearance frequency totaling table 900 is stored in a storing medium such as the RAM 403, the magnetic disk 405, or the optical disk 407 depicted in FIG. 4 and is also accessible by the CPU 401. The sorting unit 504 consolidates the higher character codes, which are each 16 bits, the reserved words, and the divided character codes (hereinafter, "Character Codes, etc.") and, thereby, updates the totaling result table 800 depicted in FIG. 8.

The classifying unit 506 has a function of classifying the Character Codes, etc., by layer, according to the appearance probability P of each and based on the totaling result obtained by the obtaining unit 502. More specifically, for example, the totaling result table 800 is referenced and thereby, the Character Codes, etc., are classified by layer and according to the appearance probability P.

The appearance probability P is a value obtained by dividing the total quantity of the Character Codes, etc., by the quantity of appearances of a given Character Code, etc., (the counted value in the character appearance frequency totaling table 600). The CPU 401 calculates the appearance probability P for each of the Character Codes, etc., and classifies by layer, the appearance probabilities P calculated. For example, for the ith layer, character codes each having an appearance probability P that is $1/2^{ni} \leq P < 1/2^{n(i-1)}$ constitute a group. However, for the first layer (i=1), character codes each having an appearance probability P that is $1/2^{ni} \leq P < 1$ constitute a group and, for an nth layer (i=n), character codes each having an appearance probability P that is $P < 1/2^{n(i-1)}$ constitute a group.

For example, when n=4, the Character Codes, etc., in the first layer are character codes whose appearance probabilities P are each $1/16 \leq P < 1$; the Character Codes, etc., in the second layer are character codes whose appearance probabilities P are each $1/32 \leq P < 1/16$; the Character Codes, etc., in the third layer are character codes whose appearance probabilities P are each $1/4096 \leq P < 32$; and the Character Codes, etc., in the fourth layer are character codes whose appearance probabilities P are each $P < 1/4096$. The layer numbers resulting from the classification and the rank in the totaling result table 800 are given to the Character Codes, etc., respectively. The rank in the totaling result table 800 is the leaf number of each of the Character Codes, etc.

The calculating unit 507 has a function of calculating the quantity of pointers pointing to leaves in the ith layer based on the quantity of character codes in the ith layer classified by the classifying unit 506. The calculating unit 507 further has a function of calculating the quantity of pointers in the ith layer pointing to lower nodes, i.e., link destinations that are nodes in the (i+1)th layer, and based on the quantity of pointers pointing to the leaves in the ith layer, calculating the number of times the nodes in the ith layer are used.

More specifically, for example, from the node aggregate 100 and the classification result, the CPU 401 calculates, for the ith layer, the quantity of structure cells N(i), the quantity of leaves Nl(i), the quantity of pointers pointing to leaves Nlp(i), the quantity of pointers pointing to lower nodes Nnp(i), the number of times a structure cell Ncu(i) is used, an accumulated value of the quantity of pointers to leaves ΣNlp(i), the quantity of blank cells from the head Ncst(i), the quantity of blank pointers up to the tail Npse(i), and the quantity of blank cells up to the tail Ncse(i).

FIG. 10 is an explanatory diagram of a calculation result table by the calculating unit 507. The calculation result table 520 is stored in a storing medium such as the RAM 403, the magnetic disk 405, or the optical disk 407 depicted in FIG. 4 and is accessible by the CPU 401. The CPU 401 writes the value of each item calculated for each layer into the calculation result table 520. FIG. 10 depicts the calculation result obtained when n=4.

The quantity of structure cells N(i) is the quantity of structure cells C(i, j) of the nodes in the ith layer. The quantity of structure cells N(i) is obtained by counting the quantity of structure cells C(i, j) of the nodes in each layer of the node aggregate 100 by the CPU 401. When n=4, the quantity of structure cells in the first layer is one (the root); in the second layer, 16; in the third layer, 256; and in the fourth layer, 4096.

The quantity of leaves Nl(i) is the quantity of leaf structures in the ith layer. The quantity of leaves Nl(i) is the quantity of the character codes in each layer resulting from the classification. In the example of FIG. 10, the quantity of leaves Nl(i) in the first layer is three; in the second layer, 54; in the third layer, 353; and in the fourth layer, 885.

The quantity of pointers pointing to leaves Nlp(i) is the total quantity of pointers that point to leaves and are to be stored in the structure cell C(i, j) of a node in the ith layer. The quantity of pointers pointing to leaves Nlp(i) is equal to the quantity of leaves Nl(i).

The quantity of pointers pointing to lower nodes Nnp(i) is the total quantity of pointers that point to the lower nodes and are to be stored in the structure cell C(i, j) of a node in the ith layer and because the pointer points to a lower node, this quantity Nnp(i) depends on the quantity of pointers pointing to leaves in the (i+1)th layer and the quantity of pointers pointing to lower nodes Nnp(i+1). For example, the CPU 401 calculates the quantity of pointers pointing to lower nodes Nnp(i) according to Equation (1).

$$Nnp(i)=\{Nlp(i+1)+Nnp(i+1)\}/2^n+1 \quad (1)$$

Where, the fraction is rounded off. When i=n, no lower node is present and therefore, Nnp(i)=0.

The number of times the structure cells Ncu(i) is used is the total quantity, in the ith layer, of the structure cells C(i, j) that store the pointers to leaves and the pointers to lower nodes of the structure cells C(i, j). For example, the CPU 401 calculates the number of times the structure cells are used Ncu(i) according to Equation (2).

$$Ncu(i)=\{Nlp(i)+Nnp(i)/2^n+1\} \quad (2)$$

Where, the fraction is rounded off.

The accumulated value of the quantity of pointers pointing to leaves ΣNlp(i) is the total quantity of pointers Nlp(i) from the first layer to the ith layer.

The quantity of blank cells from the head Ncst(i) is the quantity of unused cells from a structure cell C(i, 1) that is the head in the ith layer. The structure cells C(i, j) constituting the node aggregate 100 each originally store the pointers to the upper nodes. However, when the structure cells C(i−1, j) of the upper nodes are linked to the structure of a leaf Lj, the structure of the leaf Lj stores the pointers to the same upper nodes as those of the structure cells C(i, j).

In this manner, the pointers overlap and therefore, the quantity of blank cells from the head Ncst(i) is calculated to put priority on the pointers to the upper nodes, stored in the structure of the leaf Lj. More specifically, for example, the CPU 401 calculates the quantity of blank cells from the head Ncst(i) according to Equation (3).

$$Ncst(i)=\Sigma Nlp(i-1) \quad (3)$$

Where, when i=1, Ncst(i)=0.

Therefore, in the example of FIG. 10, structure cells C(2, 1) to C(2, 3) are blank cells (unused cells) from the head in the second layer; structure cells C(3, 1) to C(3, 57) are blank cells (unused cells) from the head in the third layer; and, similarly, structure cells C(4, 1) to C(4, 410) are blank cells (unused cells) from the head in the fourth layer.

The quantity of blank pointers up to the tail Npse(i) is the total quantity of the blank pointers obtained when pointers to leaves and pointers to lower nodes that are from a structure cell C(i, j) immediately after blank cells from the head are stored in the first layer. However, blank pointers of the blank cells from the head are excluded. More specifically, for example, the CPU 401 calculates the quantity of blank pointers up to the tail Npse(i) according to Equation (4).

$$Npse(i)=N(i)\times 2^n-Nlp(i)-Nnp(i)-Ncst(i)\times 2^n \quad (4)$$

The quantity of blank cells up to the tail Ncse(i) is the quantity of structure cells C(i, j) left when the blank cells from the head and the structure cells C(i, j) storing therein the pointers to leaves and the pointers to lower nodes are excluded from the structure cell group in the ith layer. More specifically, for example, the CPU 401 calculates the quantity of blank cells up to the tail Ncse(i) according to Equation (5).

$$Ncse(i)=N(i)-Ncu(i)-Ncst(i) \quad (5)$$

The pointer generating unit 508 has a function of generating pointers to leaves in the ith layer and pointers to the lower nodes in the ith layer, based on the calculation result calculated by the calculating unit 507. More specifically, for example, the CPU 401 accesses the calculation result table 520 and obtains the quantity of pointers pointing to the leaves and the quantity of pointers pointing to the lower node in the ith layer.

For a $2^n$-branching Huffman tree H1, the quantity of branches from a node is "$2^n$" and therefore, when n=4, a pointer to a lower node that is a branch number is a four-bit code. For example, at the root C(1, 1) in the first layer, a pointer to a leaf L1 is "0000"; a pointer to a leaf L2 is "0001"; a pointer to a leaf L3 is "0010"; a pointer to a lower node C(2, 4) is "0011"; a pointer to a lower node C(2, 5) is "0100", . . . , and a pointer to a lower node C(2, 8) is "0111". The pointers generated are temporarily stored in a storing medium such as the RAM 403, the magnetic disk 405, or the optical disk 407 depicted in FIG. 4.

The pointer storing unit 509 has a function of storing in the nodes of a quantity that is to be used in the ith layer, the pointers to the leaves in the ith layer and the pointers to the lower nodes in the ith layer generated by the pointer generating unit 508. More specifically, for example, the CPU 401 identifies, among the structure cells C(i, j) in the ith layer, the structure cell at the head capable of storing therein the pointers.

More specifically, for example, the CPU 401 accesses the calculation result table 520 and obtains the quantity of blank cells from the head Ncst(i). The CPU 401 determines the structure cell C(i, j) at the head capable of storing therein the pointers, as the structure cell C(i, Ncst(i)+1). The CPU 401 first stores the pointers to leaves sequentially according to leaf number and then stores the pointers to lower nodes, in the structure cells subsequent to the structure cell C(i, Ncst(i)+1). The total quantity of structure cells that store therein the pointers to leaves and the pointers to lower nodes coincides with the number of times the structure cells Ncu(i) are used as indicated in the calculation result table 520.

The leaf generating unit 510 has a function of generating, for each character code, leaves that are link destinations of nodes in the ith layer by using the pointers to leaves stored in the nodes in the ith layer by the pointer storing unit 509 and stored for each character in the ith layer classified by the classifying unit 506. More specifically, for example, the leaf generating unit 510 generates, for each layer, structures of the leaves L# of the quantity of leaves Nl(i). The structures of the leaves L# are stored in a storing medium such as the RAM 403, the magnetic disk 405, or the optical disk 407 depicted in FIG. 4.

Figure 11:
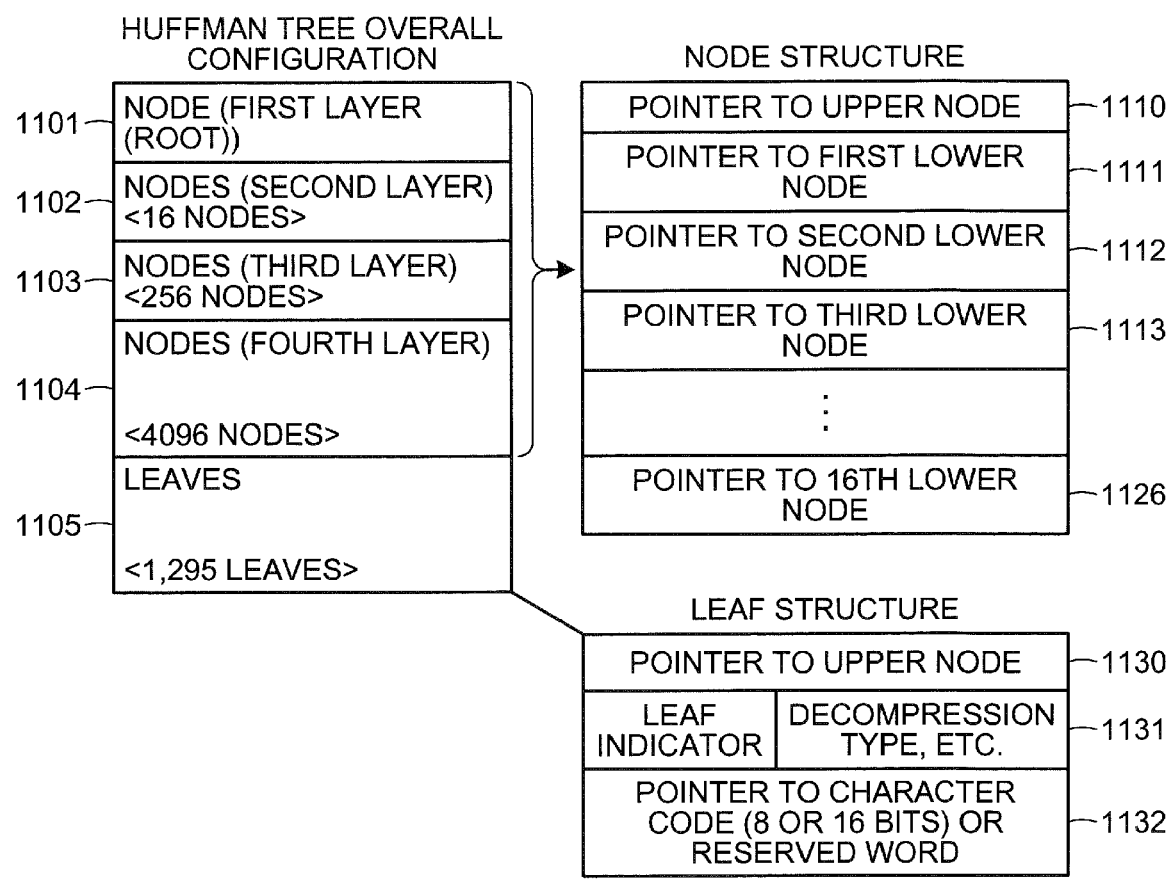
FIG. 11 is an explanatory diagram of a structure of a $2^n(16)$-branching Huffman tree.

FIG. 11 is an explanatory diagram of the structure of a $2^n$(16)-branching Huffman tree. For a 16-branching tree obtained when n=4, the Huffman tree includes one node (root) structure in the first layer; 16 node structures in the second layer; 256 node structures in the third layer; 4096 node structures in the fourth layer; and 1295 structures of the leaves L#.

A node structure includes 17 types of pointers including a pointer 1110 to an upper node and pointers from a pointer 1111 to a lower first node to a pointer 1126 to a lower 16th node. Each of the structures of the leaves L# has a first area 1130 to a third area 1132. The first area 1130 stores therein a pointer to an upper node. More specifically, for example, when the pointer to the lower 12th node of the jth node structure in the ith layer points to a first structure of the leaf L#, the first area 1130 stores therein a head address (pointer) to the jth node structure in the ith layer.

The second area 1131 stores therein leaf indicators, the decompression type, etc. A "leaf indicator" is a flag to be referred to for compression and decompression. When the indicator indicates "0" (indicating "OFF"), an ordinary node is indicated. When the indicator indicates "1" (indicating "ON"), a leaf is indicated. The "decompression type" indicates whether the object to be decompressed is a 16-bit character code whose appearance frequency is high, a divided eight-bit character code whose appearance frequency is low, or a reserved word. The third area 1132 stores therein, according to the decompression types, pointers to upper one-bit character codes, lower divided eight-bit character codes, or the reserved words.

The character code storing unit 511 has a function of generating the $2^n$-branching Huffman tree H1 by storing the character codes, which are correlated respectively with the leaf numbers, in the leaves 510 according to leaf number. More specifically, for example, the character code storing unit 511 stores each of the character codes to the third area 1132 of the leaf L# that stores therein the leaf L# of the number # that coincides with the rank (see FIG. 8) of the appearance frequency of the character code. For a reserved word, the pointer to the reserved word is stored. Character code strings of the reserved words may be stored according to the size of the third area 1132.

In this manner, the structures of the leaves L# generated by the leaf generating unit 510 are linked to the corresponding node structure cells C(i, j) of the node aggregate 100 depicted in FIG. 1; the pointers to the leaves L# are stored in the structure cells C(i, j) of the node aggregate 100 by the pointer storing unit 509; and the character codes and the pointers of the reserved words are stored in the structures of the leaves L# by the character code storing unit 511. Thereby, a $2^n$-branching Huffman tree H1 is generated from the node aggregate 100.

Figure 12:
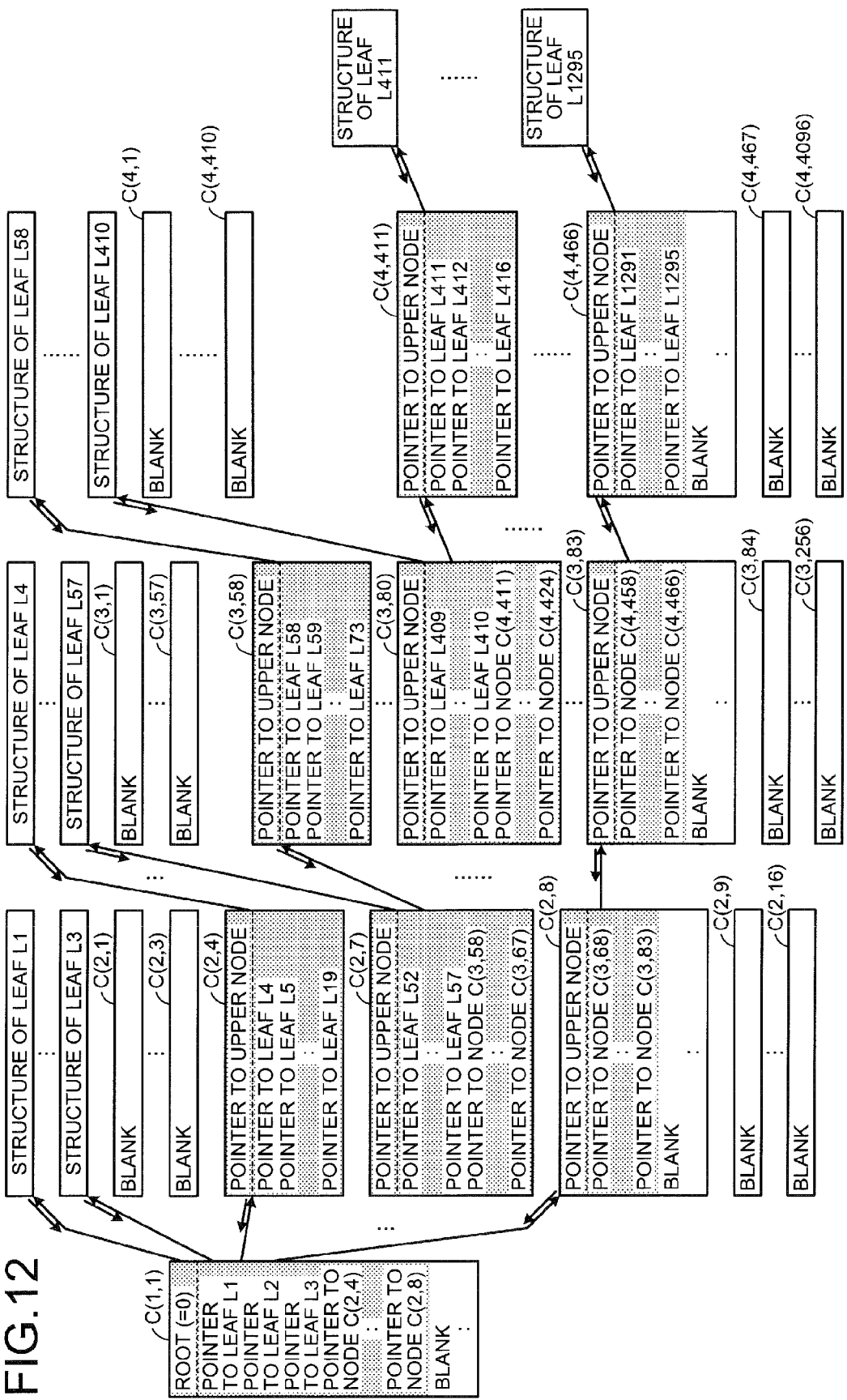
FIG. 12 is an explanatory diagram of a structure of a $2^n$-branching Huffman tree.

FIG. 12 is an explanatory diagram of a structure of the $2^n$-branching Huffman tree H1. The $2^n$-branching Huffman tree H1 is stored in a storing medium such as the RAM 403, the magnetic disk 405, or the optical disk 407 depicted in FIG. 4. FIG. 12 depicts an example when n=4, i.e., a 16-branching Huffman tree.

The detecting unit 512 has a function of detecting the quantity of pointers pointing to leaves in the ith layer and the quantity of blank pointers in blank nodes in the (i−1)th layer. More specifically, for example, the CPU 401 reads, from the calculation result table 520, the quantity of pointers pointing to leaves in the ith layer Nlp(i) and the quantity of blank pointers up to the tail in the (i−1)th layer.

The identifying unit 513 has a function of identifying pointers to the leaves L# in the ith layer to be moved from the ith layer to blank nodes in the (i−1)th layer (hereinafter, "pointers to be moved"), based on the quantity of pointers pointing to leaves in the ith layer and the quantity of blank pointers in blank nodes in the (i−1)th layer detected by the detecting unit 512. More specifically, for example, the CPU 401 determines the pointers to be moved according to Expression (6) using the quantity of pointers pointing to leaves in the ith layer Nlp(i), the quantity of blank pointers up to the tail in the (i−1)th layer Npse(i−1), and the quantity of pointers pointing to lower nodes in the (i−1)th layer Nnp(i−1) that are read.

$$Npse(i-1)+Nnp(i-1)>Nlp(i) \tag{6}$$

When Expression (6) is satisfied, the pointers to the leaves L# in the ith layer are all movable to the (i+1)th layer. When Expression (6) is not satisfied, the pointers to leaves in the ith layer of the same quantity as the quantity of blank pointers up to the tail in the (i−1)th layer Npse(i−1) are determined to be pointers to be moved. For example, in a case where the $2^n$-branching Huffman tree H1 of FIG. 11 is optimized, when the calculation result table 520 is referenced for i=4, the quantity of pointers pointing to the leaves in the fourth layer Nlp(4) is Nlp(4)=885, the quantity of blank pointers up to the tail in the third layer Npse(3) is Npse(3)=2775, and the quantity of pointers pointing to the lower nodes in the third layer Nnp(3) is Nnp(3)=56 and, therefore, Expression (6) is satisfied. Thus, the pointers from a pointer to a leaf L411 to a pointer to a leaf L1295 in the fourth layer are all movable to blank cells in the third layer.

The optimizing unit 514 has a function of deleting, from the nodes in the (i−1)th layer, the pointers to the nodes that store therein the pointers to be moved identified by the identifying unit 513 and of moving the pointers to be moved to the nodes in the (i−1)th layer. More specifically, for example, in the example above, the optimizing unit 514 deletes, from the third layer, pointers to nodes C(4, 411) to C(4, 466) that store therein the pointers to be moved (the pointers from the pointer to the leaf L411 to the pointer to the leaf L1295 in the fourth layer) and sequentially moves the pointers to be moved from the structure cell C(3, 80) in the third layer. That is, the structures from the structure of the leaf L411 to the structure of the leaf L1295 are raised from the fourth layer to the third layer.

Thus, although the compressed code length is 16 bits for the fourth layer, the compressed code length is shortened to 12 bits by being raised to the third layer. Therefore, improvement of the compression rate may be facilitated. In this manner, by being raised from the ith layer to the (i−1)th layer, the compressed code length is shortened from n×i bits to n×(i−1) bits. Therefore, improvement of the compression rate may be facilitated.

The optimizing unit 514 updates the calculation result table 520 each time the optimization is executed. FIGS. 13A to 13C are schematics of examples of the calculation result table 520 updated when optimization is executed. As depicted, optimization is executed from the lowest layer.

FIG. 13A is an explanatory diagram of updating of the calculation result table 520 when optimization from the fourth layer to the third layer is executed. FIG. 13A depicts exemplary updating from the state depicted in FIG. 10. FIG. 13B is an explanatory diagram of updating of the calculation result table 520 when optimization from the third layer to the second layer is executed. FIG. 13B depicts exemplary updating from the state depicted in FIG. 13A. FIG. 13C is an explanatory diagram of updating of the calculation result table 520 when optimization from the second layer to the first layer is executed. FIG. 13C depicts exemplary updating from the state depicted in FIG. 13B.

Figure 14:
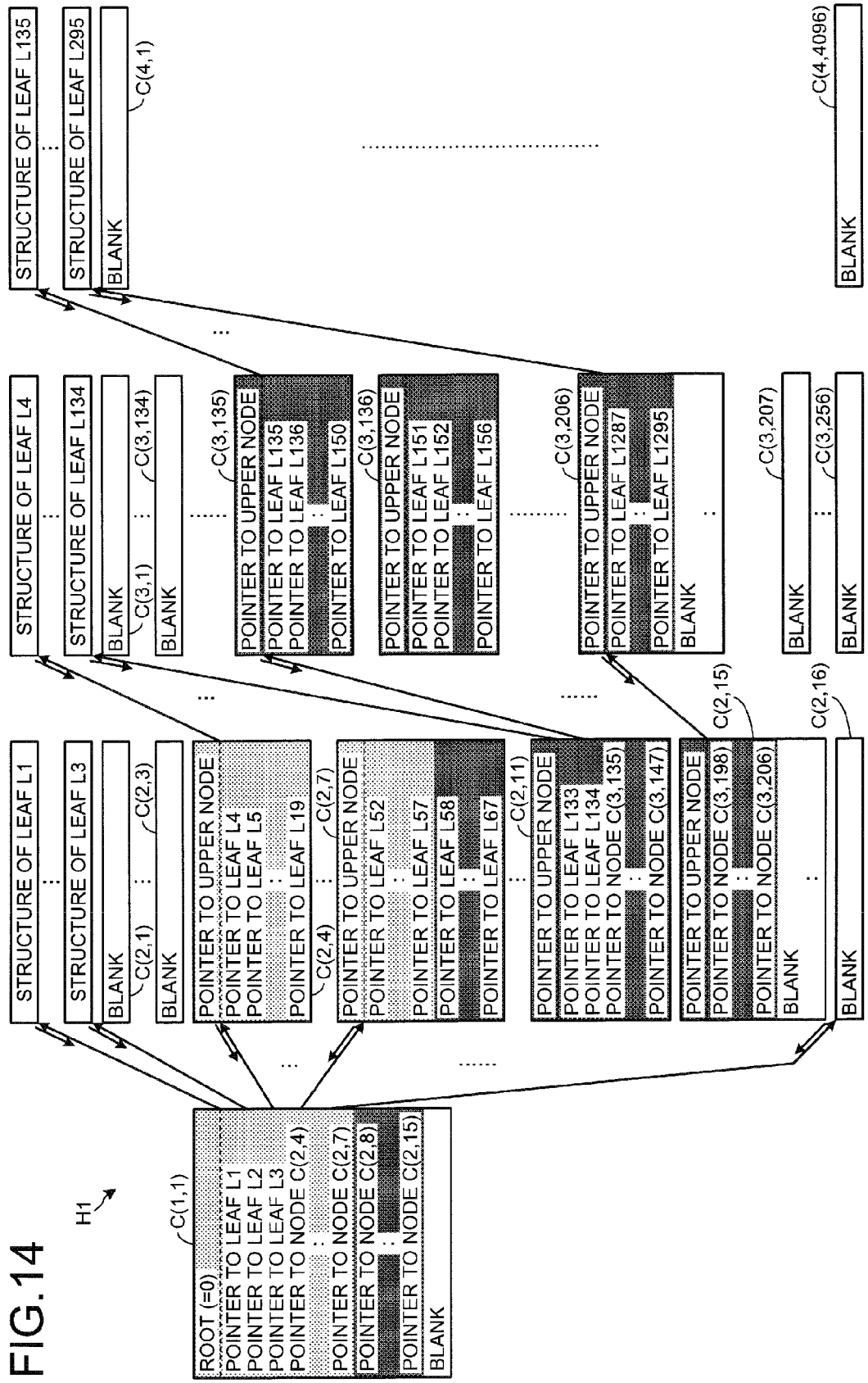
FIG. 14 is an explanatory diagram of a structure of the $2^n$-branching Huffman tree after optimization.

FIG. 14 is an explanatory diagram of a structure of the $2^n$-branching Huffman tree H1 after the optimization. Compared to FIG. 12, no structures of the leaves L# in the fourth layer are present in the $2^n$-branching Huffman tree H1 after the optimization. As above, improvement of the compression rate by the shortening of the compressed codes may be facilitated because the pointers to the leaves L# in a lower layer are moved to blank pointers in an upper layer.

FIG. 15 is an explanatory diagram of information stored in the structures of the leaves L# in the $2^n$-branching Huffman tree H1 after the optimization. Each record of FIG. 15 corresponds to the information stored in each of the structures of the leaves L#. Although a structure of a leaf L# does not have any compressed code stored therein, compressed codes are described in FIG. 15 to clarify the correlation between compressed codes and character codes. A compressed code is a code string from a pointer to a lower node to a pointer to a leaf that are the branch numbers from the root to the corresponding leaf L# of the $2^n$-branching Huffman tree H1. The content depicted in FIG. 15 corresponds to the $2^n$-branching Huffman tree H1 after the optimization depicted in FIG. 2.

Reference of explanation returns to FIG. 5. The character structure generating unit 515 has a function of generating a character structure 530. More specifically, for example, the CPU 401 accesses the reserved word appearance frequency totaling table 700, the character appearance frequency totaling table 600, the divided character code appearance frequency totaling table 900, and the $2^n$-branching Huffman tree H1 and extracts designated information and, thereby, generates structures of the reserved words, structures of the higher character codes, and structures of the divided higher character codes.

FIG. 16 is an explanatory diagram of a reserved word structure. The reserved word structure 1600 is stored in a storing medium such as the RAM 403, the magnetic disk 405, or the optical disk 407 and is accessible by the CPU 401. The reserved word structure 1600 stores therein the total quantity of the reserved words (that is 15 in the example of FIG. 16), the largest bit length Lrmax of the reserved words, each of the reserved words r1 to r15 and respective bit lengths, and the pointers to the leaves L#.

The CPU 401 reads the total quantity of the reserved words, the reserved words, the largest bit length of the reserved words, and the bit lengths of the reserved words. The CPU 401 identifies the upper nodes from the structures of the leaves L# of the reserved words in the $2^n$-branching Huffman tree H1, and reads the pointers to the leaves L# of the reserved words in the structure cells of the upper nodes. Thereby, the reserved word structure 1600 is generated.

Figure 17:
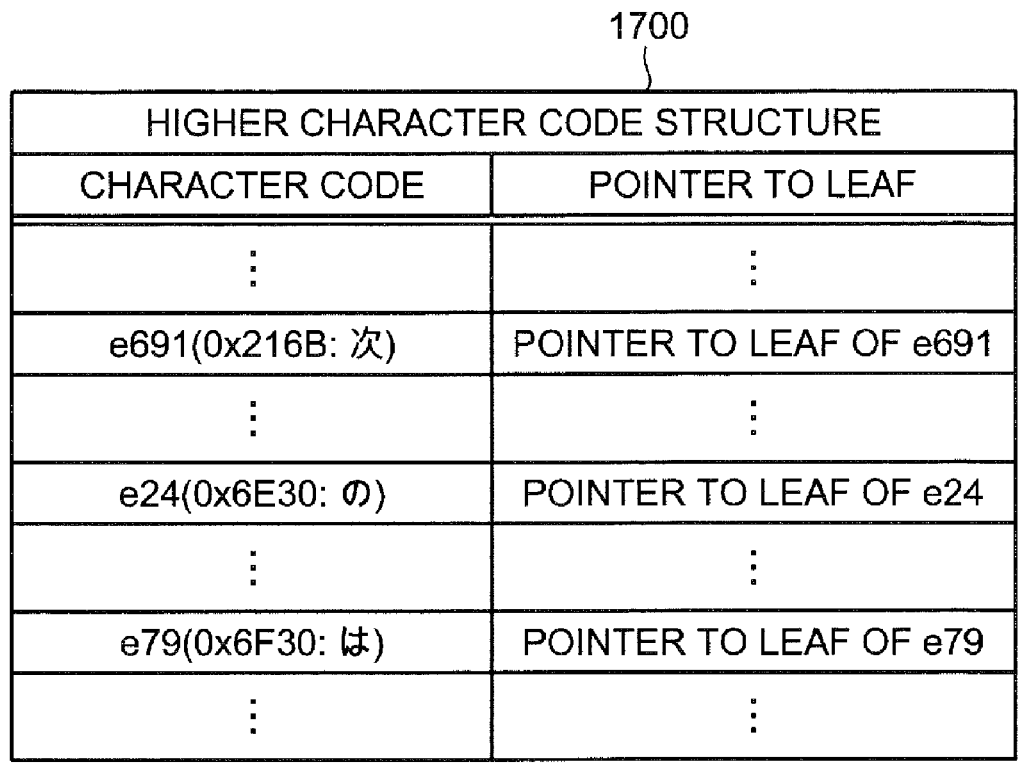
FIG. 17 is an explanatory diagram of a higher character code structure.

FIG. 17 is an explanatory diagram of a higher character code structure. The higher character code structure 1700 is stored in a storing medium such as the RAM 403, the magnetic disk 405, or the optical disk 407 depicted in FIG. 4 and is accessible by the CPU 401. The higher character code structure 1700 stores therein character codes e# and pointers to the leaves L# of the character codes e#.

The CPU 401 reads the character codes e# from the character code appearance frequency totaling table 600. The CPU 401 identifies an upper node from the structure of the leaf L# that corresponds to the character code e# in the $2^n$-branching Huffman tree H1, and reads pointers to the leaves L# that correspond to the character codes e# in the structure cell of the upper node. Thereby, the higher character code structure 1700 is generated.

Figure 18:
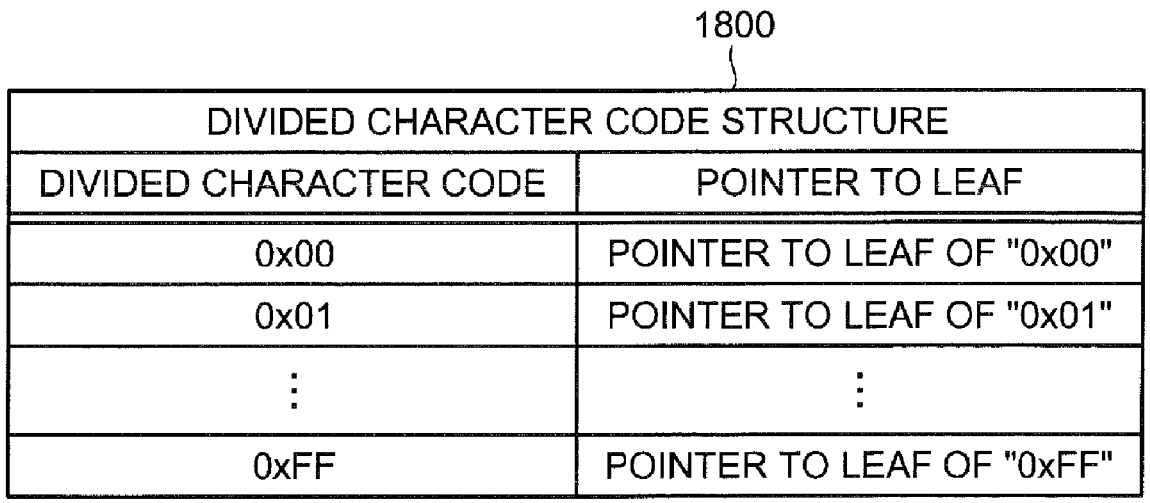
FIG. 18 is an explanatory diagram of a divided character code structure.

FIG. 18 is an explanatory diagram of a divided character code structure. The divided character code structure 1800 is stored in a storing medium such as the RAM 403, the magnetic disk 405, or the optical disk 407 depicted in FIG. 4 and is accessible by the CPU 401. The divided character code structure 1800 stores therein the divided character codes and the pointers to the leaves L# of the divided character codes.

The CPU 401 reads the divided character codes from the divided character code appearance frequency totaling table 900. The CPU 401 identifies the upper node from the structure of the leaves L# that correspond to the divided character codes in the $2^n$-branching Huffman tree, and reads the pointers to the leaves L# that correspond to the divided character codes in the structure cell of the upper node. Thereby, the divided character code structure 1800 is generated.

FIG. 19 is a flowchart of a $2^n$-branching Huffman tree generating process automatically executed by the information processing apparatus 500. As depicted in FIG. 19, the input unit 501 reads the file 300 to be compressed (step S1901). The totaling unit 503 totals respectively the appearance frequencies of the character codes and the reserved words (step S1902). A leaf quantity decreasing process is executed (step S1903). The classifying unit 506 classifies the Character Codes, etc., according to appearance probabilities P thereof for each layer (step S1904).

Thereafter, the calculating unit 507 executes a parameter calculating process (step S1905); and the pointer generating unit 508, the pointer storing unit 509, the leaf generating unit 510, and the character code storing unit 511 execute a structure cell constructing process (step S1906) and an optimizing process (step S1907). Thereby, the $2^n$-branching Huffman tree H1 is automatically generated.

FIG. 20 is a flowchart of the leaf quantity decreasing process (step S1903) depicted in FIG. 19. The sorting unit 504 sorts the 16-bit character codes and the reserved words in descending order of appearance frequency (step S2001). The sorted ranks are referred to and the lower character codes are extracted (step S2002). The lower character codes are divided into an upper group and a lower group of eight-bit divided character codes (step S2003). The appearance frequencies of the divided character codes are totaled (step S2004). The appearance frequencies including all the appearance frequencies of the 16-bit character codes, divided character codes, and the reserved words are sorted in descending order of appearance frequency (step S2005). Thereafter, the procedure moves to step S1904.

Figure 21:
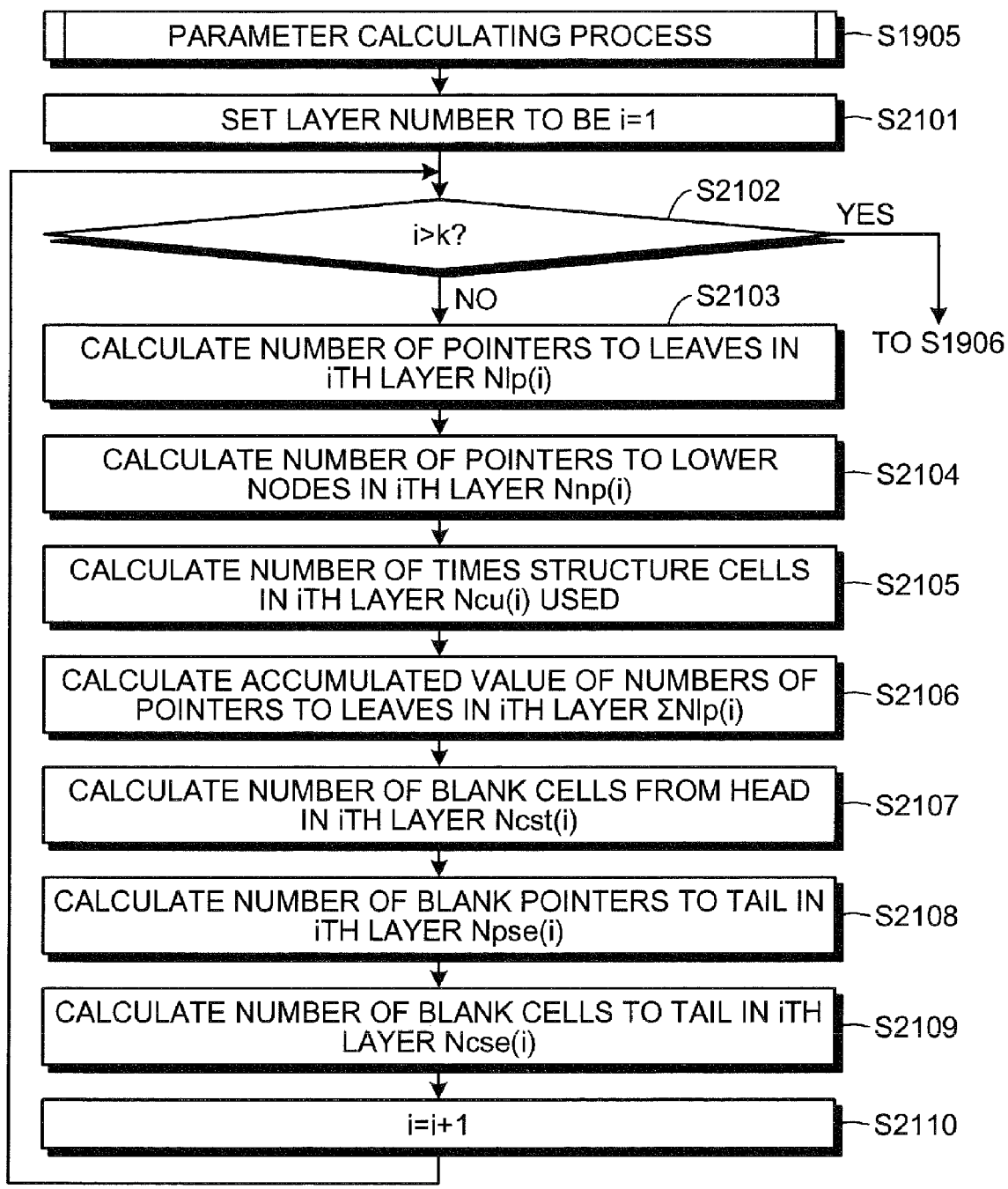
FIG. 21 is a flowchart of a parameter calculating process (step S1905) depicted in FIG. 19.

FIG. 21 is a flowchart of the parameter calculating process (step S1905) depicted in FIG. 19. The layer number "i" is set to be i=1 (step S2101). It is determined whether i is i>k (step S2102).

When i is not i>k (step S2102: NO), the quantity of pointers pointing to the leaves L# in the ith layer Nlp(i), the quantity of pointers pointing to the lower nodes in the ith layer Nnp(i), the number of times the structure cells C(i, j) are used in the ith layer Ncu(i), an accumulated value of the quantities of pointers to leaves ΣNlp(i), the quantity of blank cells from the head in the ith layer Ncst(i), the quantity of blank pointers up to the tail in the ith layer Npse(i), and the quantity of blank cells up to the tail in the ith layer Ncse(i) are calculated (steps S2103 to S2109).

The layer number i is incremented by one point (step S2110), and the procedure returns to step S2102. When i is i>k at step S2102 (step S2002: YES), the procedure moves to step S1906.

Figure 22:
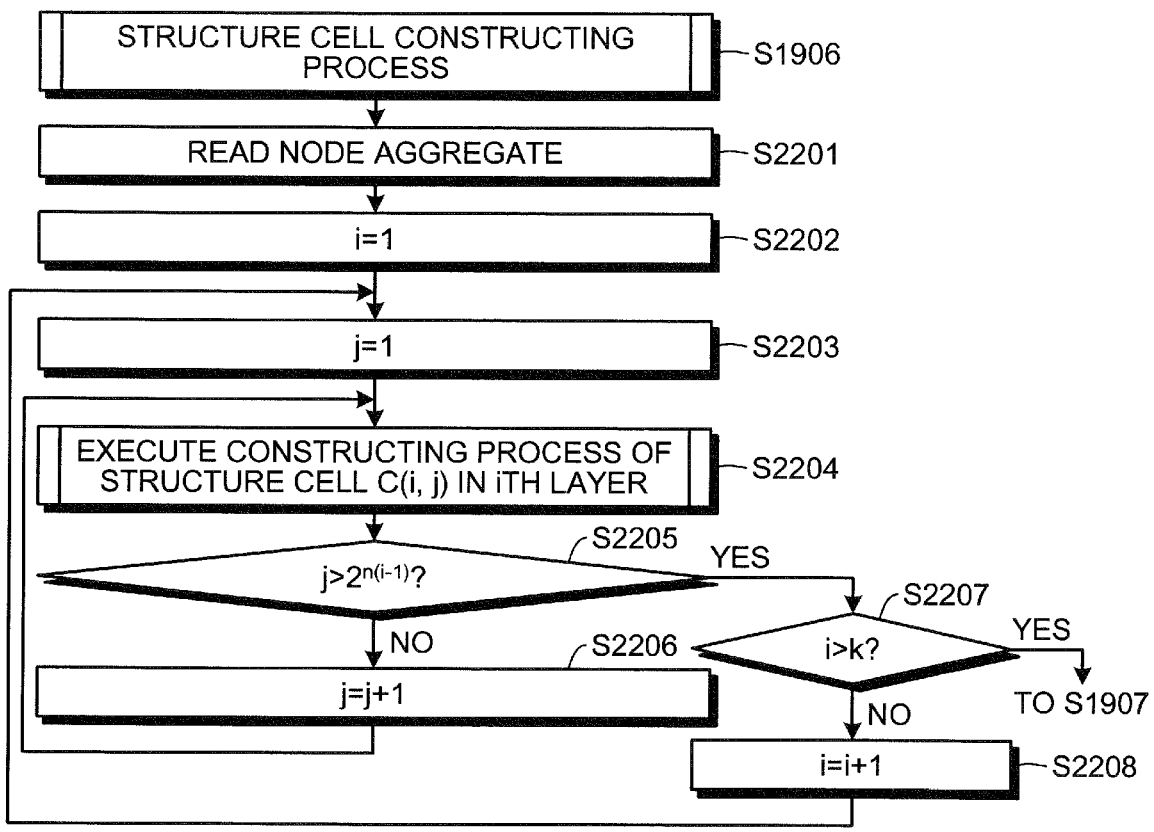
FIG. 22 is a flowchart of a structure cell constructing process (step S1906) depicted in FIG. 19.

FIG. 22 is a flowchart of the structure cell constructing process (step S1906) depicted in FIG. 19. The node aggregate 100 is read (step S2201). The layer number i is set to be i=1 (step S2202) and the cell number j is set to be j=1 (step S2203). The constructing process of the structure cell C(i, j) in the ith layer is executed (step S2204).

Thereafter, whether j is $j>2^{n(i-1)}$ for the quantity of nodes in the ith layer is determined (step S2205). When j is not $j>2^{n(i-1)}$ (step S2205: NO), j is incremented by one point (step S2206) and the procedure returns to step S2204. On the other hand, when j is $j>2^{n(i-1)}$ (step S2205: YES), whether i is i>k is determined (step S2207). When i is not i>k (step S2207: NO), i is incremented by one point (step S2208) and the procedure returns to step S2203. On the other hand, when i is i>k (step S2207: YES), the procedure moves to step S1907.

Figure 23:
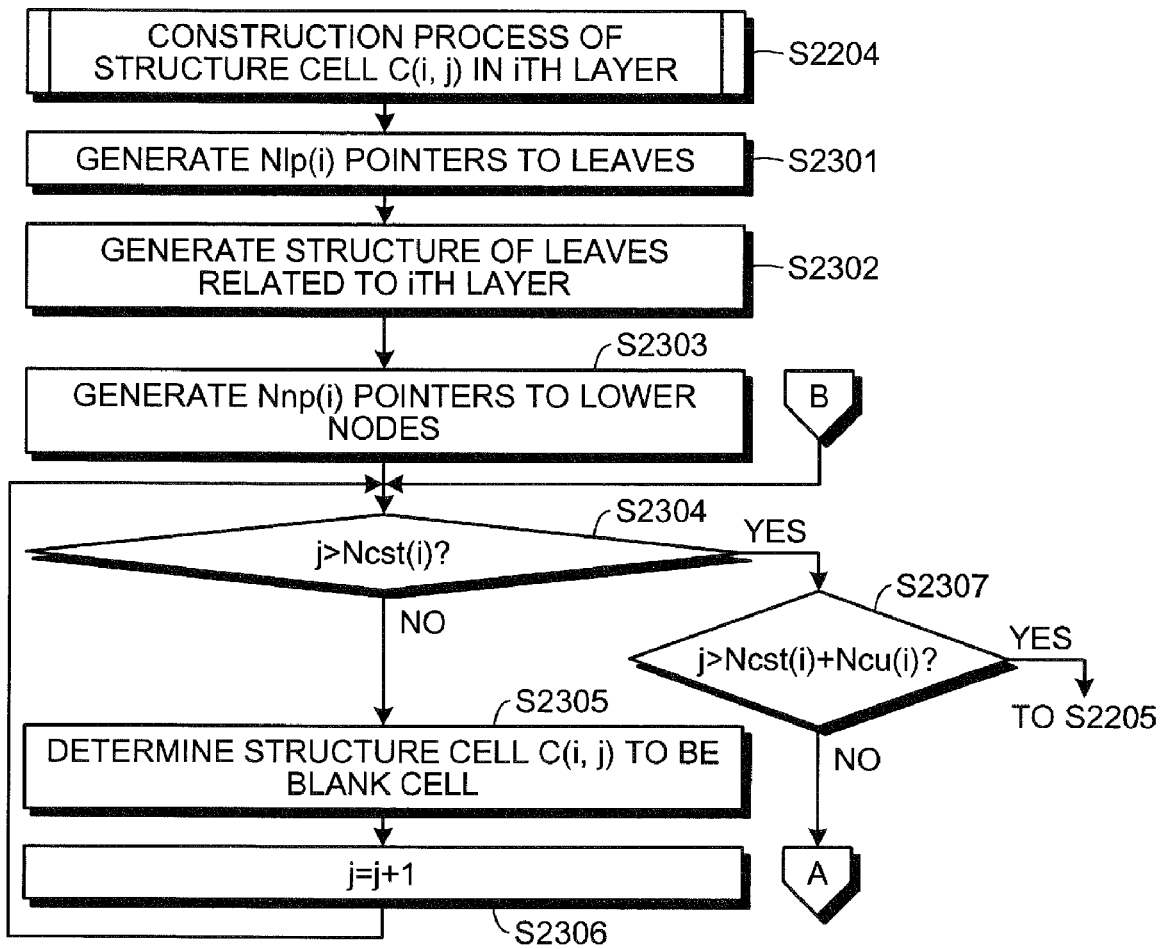
FIG. 23 is a flowchart (first half) of a constructing process of the structure cell C(i, j) in the ith layer depicted in FIG. 22 (step S2204)

FIG. 23 is a flowchart (first half) of the constructing process of the structure cell C(i, j) in the ith layer depicted in FIG. 22 (step S2204). Nlp(i) pointers to the leaves L# are generated (step S2301) and the structure of the leaves L# related to the ith layer is generated (step S2302). Nnp(i) pointers to the lower nodes are generated (step S2303). Thereafter, it is determined whether the cell number j is j>Ncst(i) with respect to the quantity of blank cells from the head Ncst(i) (step S2304).

When j is not j>Ncst(i) (step S2304: NO), the structure cell C(i, j) is determined to be a blank cell (step S2305). "j" is incremented by one point (step S2306) and the procedure returns to step S2304. On the other hand, when j is j>Ncst(i) (step S2304: YES), it is determined whether j is j>Ncst(i)+Ncu(i) (step S2307). "Ncu(i)" is the number of times the structure cell is used in the ith layer.

When j is j>Ncst(i)+Ncu(i) (step S2307: YES), the procedure moves to step S2205. On the other hand, when j is not j>Ncst(i)+Ncu(i) (step S2307: NO), the procedure moves to step S2401.

Figure 24:
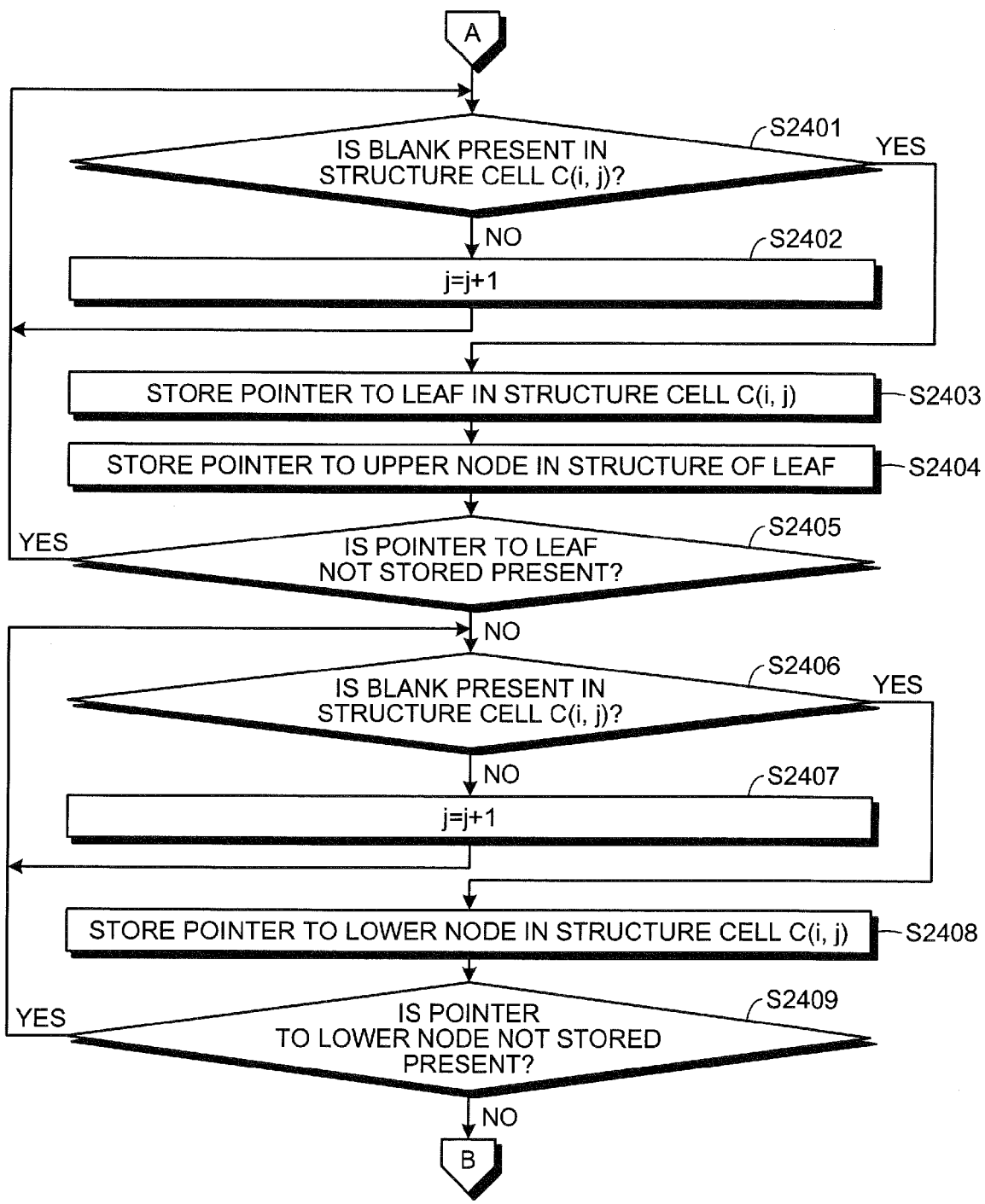
FIG. 24 is a flowchart (second half) of the constructing process of the structure cell C(i, j) in the ith layer depicted in FIG. 22 (step S2204)

FIG. 24 is a flowchart (second half) of the constructing process of the structure cell C(i, j) in the ith layer depicted in FIG. 22 (step S2204). At step S2401, it is determined whether any blank is present in the structure cell C(i, j) (step S2401). When no blank is present therein (step S2401: NO), j is incremented by one point (step S2402) and the procedure returns to step S2401.

On the other hand, when a blank is present therein (step S2401: YES), the pointers to the leaves L# are stored in the structure cell C(i, j) in ascending order of leaf number # (step S2403). Pointers to the upper node C(i−1, j) are generated and stored in the structure of the leaf L# that is the link destination, based on the pointers of the leaves L# that are stored (step S2404).

It is determined whether a pointer is present that points to the leaf L# and is not stored (step S2405). When a pointer is present that points to the leaf L# and is not stored, (step S2405: YES), the procedure returns to step S2401. On the other hand, when no pointer is present that points to the leaf L# and is not stored (step S2405: NO), it is determined whether any blank is present in the structure cell C(i, j) (step S2406). When no blank is present therein (step S2406: NO), j is incremented by one point (step S2407) and the procedure returns to step S2406.

On the other hand, when a blank is present in the structure cell C(i, j) (step S2406: YES), the pointers to the lower nodes are stored in the structure cell C(i, j) in ascending order of node number (step S2408). It is determined whether a pointer is present that points to the lower node and is not stored (step S2409). When a pointer is present that points to the lower node and is not stored (step S2409: YES), the procedure returns to step S2406. On the other hand, when no pointer is present that points to the lower node and is not stored (step S2409: NO), the procedure returns to step S2304 of FIG. 23.

Figure 25:
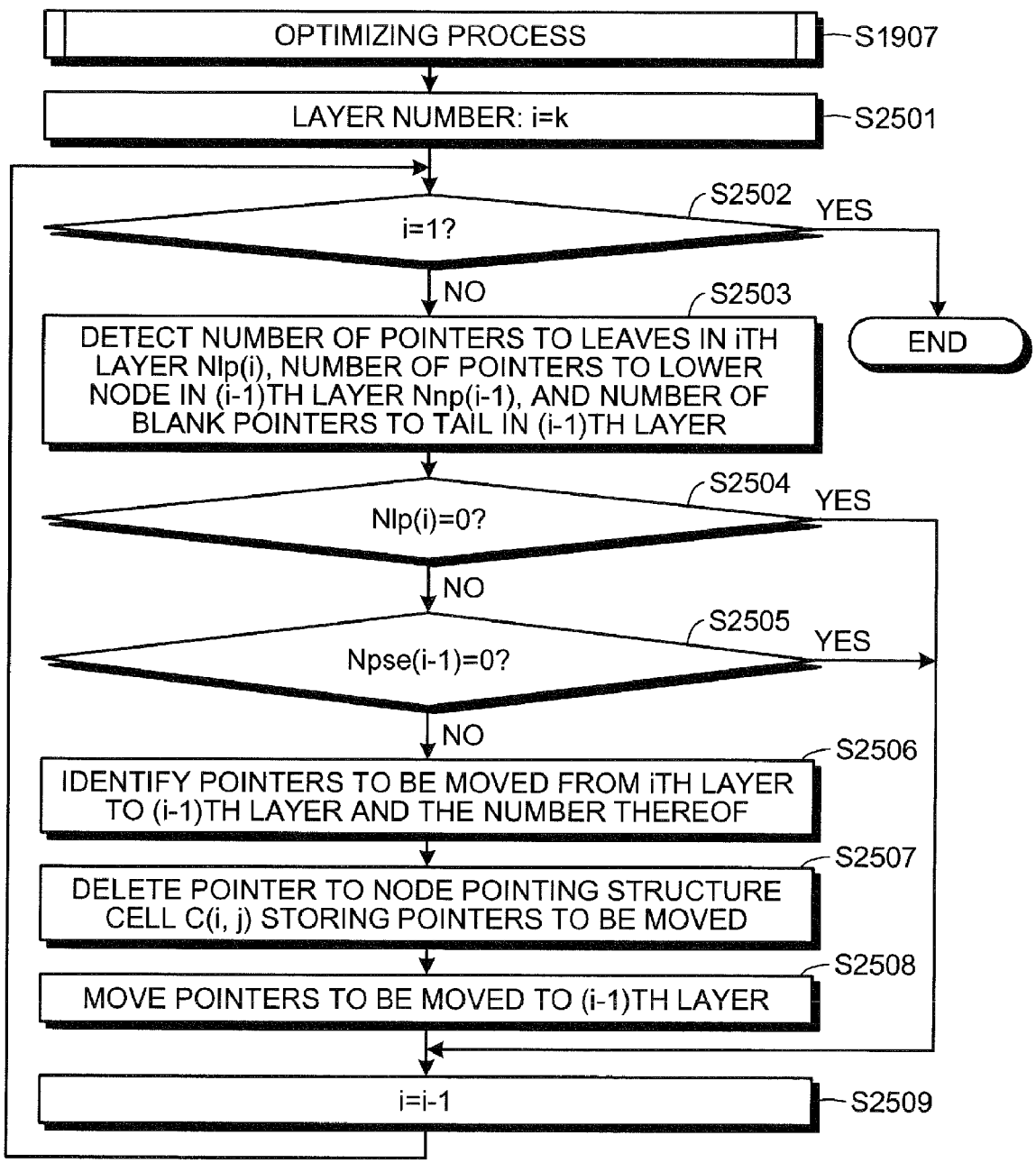
FIG. 25 is a flowchart of an optimizing process depicted in FIG. 19 (step S1907)

FIG. 25 is a flowchart of the optimizing process depicted in FIG. 19 (step S1907). The layer number i is set to be i=k (step S2501) and it is determined whether i is i=1 (step S2502). When i is not i=1 (step S2502: NO), the detecting unit 512 detects the quantity of pointers pointing to the leaves L# in the ith layer Nlp(i), the quantity of pointers pointing to the lower nodes in the (i−1)th layer Nnp(i−1), and the quantity of blank pointers up to the tail in the (i−1)th layer Npse(i−1), from the calculation result table 520 (step S2503).

It is determined whether Nlp(i) is Nlp(i)=0 (step S2504). When Nlp(i) is Nlp(i)=0 (step S2504: YES), no pointer to the leaf L#, to be moved is present and, therefore, the procedure moves to step S2509. On the other hand, when Nlp(i) is not Nlp(i)=0 (step S2504: NO), it is determined whether Npse(i−1) is Npse(i−1)=0 (step S2505). When Npse(i−1) is Npse(i−1)=0 (step S2505: YES), no blank is present and, therefore, the procedure moves to step S2509.

On the other hand, when Npse(i−1) is not Npse(i−1)=0 (step S2505: NO), the identifying unit 513 identifies pointers to the leaves L#, to be moved from the ith layer to the (i−1)th layer (pointers to be moved) and the quantity thereof, using the above Expression (6) (step S2506).

The pointers to the lower nodes C(i, j) in the (i−1)th layer pointing to the structure cell C(i, j) storing therein the pointers to be moved are deleted from the (i−1)th layer (step S2507). The pointers to be moved are moved to the (i−1)th layer and are stored such that the numbers # of the leaves L# are sequential (step S2508). Thereafter, at step S2509, the layer number i is incremented by one point (step S2509) and the procedure returns to step S2502. When the layer number i is i=1 at step S2502 (step S2502: YES), a series of the process comes to an end. Thereby, the series of description steps of the $2^n$-branching Huffman tree generating process procedure that the information processing apparatus 500 automatically executes come to an end.

The compressing process and the decompressing process using the $2^n$-branching Huffman tree H1 will be described. In this example, the $2^n$-branching Huffman tree H1 automatically generated by the above generating process may be used or a $2^n$-branching Huffman tree H1 provided in advance may be used.

The node-less Huffman tree will be described. The "node-less Huffman tree" is a Huffman tree that is constituted of only a root and leaves and that has no internal node. Although the node-less Huffman tree has many branches, a leaf is accessible from the root through one path.

Figure 26:
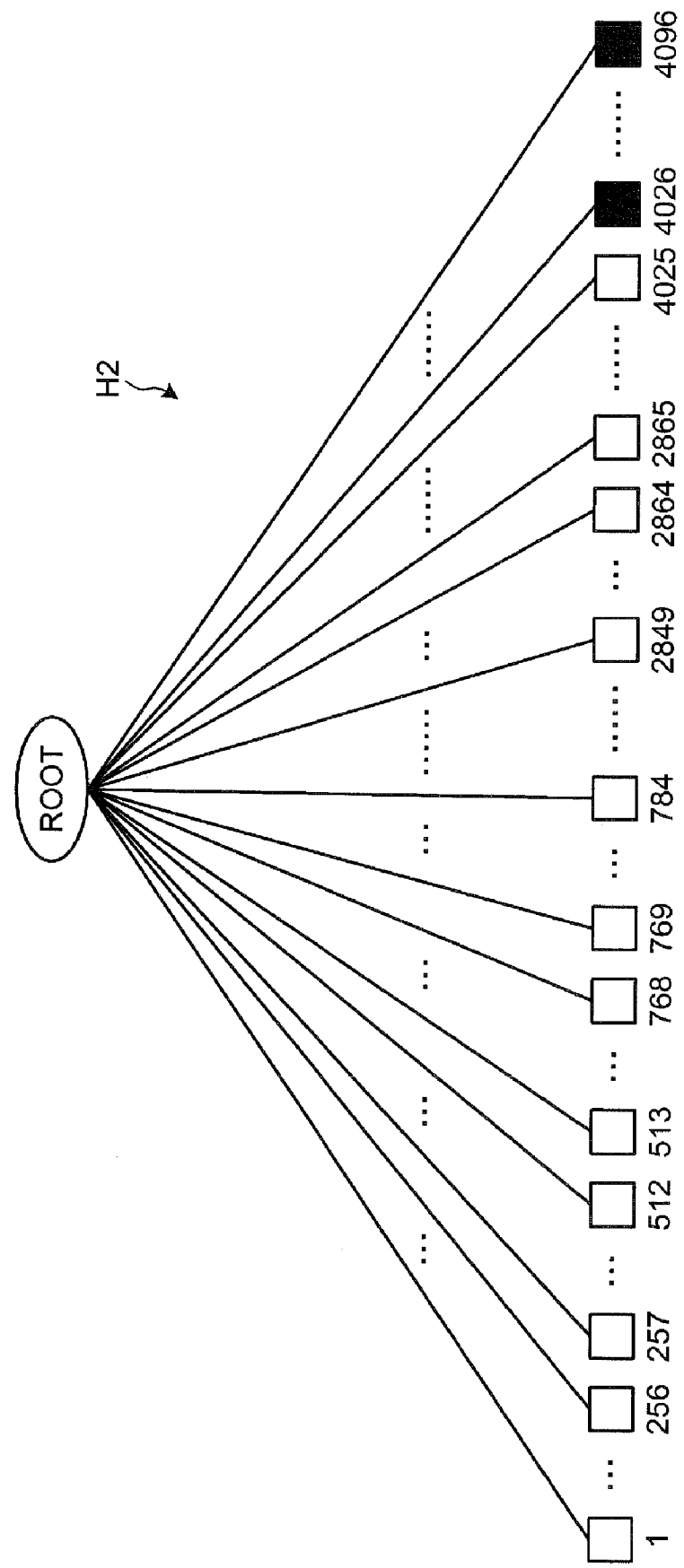
FIG. 26 is an explanatory diagram of a $2^m$-branching node-less Huffman tree.

FIG. 26 is an explanatory diagram of a $2^m$-branching node-less Huffman tree. In the $2^m$ (m=12)-branching node-less Huffman tree H2, the branch number that is a pointer from the root to a leaf is an m-bit code address. That is, pointers to the leaves having leaf numbers 1 to 4096 are "000000000000" to "111111111111". 16-bit character codes are compressed to 12-bit codes or shorter. "m" is a value that is $m<2^n$ and, for example, a value that is the largest multiple of four of the values satisfying this inequality is used. "m" is set in advance corresponding to "n". For example, when n is n=4, m is set to be m=12.

Figure 27:
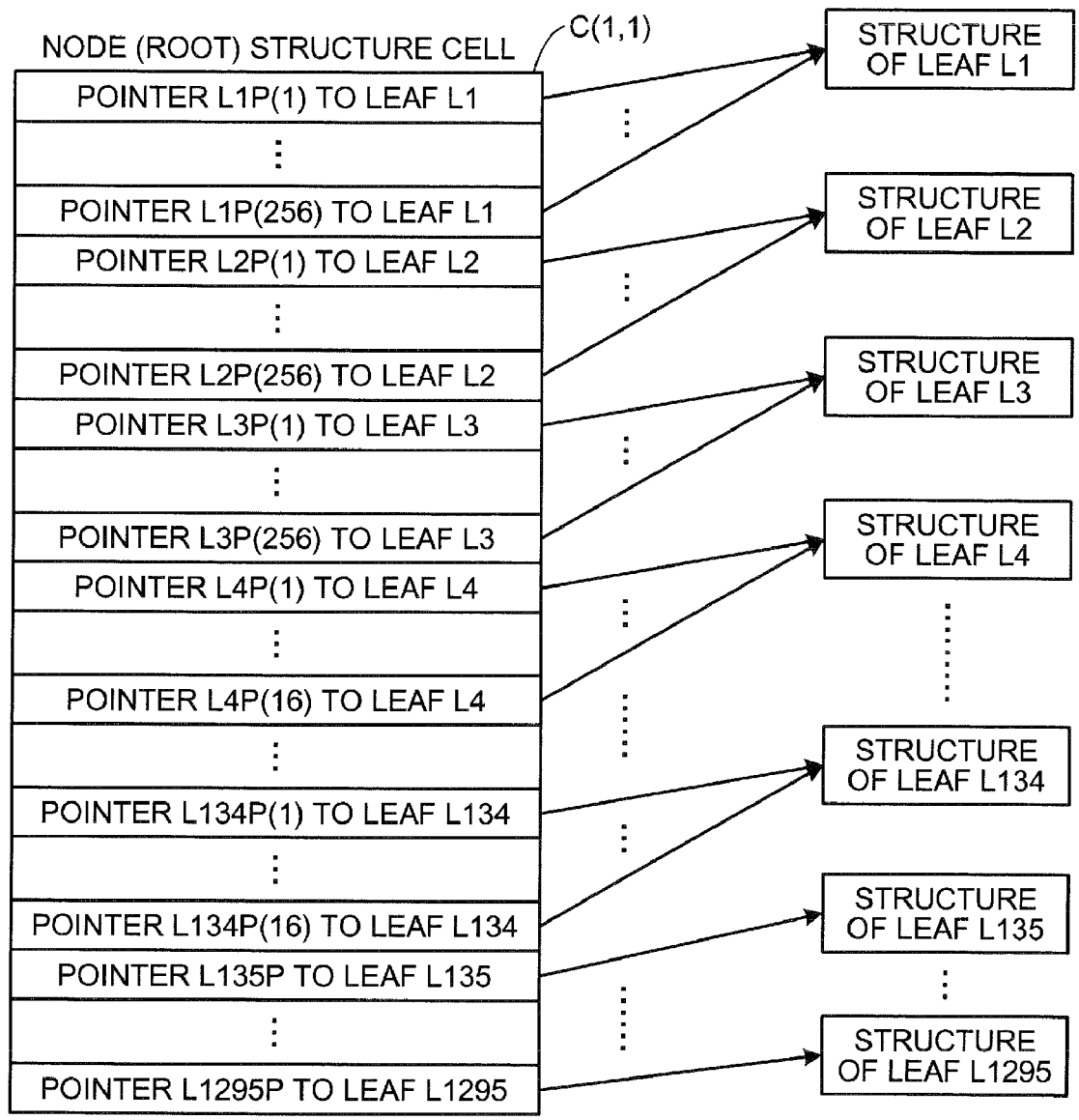
FIG. 27 is an explanatory diagram of a structure of a node (root) of the $2^m$-branching node-less Huffman tree.

FIG. 27 is an explanatory diagram of the structure of a node (root) of the $2^m$-branching node-less Huffman tree H2. Similarly to the above $2^n$-branching Huffman tree H1, assuming that the total quantity of leaves is 1295, the leaves are excessive. Therefore, pointers (for example, 256) are prepared for the leaves that store therein character codes having high appearance frequencies.

As depicted in FIG. 27, 256 pointers to leaves are allocated to each of the leaves L1 to L3 in the first layer of the $2^n$-branching Huffman tree H1 that have high appearance frequencies, and are stored in the structure cell C(1, 1) of the root. Similarly, 16 pointers to leaves are allocated to each of the leaves L4 to L134 in the second layer that have high appearance frequencies, and are stored in the structure cell C(1, 1) of the root. One pointer to a leaf is allocated to each of the leaves L135 to L1295 in the third layer, and is stored in the structure cell C(1, 1) of the root.

Figure 28:
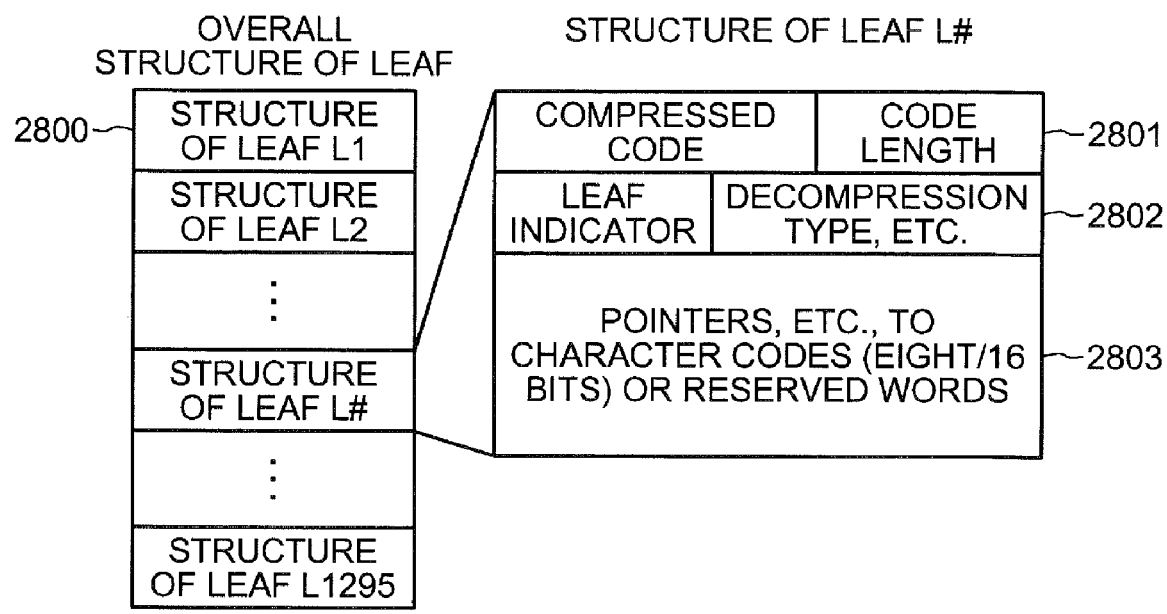
FIG. 28 is an explanatory diagram of a structure of a leaf of the node-less Huffman tree.

FIG. 28 is an explanatory diagram of the structure of a leaf of the node-less Huffman tree H2. The entirety of the leaf has a first to third areas 2801 to 2803. The first area 2801 stores therein compressed codes and corresponding compressed code lengths. The second area 2802 stores therein leaf indicators and decompression types. The third area 2803 stores therein pointers to upper 16-bit character codes, lower divided eight-bit character codes, or the reserved words corresponding to the decompression type.

FIG. 29 is an explanatory diagram of information stored in the structure of a leaf L#. Each record corresponds to the structure of the leaf l#. The structure of each leaf L# includes information on compressed codes and corresponding compressed code lengths, the indicator of the leaf, the decompression type, and pointers to character codes (16/eight bits) or the reserved words.

The node-less Huffman tree H2 may be generated by conversion from the $2^n$-branching Huffman tree H1. More specifically, for example, the $2^m$ (m=n×k)-branching node-less Huffman tree H2 may be generated from the $2^n$-branching Huffman tree H1. A functional configuration for conversion to the $2^m$-branching node-less Huffman tree H2 will be described.

Figure 30:
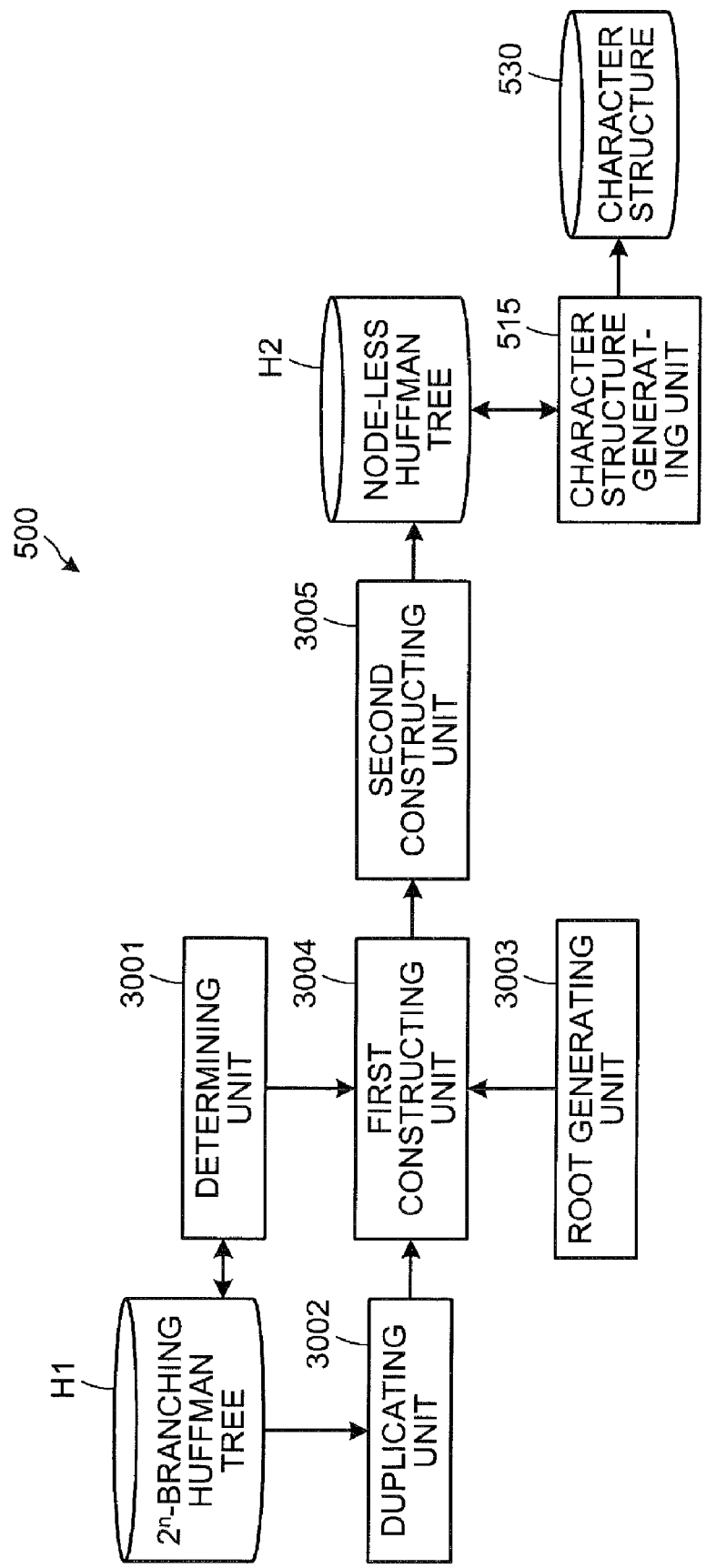
FIG. 30 is a block diagram of a second functional configuration of the information processing apparatus according to the embodiment.

FIG. 30 is a block diagram of a second functional configuration of the information processing apparatus 500 according to the embodiment. The components identical to those depicted in FIG. 5 are given the same reference numerals used in FIG. 5 and the description therefor is omitted. As depicted in FIG. 30, the information processing apparatus 500 includes a determining unit 3001, a duplicating unit 3002, a root generating unit 3003, a first constructing unit 3004, a second constructing unit 3005, and a character structure generating unit 515. The components from the determining unit 3001 to the second constructing unit 3005 realize respective functions by causing the CPU 401 to execute a program stored in a storing medium such as the RAM 403, the magnetic disk 405, or the optical disk 407 depicted in FIG. 4, or by the I/F 409.

The determining unit 3001 has a function of determining the quantity of types of pointers to leaves for each leaf in the ith layer, based on the quantity of layers and the quantity of leaves in the ith layer of the $2^n$-branching Huffman tree H1. More specifically, for example, the CPU 401 sets in advance the quantity of types of the first layer to be 256, the quantity of types of the second layer to be 16, and the quantity of types in each of the third layer and the layers thereafter to be one. For example, in the above $2^n$-branching Huffman tree H1, the quantity of leaves in the first layer is three, the quantity of leaves in the second layer is 131, and the quantity of leaves in the third layer is 1161.

Therefore, the quantity of pointers of a leaf is 4025 (=3× 256+131×16+1,161×1) and is equal to or fewer than 4096 ($2^m$). Thereby, the quantity of types in the first layer is determined to be 256, the quantity of types in the second layer is determined to be 16, and the quantity of types in each of the third layer and the layers thereafter is determined to be one. When the quantity of types exceeds 4096, the quantity is optimized to be equal to or fewer than 4096 by determining the quantity of types in the first layer to be 16 or the quantity of types in the second layer to be one.

The duplicating unit 3002 has a function of duplicating a leaf of the $2^n$-branching Huffman tree H1. More specifically, for example, the CPU 401 copies the structure of the leaf L# and clears the pointers to upper node and compressed code lengths therein.

The root generating unit 3003 has a function of generating a root that can store therein $2^m$ pointers to leaves, and having the root stored in a storing unit 2610. More specifically, for example, when n=4, the root generating unit 3003 generates the structure of the root that has, m is m=12, that is, 4096 blank pointers.

The first constructing unit 3004 has a function of generating pointers to a leaf for each of the leaves duplicated by the duplicating unit 3002, based on the quantity of types determined by the determining unit 3001, and of storing in the root generated by the root generating unit 3003, the pointers generated. More specifically, for example, when it is determined that the first layer has 256 types, the first constructing unit 3004 generates pointers L1P(1) to L1p(256) to the leaf L1 for the leaf L1 concerning the first layer, and has the pointers L1P(1) to L1P(256) to the leaf L1 stored in the structure of the root.

When it is determined that the second layer has 16 types, the first constructing unit 3004 generates pointers L4P(1) to L4p(16) to the leaf L4 for the leaf L4 concerning the second layer, and has the pointers L4P(1) to L4P(16) to the leaf L4 stored in the structure of the root. When it is determined that the third layer has one type, the first constructing unit 3004 generates a pointer L135P(1) to the leaf L135 for the leaf L135 concerning the third layer, and stores in the structure of the root, the pointer L135P(1) to the leaf L135.

The second constructing unit 3005 has a function of reconstructing a leaf by extracting a compressed code constituted of a bit string that is common to a group of pointers to a leaf for the leaf and of storing in the leaf, the compressed code and the corresponding compressed code length and, thereby, generates the node-less Huffman tree H2 constituted of a root and leaves. More specifically, for example, when, for an arbitrary leaf L#, plural types of pointers to the leaf L# are generated, a bit string that is common to these pointers is identified as a compressed code. The compressed code length of the code is also obtained. The compressed code and the compressed code length are stored in the structure of the leaf L#.

For example, for the leaf L1, the bit string is as follows assuming that the 256 types of pointers to the leaf L1 L1P(1) to L1p(256) are generated.

Pointer L1P(1):000000000000

Pointer L1P(2):000000000001

Pointer L1P(3):000000000010

Pointer L1P(4):000000000011,

Pointer L1P(256):000011111111

The upper four bits of "0000" is a common bit string for the pointers L1P(1) to L1p(256) and, therefore, the upper four bits "0000" are identified as the compressed code of the structure of the leaf L1. The compressed code length of the code is four bits and, therefore, together with the compressed code "0000", the length is stored in the structure of the leaf L1.

For the leaf L4, the bit string is as follows assuming that 16 types of pointers to the leaf L4, L4P(1) to L4P(16), are generated.

Pointer L1P(1):001100000000

Pointer L1P(2):001100000001

Pointer L1P(3):001100000010

Pointer L1P(4):001100000011,

Pointer L1P(16):001100001111

The upper eight-bits of "00110000" is a common bit string for the pointers L4P(1) to L4p(16) and, therefore, the upper eight-bits "00110000" are identified as the compressed code of the structure of the leaf L4. The compressed code length of the code is eight bits and, therefore, together with the compressed code "00110000", the length is stored in the structure of the leaf L4.

For the leaf L135, the bit string is as follows assuming that 1 type of pointer to the leaf L135, L135P(1), is generated.

Pointer L135P(16):101000100000

The pointer L135P(1) is only of one type and, therefore, this 12-bit string "101000100000" is identified as the compressed code of the structure of the leaf L135. The compressed code length of the code is 12 bits and, therefore, is stored in the structure of the leaf L135 together with the compressed code "101000100000". As described above, the node-less Huffman tree H2 is generated.

The character structure generating unit 515 re-generates (updates) the character structure 530 by referring to the newly constructed node-less Huffman tree H2. That is, in the reserved word structure 1600, the higher character code structure 1700, and the divided character code structure 1800, the pointers to leaves newly generated are stored as the pointers to leaves.

Figure 31:
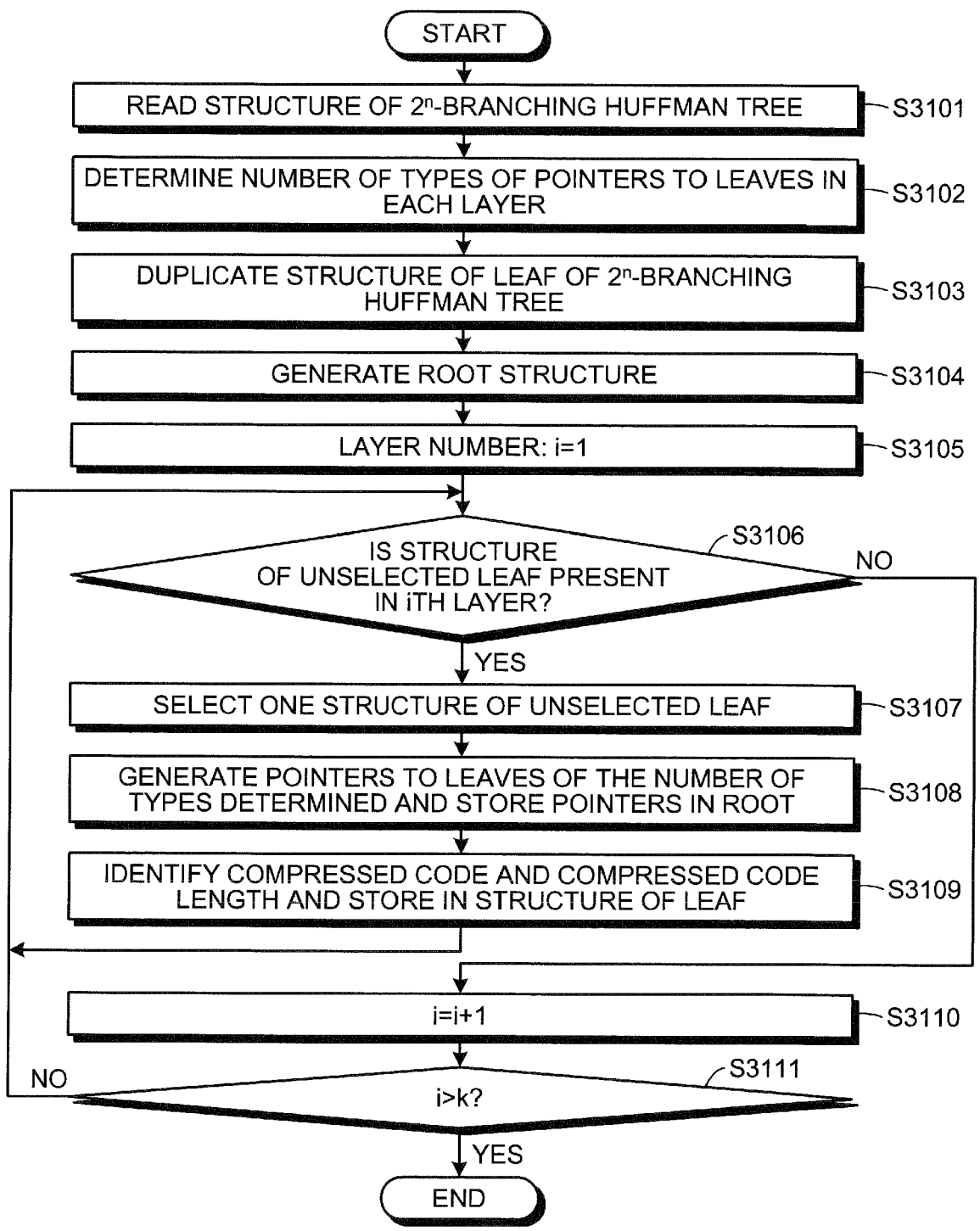
FIG. 31 is a flowchart of a converting process automatically executed by the information processing apparatus to convert the $2^n$-branching Huffman tree H1 to the $2^m$-branching node-less Huffman tree.

FIG. 31 is a flowchart of a converting process to convert the $2^n$-branching Huffman tree H1 to the $2^m$-branching node-less Huffman tree. The converting process is automatically executed by the information processing apparatus 500. As depicted in FIG. 31, the structure of the $2^n$-branching Huffman tree H1 is read (step S3101) and the determining unit 3001 determines the quantity of types of pointers to leaves for each layer (step S3102).

The duplicating unit 3002 duplicates the structure of the leaf L# of the $2^n$-branching Huffman tree H1 (step S3103) and the root generating unit 3003 generates the structure of the root (step S3104). The layer number i is set to be i=1 (step S3105) and it is determined whether the structures of unselected leaves L# in the ith layer are present (step S3106).

When the structures of the unselected leaves L# are present (step S3106: YES), one of the structures of the unselected leaves L# is selected (step S3107) and the pointers to the leaves of the quantity of the types determined are generated and are stored in the structure of the root (step S3108). A compressed code and the compressed code length of the code are identified from the pointers to the leaves of the quantity of the types and are stored in the structure of the leaf (step S3109). Thereafter, the procedure returns to step S3106.

On the other hand, at step S3106, when no structures of the unselected leaves L# are present (step S3106: NO), the layer number i is incremented by one point (step S3110) and it is determined whether i is i>k for the layer number k of the $2^n$-branching Huffman tree H1 (step S3111). When i is not i>k (step S3111: NO), the procedure returns to step S3106. On the other hand, when i is i>k (step S3111: YES), a series of converting process comes to an end.

In this manner, by converting the $2^n$-branching Huffman tree H1 into the node-less Huffman tree H2, the node-less Huffman tree H2 is used in the compression and the decompression. By using the node-less Huffman tree H2 in the compression and the decompression, improvement of the compression rate and improvement of the search speed may be facilitated compared to the $2^n$-branching Huffman tree H1.

Compression and decompression using the $2^m$-branching node-less Huffman tree H2 will be described. In the $2^m$-branching node-less Huffman tree H2, any leaf is accessible through one path and, therefore, an increase of the search speed may be facilitated. A functional configuration therefor will be described.

Figure 32:
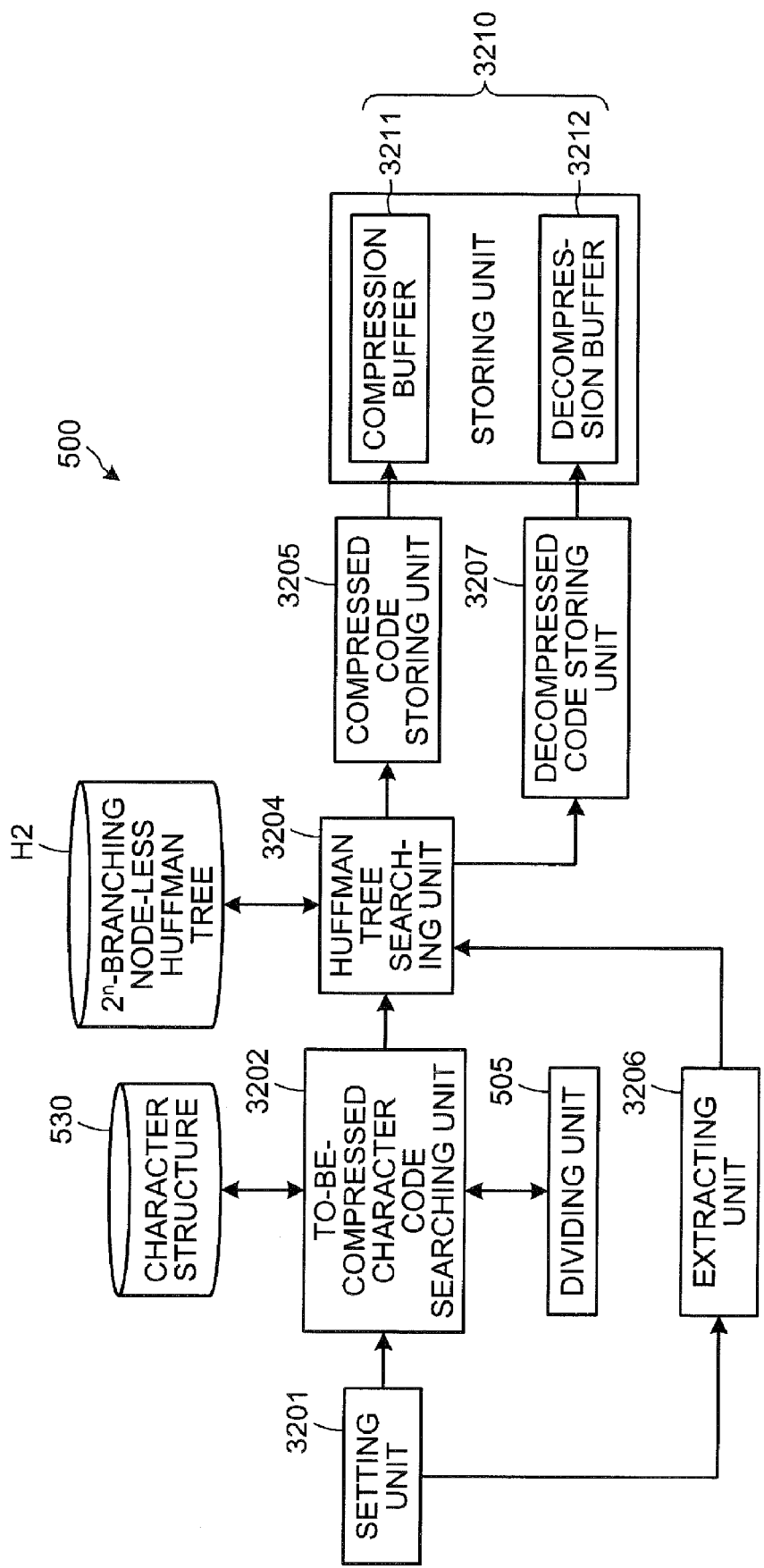
FIG. 32 is a block diagram of a third functional configuration of the information processing apparatus according to the embodiment.

FIG. 32 is a block diagram of a third functional configuration of the information processing apparatus 500 according to the embodiment. Components identical to those depicted in FIG. 5 are given the same reference numerals used in FIG. 5 and the description therefor is omitted. In FIG. 32, the information processing apparatus 500 includes the dividing unit 505, a setting unit 3201, a to-be-compress character code searching unit 3202, a Huffman tree searching unit 3204, a compressed code storing unit 3205, an extracting unit 3206, a decompressed code storing unit 3207, and a storing unit 3210.

The components from the setting unit 3201 to the decompressed code storing unit 3207 realize respective functions by causing the CPU 401 to execute a program stored in a storing medium such as the RAM 403, the magnetic disk 405, or the optical disk 407 depicted in FIG. 4, or by the I/F 409. The storing unit 3210 realizes a function thereof by a storing medium such as the RAM 403, the magnetic disk 405, or the optical disk 407 depicted in FIG. 4.

The setting unit 3201 has a function of setting the character codes to be compressed when the compressing process is executed, and also has a function of setting compressed code strings when the decompressing process is executed. More specifically, for example, the CPU 401 writes the character codes to be compressed and compressed code strings that are input, into the internal register or an external buffer.

FIG. 33 is an explanatory diagram of exemplary character code strings to be compressed. In this case, a character string "次の兎は" is taken as a character string to be compressed and its character code string is depicted. "兎" is represented by a lower character code and, therefore, this code is divided into upper eight-bits and lower eight-bits.

FIG. 34 is an explanatory diagram of an exemplary compressed code string. In this case, the compressed code string of the character string "次の兎は" is depicted. "兎" is divided into the upper eight-bits and the lower eight-bits and, therefore, the compressed codes are allocated to the divided character codes.

The to-be-compressed character code searching unit 3202 has a function of searching the higher character code group for the character code to be compressed set by the setting unit 3201. More specifically, for example, the CPU 401 searches for the character code to be compressed set in the register by scanning the character structure 530, i.e., the reserved word structure 1600 and the higher character code structure 1700.

When no coinciding character code is found in the reserved word structure 1600 and the higher character code structure 1700, the CPU 401 divides the character code to be compressed into upper bits and lower bits using the dividing unit 505 and searches by scanning the divided character code structure 1800 for each divided character code.

The Huffman tree searching unit 3204 has a function of searching for compressed codes of Character Codes, etc., using pointers to leaves L# correlated with the Character Codes, etc. More specifically, for example, the CPU 401 reads the pointers to leaves L# correlated with the coinciding Character Codes, etc. from the character structure 530 and identifies the structures of the leaves L#. The CPU 401 extracts the compressed codes of the character codes stored in the structure of the leaf L# pointed at.

For example, describing with reference to FIG. 26, when the character code corresponding to the leaf L256 is searched for as the higher character code, the CPU 401 reads the pointer to the leaf L256 from the higher character code structure 1700 and accesses the leaf L256. The CPU 401 extracts, from the structure of the leaf L256, the compressed code of the character code stored therein.

The compressed code storing unit 3205 has a function of storing in a predetermined storing area, the compressed code retrieved by the Huffman tree searching unit 3204. More specifically, for example, the CPU 401 writes the compressed code retrieved into a compression buffer 3211.

The extracting unit 3206 has a function of detecting the border between the compressed codes of the compressed code string set by the setting unit 3201 and of extracting the code to be decompressed from the border, from the compressed code string. Although a detailed extracting approach will be described later, the extracting unit 3206 may extract even the compressed code strings that have different compressed code lengths, for each compressed code.

The decompressed code storing unit 3207 has a function of storing in a predetermined storing area, the decompressed code retrieved by the Huffman tree searching unit 3204. More specifically, for example, the CPU 401 writes the decompressed code into a decompression buffer 3212. The decompressed code written in the decompression buffer 3212 is drawn as characters by an existing technique.

The compressing process using the $2^m$-branching node-less Huffman tree H2 will be described. In the compressing process using the $2^m$-branching node-less Huffman tree H2, no internal node is present and, therefore, a search toward the root need not be executed during the Huffman tree search. Therefore, the character code stored in the structure of the leaf L# pointed at is extracted and is written into the compression buffer 3211. Thereby, an increase of the speed of the compressing process may be facilitated.

Figure 35:
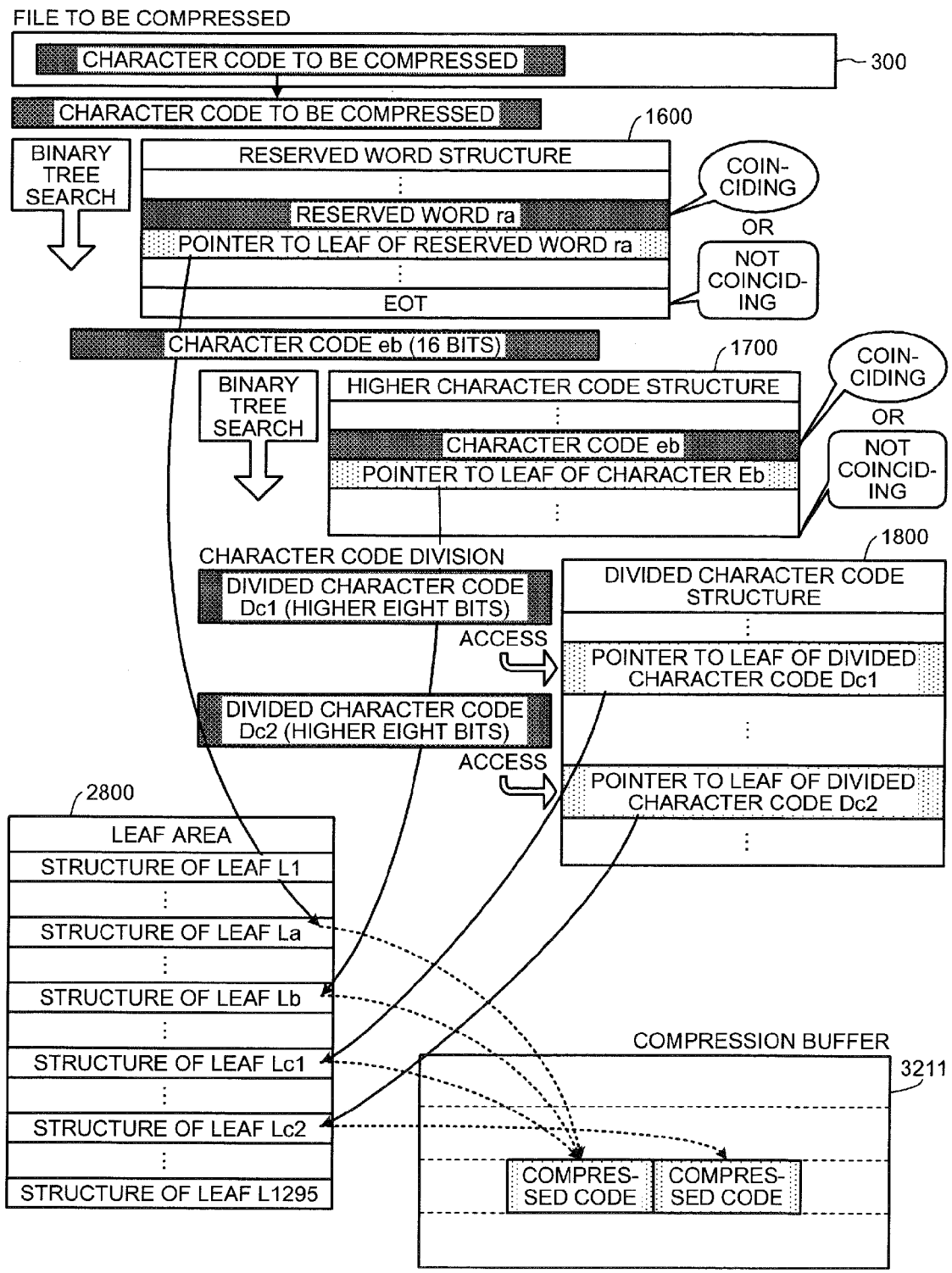
FIG. 35 is an explanatory diagram of an example of a compressing process that uses the $2^m$-branching node-less Huffman tree.

FIG. 35 is an explanatory diagram of an example of the compressing process that uses the $2^m$-branching node-less Huffman tree H2. The character code to be compressed for the first character is obtained from the file 300 to be compressed and the position in the file 300 to be compressed is retained. A binary tree search is executed in the reserved word structure 1600. A reserved word is a character code string of two or more characters and, therefore, when the character code to be compressed of the first character is hit, the character code of the second character is obtained as the character code to be compressed.

The character code of the second character is search for starting at the position at which the character code to be compressed of the first character is hit. The binary tree search for the third character and the characters thereafter is repeatedly executed until any non-coinciding character code to be compressed appears. When a coinciding reserved word "ra" (whose "a" represents the leaf number) is retrieved, the structure of the leaf La is accessed by the pointer to the leaf La. The compressed code of the reserved word ra is retrieved using the above Huffman tree search and is stored in the compression buffer 3211.

On the other hand, when a non-coinciding compressed character code appears, the binary tree search in the reserved word structure 1600 is ended (and the procedure advances to end of transmission (EOT)). The character code to be compressed of the first character is again set in the register and a binary tree search in the higher character code structure 1700 is executed.

When a coinciding character code "eb" (whose "b" represents the leaf number) is retrieved, the pointer to a leaf Lb accesses the structure of the leaf Lb. The compressed code of the character code eb is retrieved using the above Huffman tree search and is stored in the compression buffer 3211.

On the other hand, when no coinciding character code appears and the binary tree search is ended, the character code to be compressed is not a higher character code and, therefore, the character code is divided into upper eight-bits and lower eight-bits. A binary tree search is executed in the divided character code structure 1800 for the upper-eight-bit divided character code. When a coinciding divided character code "Dc1" (whose "c1" represents the leaf number) is retrieved, the pointer to the leaf Lc1 accesses the structure of the leaf Lc1. The compressed code of the divided character code Dc1 is retrieved using the above Huffman tree search and is stored in the compression buffer 3211.

Following the above, a binary tree search is executed in the divided code structure 1800 for the lower-eight-bit divided character code. When a coinciding divided character code "Dc2" (whose "c2" represents the leaf number) is retrieved, the pointer to the leaf Lc2 accesses the structure of the leaf Lc2. The compressed code of the divided character code Dc2 is retrieved using the above Huffman tree search and is stored in the compression buffer 3211 consecutively after the compressed code of the divided character code Dc1.

Figure 36:
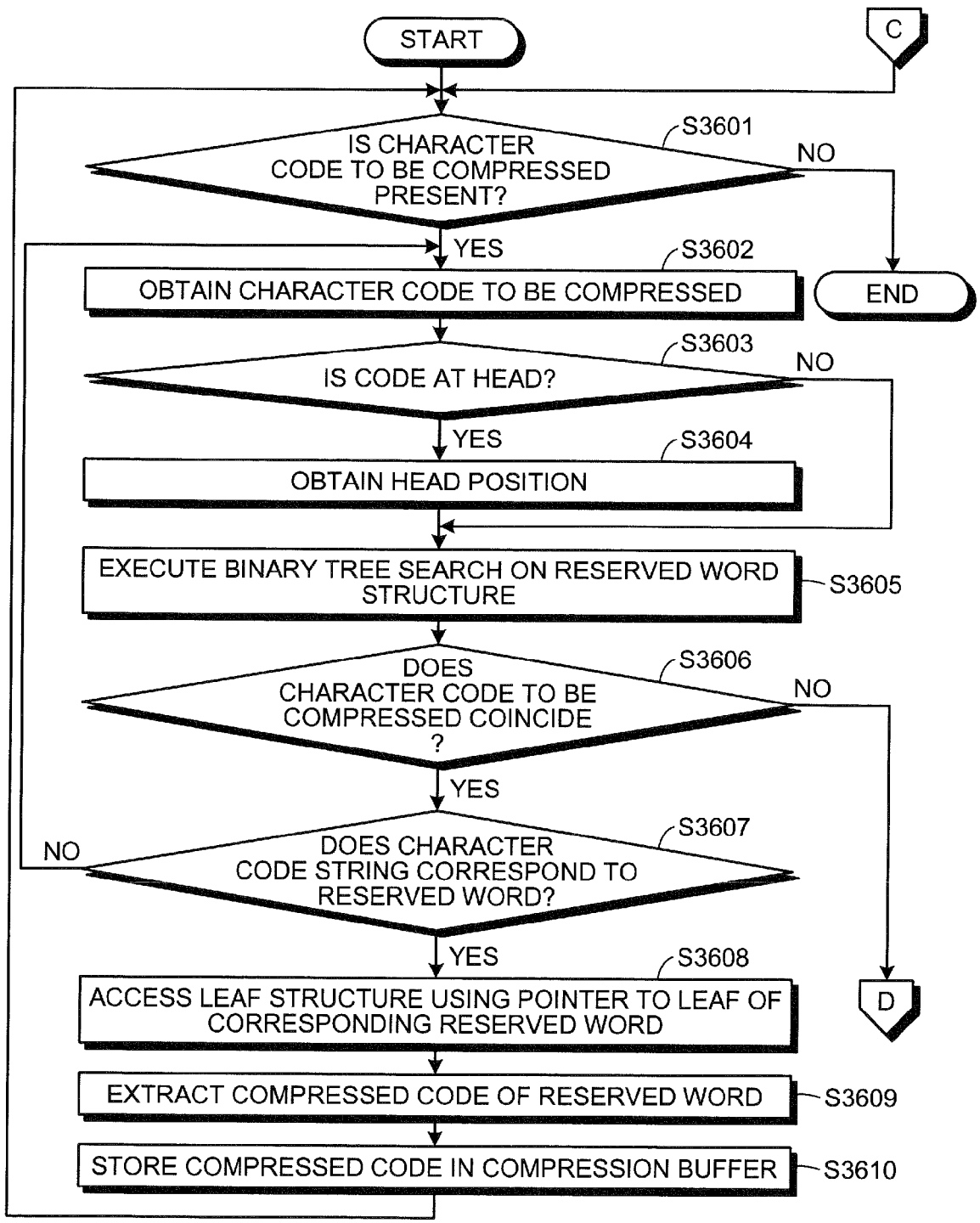
FIG. 36 is a flowchart (part I) of the compressing process that uses the $2^m$-branching node-less Huffman tree and is executed automatically by the information processing apparatus.

FIG. 36 is a flowchart (part I) of the compressing process that uses the $2^m$-branching node-less Huffman tree H2 and is executed automatically by the information processing apparatus 500. As depicted in FIG. 36, it is determined whether a character code to be compressed is present in the file 300 (step S3601). When a character code to be compressed is present (step S3601: YES), the character code to be compressed is obtained and is set in the register (step S302). It is determined whether the obtained code is the character code to be compressed at the head (step S3603).

The character code to be compressed at the head refers to the character code that is of the first character and not compressed. When the obtained code is at the head (step S3603: YES), a pointer that is the position (that is the position of the head) in the file 300 of the character code to be compressed is obtained (step S3604) and the procedure moves to step S3605. On the other hand, when the obtained code is not at the head (step S3603: NO), the position of the head is not obtained and the procedure moves to step S3605.

A binary tree search is executed in the reserved word structure 1600 (step S3605). When the character code to be compressed coincides (step S3606: YES), it is determined whether a character code string that continuously coincides corresponds to (a character code string of) a reserved word (step S3607). When the character string does not correspond to a reserved word (step S3607: NO), the procedure returns to step S3602 and a subsequent character code is obtained as the character code to be compressed. In this case, because the subsequent character code is not at the head, the position of the head is not obtained.

On the other hand, when the character string corresponds to a reserved word at step S3607 (step S3607: YES), by the pointer to a leaf L# of the corresponding reserved word the structure of the leaf L# is accessed (step S3608). The compressed code of the reserved word, stored in the structure of the leaf L# pointed at is extracted (step S3609).

Thereafter, the compressed code extracted is stored in the compression buffer 3211 (step S3610) and the procedure returns to step S3601. When no character code to be compressed is present at step S3601 (step S3601: NO), a series of process comes to an end. This loop is the flow of the compressing process of a reserved word. On the other hand, when no character code to be compressed coincides (step S3606: NO), the procedure enters the loop of the compressing process for a 16-bit character code.

Figure 37:
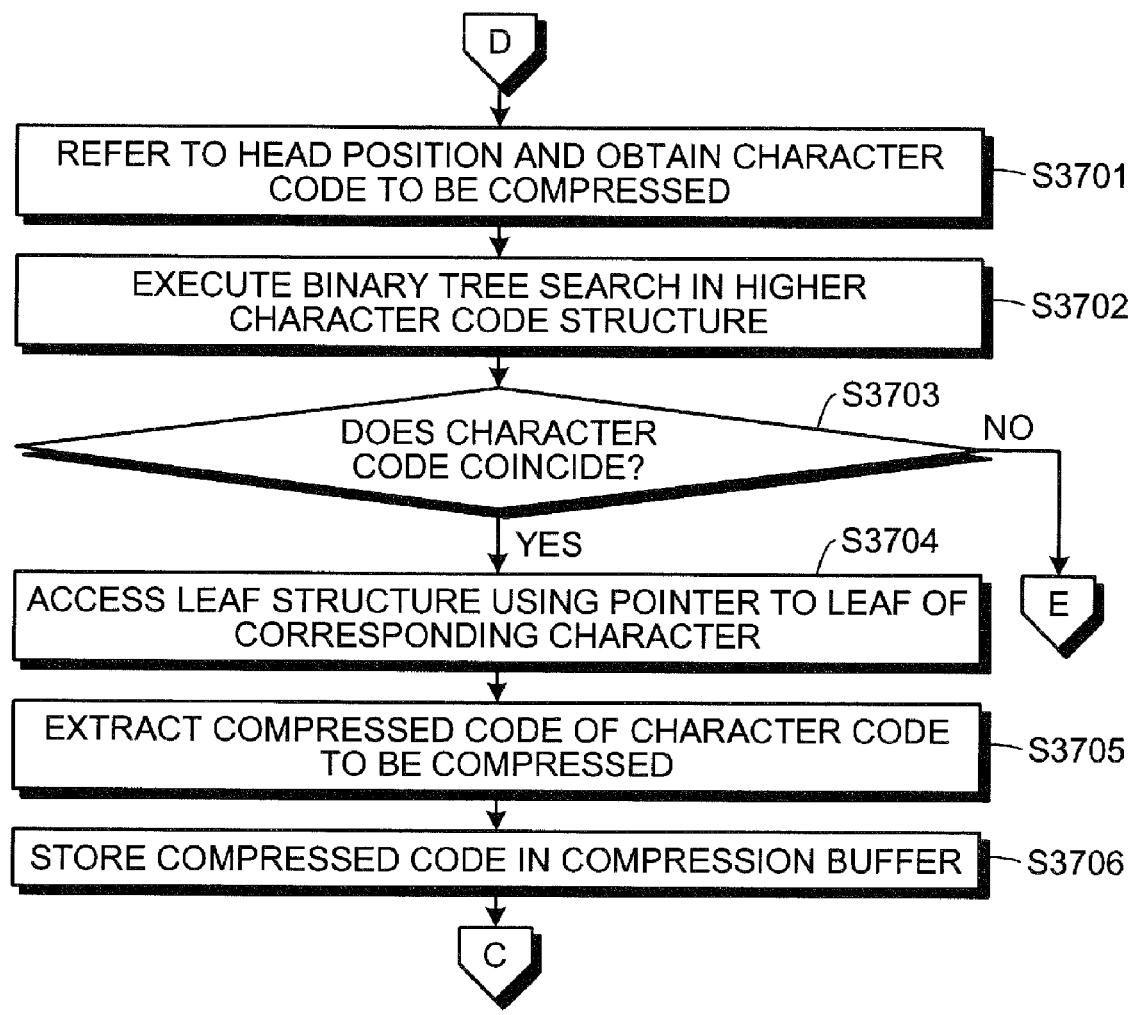
FIG. 37 is a flowchart (part II) of the compressing process that uses the $2^m$-branching node-less Huffman tree and is executed automatically by the information processing apparatus.

FIG. 37 is a flowchart (part II) of the compressing process that uses the $2^m$-branching node-less Huffman tree H2 and is executed automatically by the information processing apparatus 500. As depicted in FIG. 37, the pointer at the position that is the head obtained at step S3604 is referred to, and the character code to be compressed is obtained from the file 300 and is set in the register (step S3701).

A binary tree search is executed in the higher character code structure 1700 to retrieve the character code to be compressed (step S3702). When a coinciding character code is retrieved (step S3703: YES), by the pointer to a leaf L# of the corresponding character, the structure of the leaf L# is accessed (step S3704). The compressed code of the character code to be compressed stored in the structure of the leaf L# pointed at is extracted (step S3705).

Thereafter, the compressed code retrieved is stored in the compression buffer 3211 (step S3706) and the procedure returns to step S3601. This loop is the flow of the compression process of a 16-bit character code. On the other hand, when no coinciding character code is present at step S3703 (step S3703: NO), the procedure enters the loop of the compression process of a divided character code.

Figure 38:
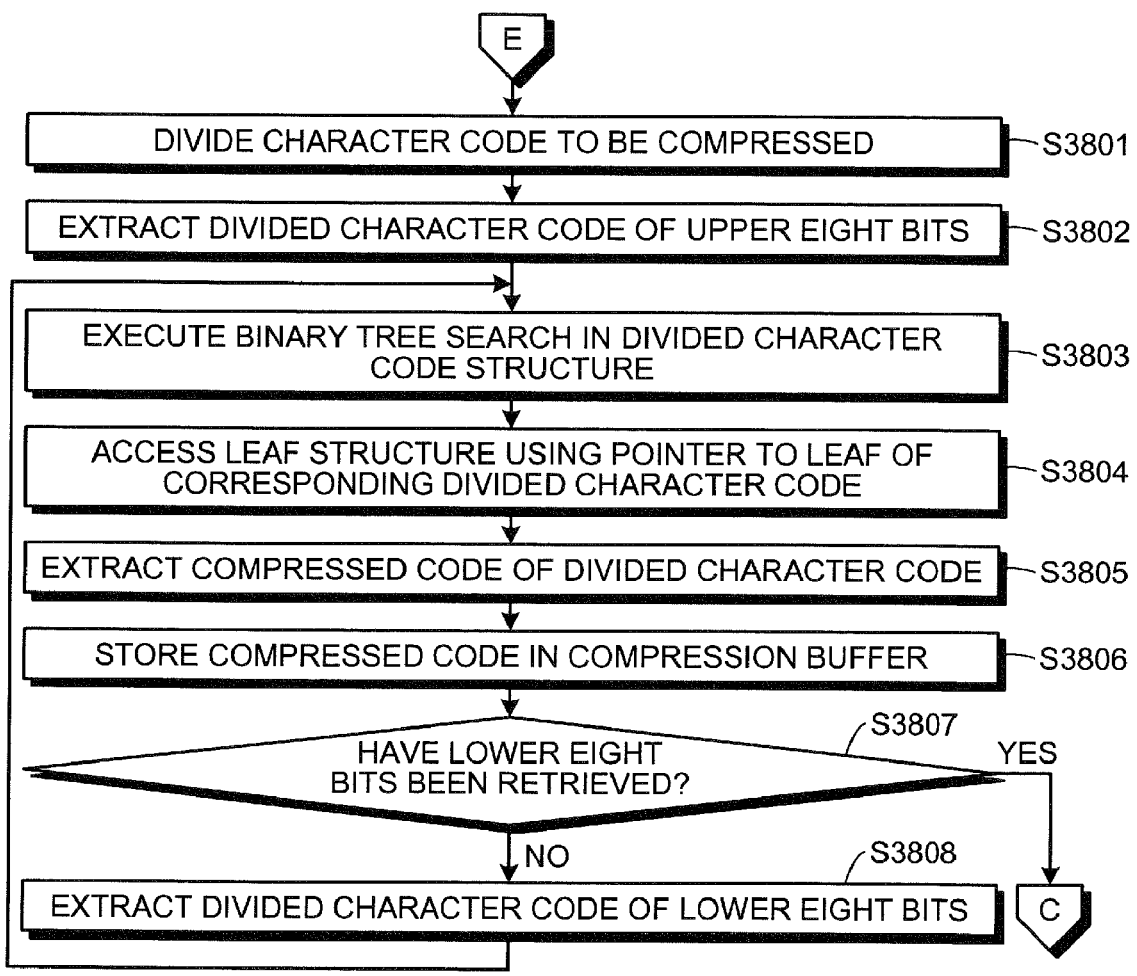
FIG. 38 is a flowchart (part III) of the compressing process procedure that uses the $2^m$-branching node-less Huffman tree and is executed automatically by the information processing apparatus 500.

FIG. 38 is a flowchart (part III) of the compressing process procedure that uses the $2^m$-branching node-less Huffman tree H2 and is executed automatically by the information processing apparatus 500. As depicted in FIG. 38, the character code to be compressed is divided into upper eight-bits and lower eight-bits (step S3801) and the upper-eight-bit divided character code is extracted (step S3802). A binary tree search is executed in the divided character code structure 1800 (step S3803).

By the pointer to a leaf L# of the divided character code retrieved, the structure of the leaf L# is accessed (step S3804). The compressed code of the divided character code stored in the structure of the leaf L# pointed is extracted (step S3805). Thereafter, the compressed code retrieved is stored in the compression buffer 3211 (step S3806).

It is determined whether the lower eight-bits have been retrieved (step S3807). When the bits have not been retrieved (step S3807: NO), the lower-eight-bit divided character code is extracted (step S3808) and steps S3803 to S3806 are executed. On the other hand, when the lower eight-bits have been retrieved (step S3807: YES), the procedure returns to step S3601 and the procedure enters the loop of the compressing process of a reserved word.

As described, in the compressing process using the $2^m$-branching node-less Huffman tree H2, because no internal node is present, a search toward the root need not be executed and the character code stored in the structure of the leaf L# pointed at only has to be extracted and written into the compression buffer 3211. Therefore, an increase of the speed of the compressing process may be facilitated.

The structure of the leaf L# that stores therein the character code to be compressed may immediately be identified using the reserved word structure 1600, the higher character code structure 1700, and the divided character code structure 1800. Therefore, the leaves of the $2^m$-branching node-less Huffman tree H2 need not be retrieved and an increase of the speed of the compressing process may be facilitated. Sixty-thousand or more types of lower character codes may be suppressed to at most 256 types of divided character code compressed codes by dividing the lower character codes into upper bit codes and the lower bit codes. Therefore, improvement of the compression rate may be facilitated.

FIGS. 39A to 39E are explanatory diagrams of examples of the decompressing process that uses the $2^m$-branching node-less Huffman tree H2. In FIGS. 39A to 39E, examples are depicted of decompressing the compressed code string depicted in FIG. 34. In the decompressing process, the compressed code string is set in the register and the compressed code is extracted using a mask pattern. The compressed code extracted is retrieved from the root of the $2^m$-branching node-less Huffman tree H2 through one path (an access that corresponds to one branch). The character code stored in the structure of the leaf L# accessed is read and is stored in the decompression buffer 3212.

A mask position of a mask pattern is offset to extract the compressed code. The initial value of the mask pattern is set to be "0xFFF00000". This mask pattern is a bit string whose 12 bits from the head each are "1" and the subsequent 20 bits each are "0".

The CPU 401 calculates a bit address "abi", a byte offset "byos", and a bit offset "bios". The bit address abi is a value that represents a bit position of the compressed code extracted and the bit address in this case is a value obtained by adding the bit address abi of the previous time and the compressed code length "leg" of the compressed code extracted the previous time. In the initial state, the bit address abi is abi=0.

The byte offset byos is a value that represents a byte border of the compressed code strings retained in the memory and is obtained as the quotient of the bit address abi/8. For example, when the byte offset byos is byos=0, the compressed code string from the head stored in the memory is set in the register and, when the byte offset byos is byos=1, the compressed code string from the first one byte stored in the memory is set in the register.

The bit offset bios is a value that offsets the mask position ("FFF") of the mask pattern and is the remainder of the bit address abi/8. For example, when the bit offset bios is bios=0, the mask position is not shifted and the mask pattern is "0xFFF00000". On the other hand, when the bit offset bios is bios=4, the mask position is shifted toward the tail by four bits and the mask pattern is "0x0FFF0000".

A register shift number "rs" is the quantity of bits by which the compressed code string in the register after AND calculation with the mask pattern is shifted toward the tail, and is obtained according to "rs=32−12−bios". Due to this shifting, the bit string of the m bits from the tail of the register after the shifting is extracted as the bit string to be decompressed. After the extraction of the bit string to be decompressed, the register is cleared.

It is assumed that, in FIGS. 39A to 39E, the memory retains the compressed code string depicted in FIG. 34. Blocks in the memory depicted in FIGS. 39A to 39E represent a one-byte bit string and the numeral in each of the blocks represents the byte position that is a byte border.

FIG. 39A depicts the initial state (state (A)). In (A), due to the bit address abi that is abi=0, the byte offset byos is byos=0 and the bit offset bios is bios=0. Due to the byte offset byos being byos=0, the compressed code string for four bytes from the head (hashed portion in FIG. 39A) of the compressed code string retained in the memory is set in the register.

Due to the bit offset bios being bios=0, the mask pattern is "0xFFF00000". Therefore, by calculating the logical product (AND) of the compressed code string set in the register and the mask pattern "0xFFF00000", the AND result is obtained.

Due to the bit offset bios being bios=0, the number of register shifts "rs" is rs=32−m−bios=32−12−0=20. Therefore, the AND result in the register is shifted by 20 bits toward the tail. Due to this shifting, "110001001100" is left in the register and, therefore, the 12 bits from the tail are extracted as the bit string to be decompressed. In this case, "110001001100" is extracted as the bit string to be decompressed. After this extraction, the register is cleared.

As depicted in FIG. 27, the structure cell C(1, 1) of the root of the node-less Huffman tree H2 stores therein the pointers to the leaves L1 to L1295. Therefore, a pointer to the leaf L# (the branch number) that coincides with the bit string to be decompressed "110001001100" extracted is retrieved in the structure cell C(1, 1) of the root of the node-less Huffman tree H2. In this case, the pointer coincides with one of the pointers in the group of pointers to the leaf L3421 and therefore, the corresponding pointer to the leaf L3421 is read and the structure of the leaf L3421 is accessed.

The structure of the leaf L3421 stores therein a character code "0x216B" (that corresponds to a character "次") and, therefore, the character code "0x216B" is extracted and is stored in the decompression buffer 3212. The structure of the leaf L3421 also stores therein the compressed code length "leg" (=12 bits) of the character code "0x216B" and, therefore, the compressed code length leg of the character code "0x216B" is also extracted. The bit address abi is updated using the compressed code length leg extracted. In this case, the bit address abi after the updating is abi=0+12=12.

Figure 39B:
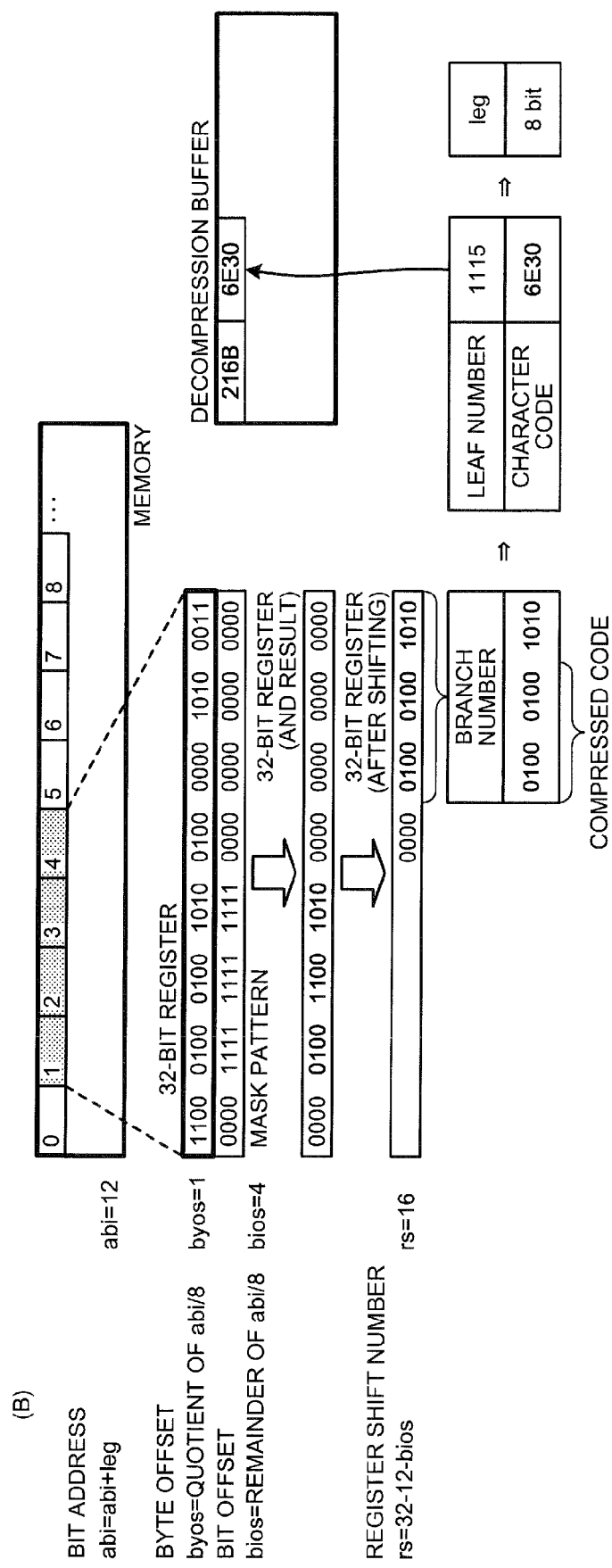

FIG. 39B depicts a decompressing process executed when the register is shifted by the bits of the byte offset bios from the state of (A) depicted in FIG. 39A (state (B)) The bit address abi of (A) that is the previous time is abi=0 and the compressed code length leg of (A) is 12 bits. Therefore, the bit address abi of (B) is abi=12 bits.

Due to this bit address abi being abi=12, the byte offset byos is byos=1 and the bit offset bios is bios=4. Due to the byte offset byos being byos=1, the compressed code string for four bytes from the first byte from the head (hashed portion in FIG. 39B) of the compressed code strings retained in the memory is set in the register.

Due to the bit offset bios being bios=4, the mask pattern is "0x0FFF0000". Therefore, by calculating the logical product (AND) of the compressed code string set in the register and the mask pattern "0x0FFF0000", the AND result is obtained.

Due to the bit offset bios being bios=4, the register shift number "rs" is rs=32−m−bios=32−12−4=16. Therefore, the AND result in the register is shifted toward the tail by 16 bits. Due to this shifting, "0000010001001010" is left in the register and, therefore, the 12 bits from the tail are extracted as the bit string to be decompressed. In this case, "010001001010" is extracted as the bit string to be decompressed. After the extraction, the register is cleared.

As depicted in FIG. 27, the structure cell C(1, 1) of the root of the node-less Huffman tree H2 stores therein the pointers to the leaves L1 to L1295. Therefore, a pointer to the leaf L# (the branch number) that coincides with the bit string to be decompressed "010001001010" extracted is retrieved in the structure cell C(1, 1) of the root of the node-less Huffman tree H2. In this case, the bit string to be decompressed "010001001010" coincides with one of the pointers in the group of pointers to the leaf L24 and, therefore, the corresponding pointer to the leaf L24 is read and the structure of the leaf L24 is accessed.

The structure of the leaf L24 stores therein a character code "0x6E30" (that corresponds to a character "の") and, therefore, the character code "0x6E30" is extracted and is stored in the decompression buffer 3212. The structure of the leaf L24 also stores therein the compressed code length "leg" (=eight bits) of the character code "0x6E30" and, therefore, the compressed code length leg of the character code "0x6E30" is also extracted. The bit address abi is updated using the compressed code length leg extracted. In this case, the bit address abi after the updating is abi=12+8=20.

Figure 39C:
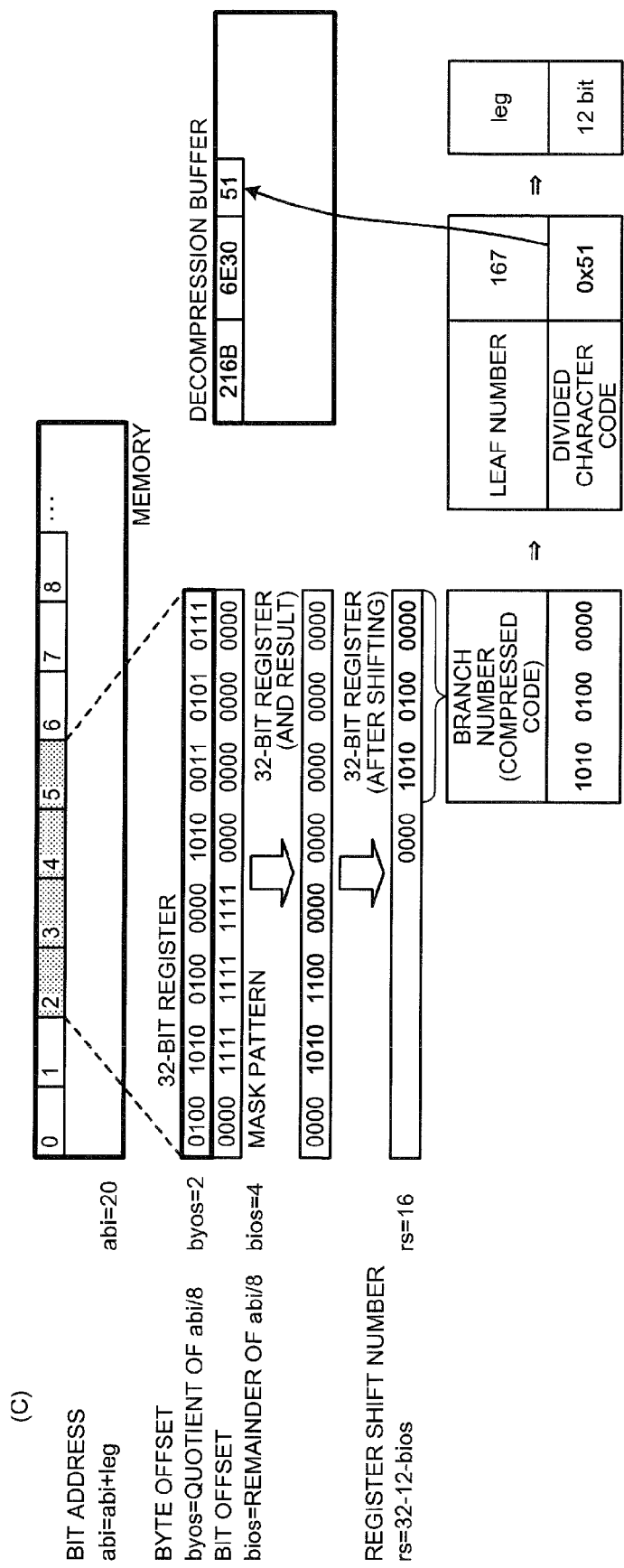

FIG. 39C depicts a decompressing process executed when the register is shifted by the bits of the byte offset bios from the state of (B) depicted in FIG. 39B (state (C)). The bit address abi of (B) that is the previous time is abi=12 and the compressed code length leg of (B) is eight bits. Therefore, the bit address abi of (C) is abi=20 bits.

Due to this bit address abi being abi=20, the byte offset byos is byos=2 and the bit offset bios is bios=4. Due to the byte offset byos being byos=2, the compressed code string for four bytes from the second byte from the head (hashed portion in FIG. 39C) of the compressed code strings retained in the memory is set in the register.

Due to the bit offset bios being bios=4, the mask pattern is "0x0FFF0000". Therefore, by calculating the logical product (AND) of the compressed code string set in the register and the mask pattern "0x0FFF0000" the AND result is obtained.

Due to the bit offset bios being bios=4, the register shift number "rs" is rs=32−m−bios=32−12−4=16. Therefore, the AND result in the register is shifted toward the tail by 16 bits. Due to this shifting, "0000101001000000" is left in the register and, therefore, the 12 bits from the tail are extracted as the bit string to be decompressed. In this case, "101001000000" is extracted as the bit string to be decompressed. After the extraction, the register is cleared.

As depicted in FIG. 27, the structure cell C(1, 1) of the root of the node-less Huffman tree H2 stores therein the pointers to the leaves L1 to L1295. Therefore, a pointer to the leaf L# (the branch number) that coincides with the bit string to be decompressed "101001000000" extracted is retrieved in the structure cell C(1, 1) of the root of the node-less Huffman tree H2. In this case, the bit string to be decompressed "101001000000" coincides with one of the pointers in the group of pointers to the leaf L167 and, therefore, the corresponding pointer to the leaf L167 is read and the structure of the leaf L167 is accessed.

The structure of the leaf L167 stores therein a divided character code "0x51" and, therefore, the character code "0x51" is extracted and is stored in the decompression buffer 3212. The structure of the leaf L167 also stores therein the compressed code length "leg" (=12 bits) of the character code "0x51" and, therefore, the compressed code length leg of the character code "0x51" is also extracted. The bit address abi is updated using the compressed code length leg extracted. In this case, the bit address abi after the updating is abi=20+12=32.

Figure 39D:
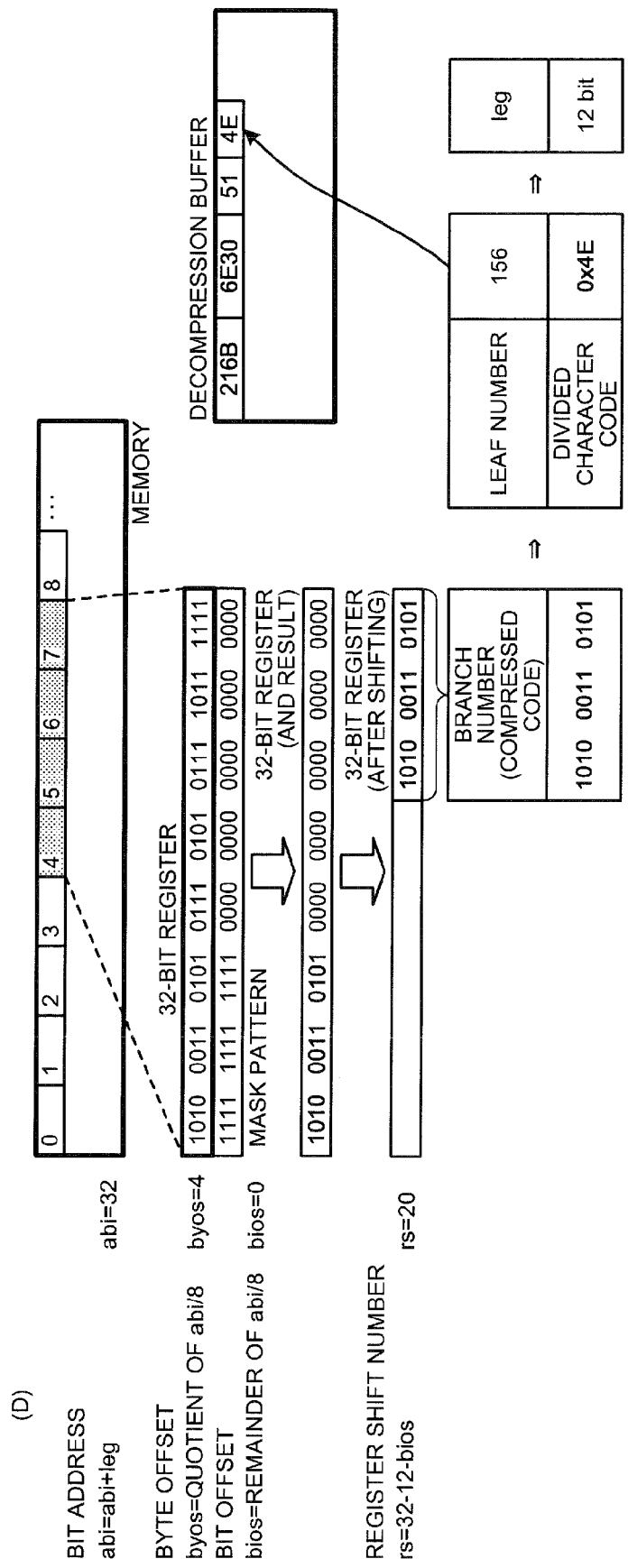

FIG. 39D depicts a decompressing process executed when the register is shifted by the bits of the byte offset bios from the state of (C) depicted in FIG. 39C (state (D)). The bit address abi of (C) that is the previous time is abi=20 and the compressed code length leg of (C) is 12 bits. Therefore, the bit address abi of (D) is abi=32 bits.

Due to this bit address abi being abi=32, the byte offset byos is byos=4 and the bit offset bios is bios=0. Due to the byte offset byos being byos=4, the compressed code string for four bytes from the fourth byte from the head (hashed portion in FIG. 39D) of the compressed code strings retained in the memory is set in the register.

Due to the bit offset bios being bios=0, the mask pattern is "0x0FFF00000". Therefore, by calculating the logical product (AND) of the compressed code string set in the register and the mask pattern "0x0FFF00000", the AND result is obtained.

Due to the bit offset bios being bios=0, the register shift number "rs" is rs=32−m−bios=32−12−0=20. Therefore, the AND result in the register is shifted toward the tail by 20 bits. Due to this shifting, "101000110101" is left in the register and, therefore, the 12 bits from the tail are extracted as the bit string to be decompressed. In this case, "101000110101" is extracted as the bit string to be decompressed. After the extraction, the register is cleared.

As depicted in FIG. 27, the structure cell C(1, 1) of the root of the node-less Huffman tree H2 stores therein the pointers to the leaves L1 to L1295. Therefore, a pointer to the leaf L# (the branch number) that coincides with the bit string to be decompressed "101001000000" extracted is retrieved in the structure cell C(1, 1) of the root of the node-less Huffman tree H2. In this case, the bit string to be decompressed "101001000000" coincides with the pointer to the leaf L156 and, therefore, the pointer to the leaf L156 is read and the structure of the leaf L156 is accessed.

The structure of the leaf L156 stores therein a divided character code "0x4E" and, therefore, the character code "0x4E" is extracted and is stored in the decompression buffer 3212. The structure of the leaf L156 also stores therein the compressed code length "leg" (=12 bits) of the character code "0x4E" and, therefore, the compressed code length leg of the character code "0x4E" is also extracted. The bit address abi is updated using the compressed code length leg extracted. In this case, the bit address abi after the updating is abi=32+12=44.

FIG. 39E depicts a decompressing process executed when the register is shifted by the bits of the byte offset bios from the state of (D) depicted in FIG. 39D (state (E)). The bit address abi of (D) that is the previous time is abi=32 and the compressed code length leg of (D) is 12 bits. Therefore, the bit address abi of (E) is abi=44 bits.

Due to this bit address abi being abi=44, the byte offset byos is byos=5 and the bit offset bios is bios=4. Due to the byte offset byos that is byos=5, the compressed code string for four bytes from the fifth byte from the head (hashed portion in FIG. 39E) of the compressed code strings retained in the memory is set in the register.

Due to the bit offset bios being bios=4, the mask pattern is "0x0FFF0000". Therefore, by calculating the logical product (AND) of the compressed code string set in the register and the mask pattern "0x0FFF0000", the AND result is obtained.

Due to the bit offset bios being bios=4, the register shift number "rs" is rs=32−m−bios=32−12−4=16. Therefore, the AND result in the register is shifted toward the tail by 16 bits. Due to this shifting, "0000011110111111" is left in the register and, therefore, the 12 bits from the tail are extracted as the bit string to be decompressed. In this case, "011110111111" is extracted as the bit string to be decompressed. After the extraction, the register is cleared.

As depicted in FIG. 27, the structure cell C(1, 1) of the root of the node-less Huffman tree H2 stores therein the pointers to the leaves L1 to L1295. Therefore, a pointer to the leaf L# (the branch number) that coincides with the bit string to be decompressed "011110111111" extracted is retrieved in the structure cell C(1, 1) of the root of the node-less Huffman tree H2. In this case, the bit string to be decompressed "011110111111" coincides with the pointer to the leaf L2000 and, therefore, the pointer to the leaf L2000 is read and the structure of the leaf L2000 is accessed.

The structure of the leaf L2000 stores therein a character code "0x6F30" and, therefore, the character code "0x6F30" is extracted and is stored in the decompression buffer 3212. The structure of the leaf L2000 also stores therein the compressed code length "leg" (=eight bits) of the character code "0x6F30" and, therefore, the compressed code length leg of the character code "0x6F30" is also extracted. The bit address abi is updated using the compressed code length leg extracted. In this case, the bit address abi after the updating is abi=44+8=52.

Figure 40:
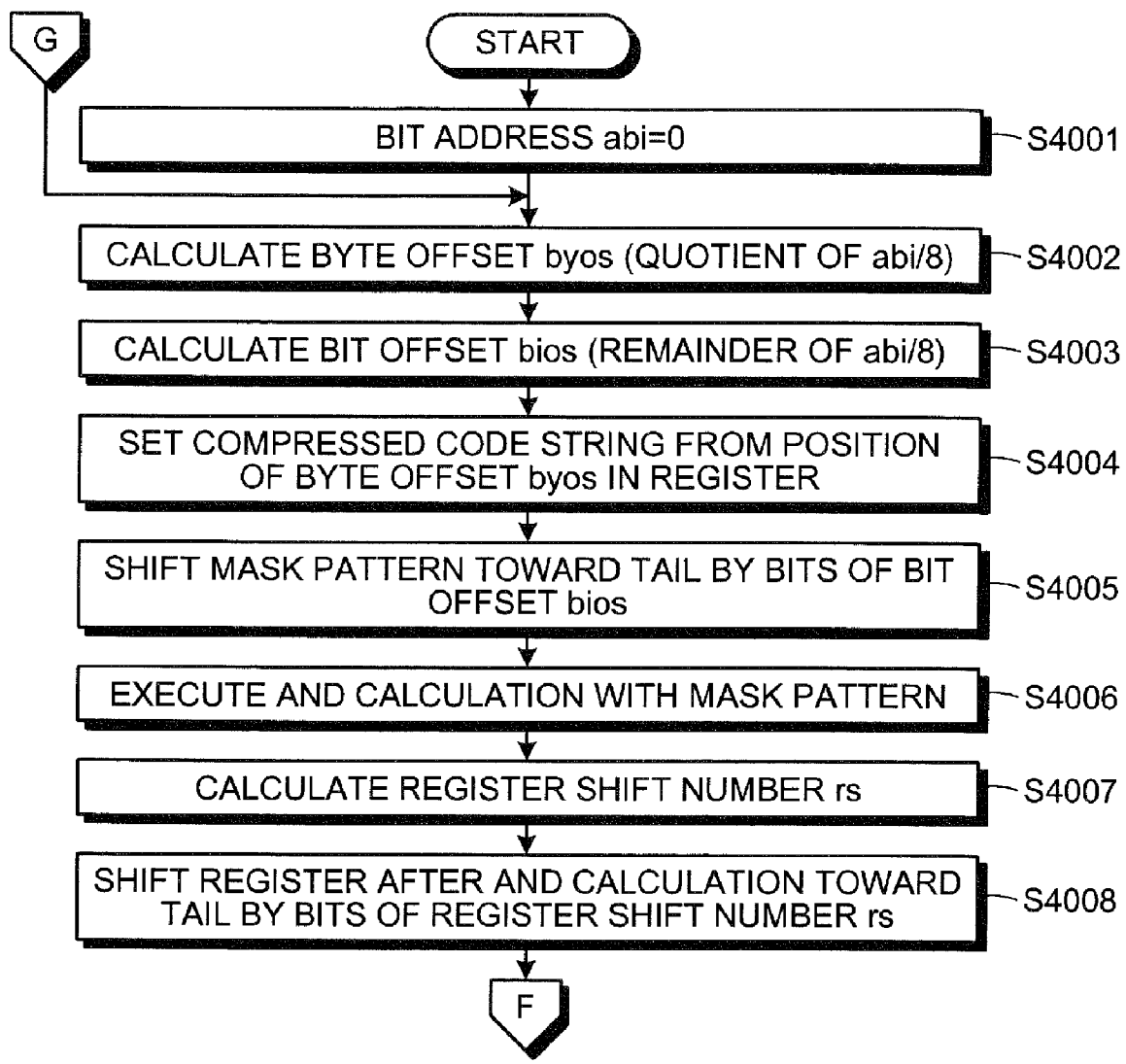
FIGS. 40 and 41 are flowcharts of a decompressing process that uses the node-less Huffman tree and is executed automatically by the information processing apparatus.
Figure 41:
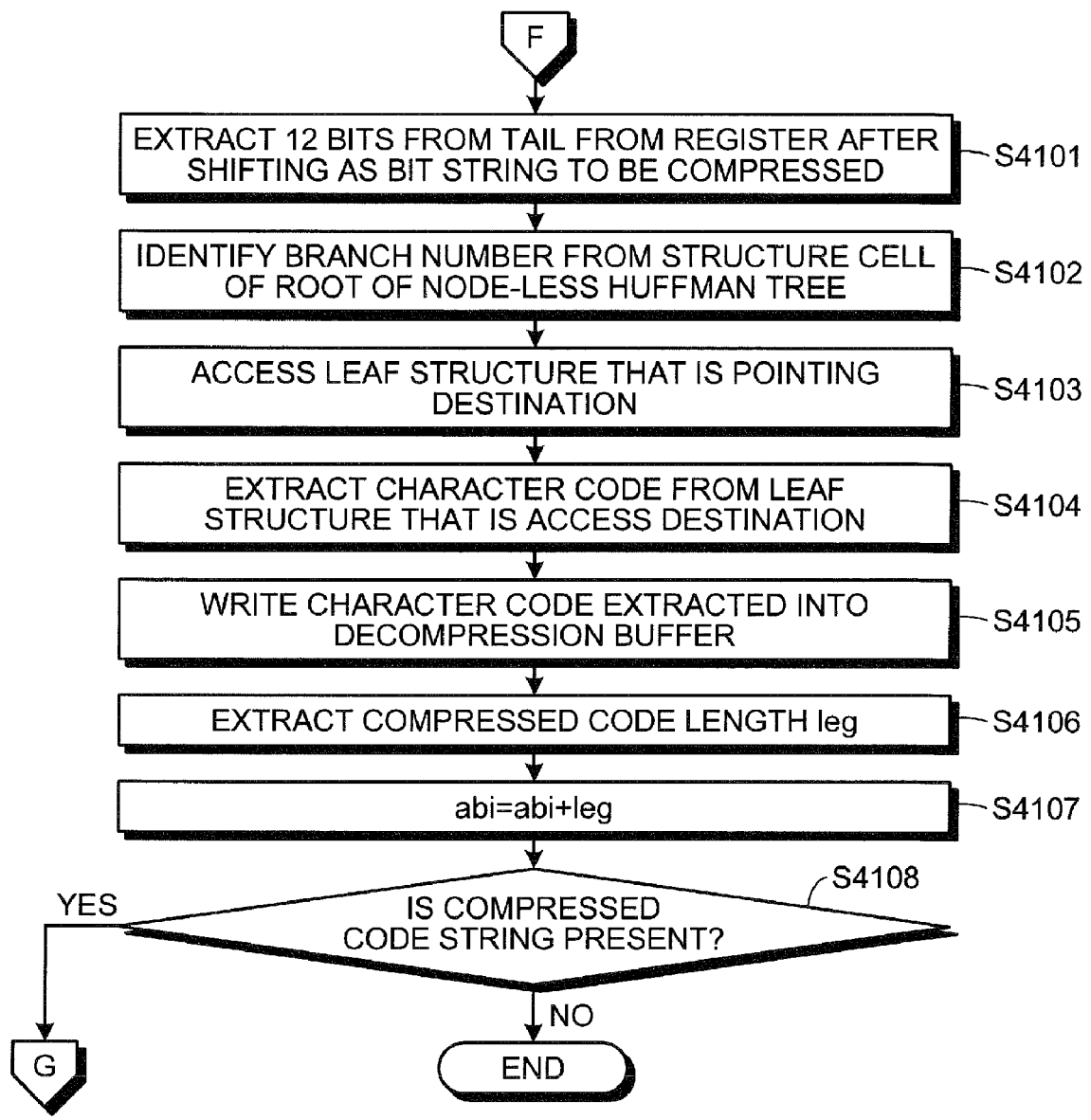

FIGS. 40 and 41 are flowcharts of a decompressing process that uses the node-less Huffman tree and is executed automatically by the information processing apparatus 500. As depicted in FIG. 40, the bit address abi is set to be abi=0 (step S4001). The byte offset byos is calculated (step S4002). The bit offset bios is calculated (step S4003). A compressed code string from the position of the byte offset byos is set in the register (step S4004).

The mask pattern "0xFFF00000" is shifted toward the tail by the bits of the bit offset bios (step S4005) and AND calculation of the mask pattern and the compressed code string set in the register is executed (step S4006). Thereafter, the register shift number rs is calculated (step S4007) and the register after the AND calculation is shifted toward the tail by the bits of the register shift number rs (step S4008).

After step S4008, as depicted in FIG. 41, m (m=12) bits from the tail is extracted as the bit string to be decomposed from the register after the shifting (step S4101). A pointer to the leaf L# that is the branch number is identified from the structure cell C(1, 1) of the root of the node-less Huffman tree H2 (step S4102) and the structure of the leaf L# that is the pointing destination is accessed through one path (step S4103). The character code is extracted from the structure of the leaf L# that is the access destination (step S4104) and the character code extracted is written into the decompression buffer 3212 (step S4105).

The compressed code length leg is extracted from the structure of the leaf L# (step S4106) and the bit address abi is updated (step S4107). Thereafter, whether the memory has any compressed code string, more specifically, it is determined whether the memory has any compressed code string not applied with a mask process by the mask pattern (step S4108). For example, this is determined according to whether the byte offset byos has any corresponding byte position. When the memory has a compressed code string (step S4108: YES), the procedure returns to step S4002 of FIG. 40. On the other hand, when the memory has no such compressed code string (step S4108: NO), a series of process comes to an end.

The above decompressing process enables the extraction of the compressed code for each m bits from the compressed code string, and further enables the identification of the pointer to the leaf L# that is the corresponding branch number by accessing the structure cell C(1, 1) of the root of the node-less Huffman tree H2. The compressed code is decompressed by extracting the character code from the structure of the leaf L# that is the access destination. In this manner, the node-less Huffman tree H2 has no internal node and, therefore, the structure of the leaf L# may be accessed through one path when the pointer to the leaf L# is identified. Thus, an increase of the speed of the decompression may be facilitated.

As described, according to the embodiment, reduction of the memory may be facilitated by decreasing the quantity of character types to about 1300. The node-less Huffman tree H2 may be generated by a decrease in the quantity of character types. By executing the compression and the decompression using the node-less Huffman tree H2, 12 bits (that is, one character) may collectively be determined at one time and, therefore, an increase of the speed of the decompression may be realized.

The method explained in the present embodiment may be implemented by a computer, such as a personal computer and a workstation, executing a program that is prepared in advance. The program is recorded on a computer-readable recording medium such as a hard disk, a flexible disk, a CD-ROM, an MO, and a DVD, and is executed by being read out from the recording medium by a computer. The program can be distributed through a network such as the Internet.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A computer-readable recording medium storing therein an information processing program that causes a computer to execute:
   storing, to a storing unit, an aggregate of nodes that respectively store therein a pointer to an upper node and $2^n$ pointers to at least one among a leaf and a lower node and respectively have $2^n$ branches that respectively extend to a lower node (where, n is a natural number and $n \geq 2$), the aggregate having k layers of nodes (where, k is a natural number and $k \geq 2$) and $2^{n(i-1)}$ nodes in an ith layer (where, i is a natural number and $1 \leq i \leq k$);
   obtaining a totaling result of appearance frequencies of character codes described in a file;
   classifying the character codes by layer, based on the totaling result obtained at the obtaining and according to appearance probabilities P of the character codes (where, P is $1/2^{ni} \leq P < 1/2^{n(i-1)}$ and when $i=1$, P is $1/2^{ni} \leq P < 1$ and when $i=n$, P is $P < 1/2^{n(i-1)}$);
   calculating, based on a quantity of character codes in the ith layer classified at the classifying and for the ith layer, a quantity of pointers pointing to leaves, and based on the quantity of pointers in the ith layer pointing to leaves, and further calculating a number of times nodes in the ith layer are used and a quantity of pointers pointing to lower nodes that, as link destinations, are nodes in an (i+1)th layer;
   generating, based on a calculation result at the calculating, a $2^n$-branching Huffman tree; and
   converting into a $2^m$-branching node-less Huffman tree (where, $m=n \times k$), the $2^n$-branching Huffman tree generated at the generating of the $2^n$-branching Huffman tree, the $2^m$-branching node-less Huffman tree being stored to the storing unit.

2. The computer-readable recording medium according to claim 1, wherein
   the generating of the $2^n$-branching Huffman tree includes
      generating, based on the calculation result calculated at the calculating, the pointers that are in the ith layer and include the pointers pointing to leaves and the pointers pointing to lower nodes,
      storing, to the nodes of a quantity equivalent to the number of times nodes in the ith layer are used, the pointers generated at the generating of the pointers,
      generating, for each of the character codes, leaves that are the link destinations of the nodes in the ith layer, by using the pointers to leaves stored to the nodes in the ith layer at the storing of the pointers, the pointers to leaves having been stored for each character in the ith layer classified at the classifying, and
      storing, to the leaves respectively, the character codes correlated with leaf numbers of the leaves generated at the generating of the leaves, to generate the $2^n$-branching Huffman tree.

3. The computer-readable recording medium according to claim 2, the information processing program further causing the computer to execute:
   detecting, in the $2^n$-branching Huffman tree, the quantity of the pointers that are in the ith layer and point to leaves and a quantity of blank pointers in blank nodes in the (i−1)th layer;
   identifying, based on the quantity of pointers that are in the ith layer and point to leaves and the quantity of blank pointers in the blank nodes in the (i−1)th layer detected at the detecting, the pointers that are in the ith layer, point to leaves and are to be moved from the ith layer to the blank nodes in the (i−1)th layer, and
   optimizing by deleting, from the nodes in the (i−1)th layer, the pointers to nodes that store therein the pointers to be moved identified at the identifying and moving, to the nodes in the (i−1)th layer, the pointers to be moved, wherein
   the converting includes converting the $2^n$-branching Huffman tree optimized at the optimizing into the $2^m$-branching node-less Huffman tree, the $2^m$-branching node-less Huffman tree being stored to the storing unit.

4. The computer-readable recording medium according to claim 1, wherein
   the converting includes
      determining, for each leaf in the ith layer and based on a quantity of layers and a quantity of leaves in the ith layer of the $2^n$-branching Huffman tree, a quantity of types of the pointers to leaves,
      duplicating the leaves of the $2^n$-branching Huffman tree,
      generating a root capable of storing therein $2^m$ pointers to leaves, the root generated being stored to the storing unit,
      generating, based on the quantity of types determined at the determining, pointers for each of the leaves duplicated at the duplicating, the pointers generated being stored to the root generated at the generating the root, and
      extracting a compressed code that is a bit string common to the pointers of a leaf, the compressed code and a length of the compressed code being stored to the leaf to reconstruct the leaf and generate a node-less Huffman tree including the root and the leaf.

5. The computer-readable recording medium according to claim 1, the information processing program further causing the computer to execute:
   sorting the character codes in descending order of the appearance frequencies;
   dividing the character codes sorted at the sorting into character codes having higher appearance frequencies and character codes having lower appearance frequencies, and further dividing the character codes having lower appearance frequencies into upper bit codes and lower bit codes; and
   totaling the appearance frequencies for the upper bit codes and the lower bit codes divided at the dividing, wherein
   the classifying includes classifying the character codes according to the appearance probabilities P, by layer, and based on a totaling result for the higher character codes and a totaling result at the totaling.

6. The computer-readable recording medium according to claim 1, the information processing program further causing the computer to execute:
- setting a character code string to be compressed;
- searching the $2^m$-branching node-less Huffman tree by extracting a character code to be compressed from the character code string set at the setting, identifying a leaf that includes the character code from among the leaves of the $2^m$-branching node-less Huffman tree, and extracting a compressed code from the leaf identified; and
- storing, to a predetermined storing area, the compressed code extracted at the searching of the $2^m$-branching node-less Huffman tree.

7. The computer-readable recording medium according to claim 6, the information processing program further causing the computer to execute:
- generating, for each of the character codes, a character structure including the character code and a pointer to a leaf storing therein the character code, the character structure generated being stored to the storing unit; and
- searching the character structure generated at the generating of the character structure to extract the pointer to the leaf storing therein the character code to be compressed, wherein
- the searching of the $2^m$-branching node-less Huffman tree includes accessing a corresponding leaf of the $2^m$-branching node-less Huffman tree by using the pointer extracted at the searching of the character structure, and extracting the compressed code from the corresponding leaf accessed.

8. The computer-readable recording medium according to claim 5, the information processing program further causing the computer to execute:
- generating, for each of the higher character codes, a first character structure including the character code and a pointer to a leaf storing therein the character code, the first character structure being stored to the storing unit;
- generating, for each of the upper bit codes and the lower bit codes, a second character structure including the bit code and a pointer to a leaf storing therein the bit code, the second character structure being stored to the storing unit;
- setting a character code string to be compressed;
- searching the first character structure generated at the generating the first character structure to extract a pointer to a leaf storing therein character code to be compressed;
- searching the $2^m$-branching node-less Huffman tree by using the pointer extracted at the searching of the first character structure to access a corresponding leaf of the $2^m$-branching node-less Huffman tree to extract compressed code from the corresponding leaf accessed; and
- storing the compressed code extracted at the searching of the $2^m$-branching node-less Huffman tree to a predetermined storing area.

9. The computer-readable recording medium according to claim 8, wherein
- the dividing includes dividing the character code to be compressed into an upper bit code to be compressed and a lower bit code to be compressed, when at the searching of the first character structure, character code corresponding to the character code to be compressed is not extracted,
- the searching of the first character structure includes searching the second character structure to extract a pointer to a leaf storing therein the upper bit code to be compressed and a pointer to a leaf storing therein the lower bit code to be compressed, when at the dividing, the character code to be compressed is divided into the upper bit code to be compressed and the lower bit code to be compressed,
- the searching of the $2^m$-branching node-less Huffman tree includes reading the pointer to the leaf storing therein the upper bit code to be compressed extracted at the searching of the second character structure, accessing a corresponding leaf of the $2^m$-branching node-less Huffman tree, extracting compressed code of the upper bit code to be compressed from the corresponding leaf accessed, reading the pointer to the leaf storing therein the lower bit code to be compressed, accessing a corresponding leaf of the $2^m$-branching node-less Huffman tree, and extracting compressed code of the lower bit code to be compressed from the corresponding leaf accessed, and
- the storing includes storing the compressed code of the upper bit code to be compressed and the compressed code of the lower bit code to be compressed to the predetermined storing area.

10. The computer-readable recording medium according to claim 6, the information processing program further causing the computer to execute:
- setting a compressed code string;
- extracting sequentially compressed codes, each of the compressed codes being of m bits from a compressed code string set at the setting;
- searching from the root of the $2^m$-branching node-less Huffman tree using the compressed code extracted at the extracting; and
- storing to the predetermined storing area, a character code extracted from a leaf retrieved at the searching.

11. An information processing apparatus comprising:
- a storing unit that stores therein an aggregate of nodes that respectively store therein a pointer to an upper node and $2^n$ pointers to at least one among a leaf and a lower node and respectively have $2^n$ branches that respectively extend to a lower node (where, n is a natural number and $n \geq 2$), the node aggregate having k layers of nodes (where, k is a natural number and $k \geq 2$) and $2^{n(i-1)}$ nodes in an ith layer (where, i is a natural number and $1 \leq i \leq k$);
- an obtaining unit that obtains a totaling result of appearance frequencies of character codes described in a file;
- a classifying unit that classifies the character codes by layer, based on the totaling result obtained by the obtaining unit and according to appearance probabilities P of the character codes (where, P is $1/2^{ni} \leq P < 1/2^{n(i-1)}$, and when i=1, P is $1/2^{ni} \leq P < 1$ and when i=n, P is $P < 1/2^{n(i-1)}$);
- a calculating unit that, based on a quantity of character codes in the ith layer classified by the classifying unit, calculates, for the ith layer, a quantity of pointers pointing to leaves, and based on the quantity of pointers in the ith layer pointing to leaves, calculates a number of times nodes in the ith layer are used and a quantity of pointers pointing to lower nodes that, as link destinations, are nodes in an (i+1)th layer;
- a $2^n$-branching Huffman tree generating unit that, based on a calculation result calculated by the calculating unit, generates a $2^n$-branching Huffman tree; and
- a converting unit that converts the $2^n$-branching Huffman tree generated by the $2^n$-branching Huffman tree generating unit into a $2^m$-branching node-less Huffman tree (where, m=n×k), and stores the $2^m$-branching node-less Huffman tree to the storing unit.

12. An information processing method comprising:

storing, to a storing unit, an aggregate of nodes that respectively store therein a pointer to an upper node and $2^n$ pointers to at least one among a leaf and a lower node and respectively have $2^n$ branches that respectively extend to a lower node (where, n is a natural number and $n \geq 2$), the aggregate having k layers of nodes (where, k is a natural number and $k \geq 2$) and $2^{n(i-1)}$ nodes in an ith layer (where, i is a natural number and $1 \leq i \leq k$);

obtaining a totaling result of appearance frequencies of character codes described in a file;

classifying the character codes by layer, based on the totaling result obtained at the obtaining and according to appearance probabilities P of the character codes (where, P is $1/2^{ni} \leq P < 1/2^{n(i-1)}$, and when i=1, P is $1/2^{ni} \leq P < 1$ and when i=n, P is $P < 1/2^{n(i-1)}$);

calculating, based on a quantity of character codes in the ith layer classified at the classifying and for the ith layer, a quantity of pointers pointing to leaves, and based on the quantity of pointers in the ith layer pointing to leaves, and further calculating a number of times nodes in the ith layer are used and a quantity of pointers pointing to lower nodes that, as link destinations, are nodes in an (i+1)th layer;

generating, based on a calculation result at the calculating, a $2^n$-branching Huffman tree; and converting into a $2^m$-branching node-less Huffman tree (where, m=n×k), the $2^n$-branching Huffman tree generated at the generating of the $2^n$-branching Huffman tree, the $2^m$-branching node-less Huffman tree being stored to the storing unit.

\* \* \* \* \*

UNITED STATES PATENT AND TRADEMARK OFFICE
CERTIFICATE OF CORRECTION

PATENT NO. : 7,880,648 B2
APPLICATION NO. : 12/543243
DATED : February 1, 2011
INVENTOR(S) : Masahiro Kataoka It is certified that error appears in the above-identified patent and that said Letters Patent is hereby corrected as shown below:

On the Patent Face:

Under "(56) References Cited - Foreign Patent Documents" delete "JP A 2000-188608 4/2000" and insert the following: --JP A 2000-188608 7/2000--.

In the Claims:

In column 30, line 27, after "into the", delete "$2^n$" and insert --$2^m$--.

Signed and Sealed this
Tenth Day of May, 2011

David J. Kappos
*Director of the United States Patent and Trademark Office*